(12) United States Patent
Adachi et al.

(10) Patent No.: US 7,494,838 B2
(45) Date of Patent: Feb. 24, 2009

(54) MANUFACTURING METHOD FOR MAGNETIC SENSOR AND LEAD FRAME THEREFOR

(75) Inventors: Hiroshi Adachi, Hamamatsu (JP);
Hiroshi Saitoh, Iwata-gun (JP); Kenichi Shirasaka, Hamamatsu (JP); Hideki Sato, Hamamatsu (JP); Masayoshi Omura, Hamamatsu (JP)

(73) Assignee: Yamaha Corporation (JP)

( * ) Notice: Subject to any disclaimer, the term of this patent is extended or adjusted under 35 U.S.C. 154(b) by 273 days.

(21) Appl. No.: 11/593,588

(22) Filed: Nov. 7, 2006

(65) Prior Publication Data

US 2007/0099349 A1   May 3, 2007

Related U.S. Application Data

(62) Division of application No. 10/627,717, filed on Jul. 28, 2003, now Pat. No. 7,187,063.

(30) Foreign Application Priority Data

| Jul. 29, 2002 | (JP) | 2002-220411 |
| Jul. 29, 2002 | (JP) | 2002-220412 |
| Jul. 29, 2002 | (JP) | 2002-220413 |
| Jul. 29, 2002 | (JP) | 2002-220414 |
| Jul. 29, 2002 | (JP) | 2002-220415 |
| Jul. 25, 2003 | (JP) | 2003-202103 |
| Jul. 25, 2003 | (JP) | 2003-202104 |
| Jul. 25, 2003 | (JP) | 2003-202105 |
| Jul. 25, 2003 | (JP) | 2003-202106 |
| Jul. 25, 2003 | (JP) | 2003-202107 |

(51) Int. Cl.
*H01L 23/00* (2006.01)

(52) U.S. Cl. .......... 438/48; 438/57; 438/123

(58) Field of Classification Search .......... 438/48, 438/123, 417, 676, 730
See application file for complete search history.

(56) References Cited

U.S. PATENT DOCUMENTS 4,954,308 A   9/1990   Yabe et al.

(Continued)

FOREIGN PATENT DOCUMENTS

EP   0 637 196 A1   2/1995

(Continued)

OTHER PUBLICATIONS

S. Kawahito, et al.; "Micromachined Hall elements for two-dimensional magnetic-field sensing"; Sensors and Actuators A, 40 (1994), pp. 141-146.

(Continued)

*Primary Examiner*—Roy K Potter
(74) *Attorney, Agent, or Firm*—Dickstein, Shapiro, LLP.

(57) ABSTRACT

A magnetic sensor is constituted using magnetic sensor chips mounted on stages supported by interconnecting members and a frame having leads in a lead frame. Herein, the stages are inclined upon plastic deformation of the interconnecting members. When the frame is held in a metal mold and the stages are pressed, the interconnecting members are elastically deformed, so that the magnetic sensor chips are bonded onto the stages placed substantially in the same plane and are then wired with the leads. Thereafter, the stages are released from pressure, so that the interconnecting members are restored from the elastically deformed states thereof. When the magnetic sensor chips are combined together to realize three sensing directions, it is possible to accurately measure three-dimensional bearings of magnetism, and the magnetic sensor can be reduced in dimensions and manufactured with a reduced cost therefor.

15 Claims, 57 Drawing Sheets

U.S. PATENT DOCUMENTS

| | | |
|---|---|---|
| 5,452,182 A | 9/1995 | Eichelberger et al. |
| 5,638,596 A | 6/1997 | McCormick |
| 5,712,507 A | 1/1998 | Eguchi et al. |
| 6,081,029 A | 6/2000 | Yamaguchi |
| 6,115,261 A * | 9/2000 | Platt et al. .................. 361/760 |
| 6,169,254 B1 | 1/2001 | Pant et al. |
| 6,304,082 B1 | 10/2001 | Gualtieri et al. |
| 6,469,907 B1 | 10/2002 | Faveluke et al. |
| 6,822,443 B1 | 11/2004 | Dogaru |
| 7,253,079 B2 * | 8/2007 | Hanson et al. .............. 438/417 |
| 7,290,448 B2 * | 11/2007 | Shirasaka et al. ............. 73/493 |
| 2003/0057938 A1 | 3/2003 | Goetz |
| 2004/0021458 A1 | 2/2004 | Imamura |

FOREIGN PATENT DOCUMENTS

| | | |
|---|---|---|
| JP | 61-155915 | 7/1986 |
| JP | 1-250875 | 10/1989 |
| JP | 04-302406 | 10/1992 |
| JP | 4-302406 | 10/1992 |
| JP | 5-52918 | 3/1993 |
| JP | 5-52918 A | 3/1993 |
| JP | 05-291482 | 11/1993 |
| JP | 05-315499 | 11/1993 |
| JP | 06-085151 | 3/1994 |
| JP | 06-097323 | 4/1994 |
| JP | H06-236959 | 8/1994 |
| JP | 7-22667 A | 1/1995 |
| JP | 07-273353 | 10/1995 |
| JP | H08-070087 | 3/1996 |
| JP | 08-105737 | 4/1996 |
| JP | 9-81308 A | 3/1997 |
| JP | 09-148481 | 6/1997 |
| JP | 09-236616 | 9/1997 |
| JP | 9-257511 | 10/1997 |
| JP | 10-303350 | 11/1998 |
| JP | 11-281666 | 10/1999 |
| JP | 2001-77303 A | 3/2001 |
| JP | 2002-043492 | 2/2002 |
| JP | 2002-118424 A | 4/2002 |
| JP | 2002-156204 | 5/2002 |
| JP | 2002-176165 | 6/2002 |
| JP | 2002-176165 A | 6/2002 |
| WO | WO-02/052221 A1 | 7/2002 |

OTHER PUBLICATIONS

Japanese Office Action (JP 2003-202107) dated Feb. 21, 2006 (and English translation of relevant portion).

Japanese Office Action (JP 2003-202105) dated Feb. 21, 2006 (and English translation of relevant portion).

Japanese Office Action (JP 2003-202104) dated Feb. 21, 2006 (and English translation of relevant portion).

Japanese Office Action (JP 2003-202103) dated Feb. 21, 2006 (and English translation of relevant portion).

* cited by examiner

| CONDITION | BEARING a |
|---|---|
| Sa>0 & \|Sa\|>\|Sb\| | a=tan⁻¹ (-Sb/Sa) |
| Sa<0 & \|Sa\|>\|Sb\| | a=180° (-Sb/Sa) |
| Sa<0 & \|Sa\|<\|Sb\| | a= 90° (-Sa/Sb) |
| Sa>0 & \|Sa\|<\|Sb\| | a=270° (-Sa/Sb) |

MANUFACTURING METHOD FOR MAGNETIC SENSOR AND LEAD FRAME THEREFOR

CROSS-REFERENCE TO RELATED APPLICATIONS

The present application is a divisional under 37 C.F.R. § 1.53(b) of prior application Ser. No. 10/627,717, filed Jul. 28, 2003 now U.S. Pat. No. 7,187,063, the entirety of which is incorporated herein by reference.

BACKGROUND OF THE INVENTION

1. Field of the Invention

This invention relates to methods for manufacturing magnetic sensors for measuring bearings (or azimuths). This invention also relates to lead frames for use in magnetic sensors.

2. Description of the Related Art

In general, magnetic sensors are used to detect magnetism for the purpose of measurement of bearings with regard to external magnetic fields applied thereto.

FIG. 83 shows a conventionally-known magnetic sensor unit 64 in which magnetic sensors 51 and 61 are arranged on a surface 63a of a board (or substrate) 63. This magnetic sensor unit 64 is capable of measuring bearings of an external magnetic field in a three-dimensional manner.

Specifically, the magnetic sensor 51 includes a magnetic sensor chip 52 sensitive to components of an external magnetic field in two directions, wherein there are provided two sensing directions (namely, an X-axis direction and a Y-axis direction), which are orthogonal to each other on the surface 63a of the board 63. The magnetic sensor 61 includes a magnetic sensor chip 62 sensitive to components of an external magnetic field in a single direction only, wherein a sensing direction lies in a vertical direction (namely, a Z-axis direction) orthogonal to the surface 63a of the board 63.

Bearings of an external magnetic field are determined as vectors in a three-dimensional space upon detection of three-directional components of magnetism measured by the magnetic sensor chips 52 and 62.

As described above, the conventionally-known magnetic sensor unit 64 provides the magnetic sensor chips 52 and 62 for the magnetic sensors 51 and 61 respectively. Therefore, in the manufacture of the magnetic sensor unit 64, it is necessary to produce the magnetic sensors 51 and 61 respectively and to arrange them on the surface 63a of the board 63 at respective positions. This increases the number of steps in the manufacture of the magnetic sensor unit, thus increasing the manufacturing cost therefor.

In addition, the conventional magnetic sensor unit 64 has difficulties in accurately arranging the magnetic sensor 61 in the surface 63a of the board 63 so that the sensing direction of the magnetic sensor chip 62 becomes orthogonal to the sensing direction of the magnetic sensor chip 52.

SUMMARY OF THE INVENTION

It is an object of the invention to provide a method for manufacturing a magnetic sensor that can accurately measure the three-dimensional bearings of an external magnetic field, wherein the manufacturing cost can be reduced.

In a first aspect of the invention, there is provided a magnetic sensor that can accurately measure bearings of an external magnetic field in a three-dimensional manner and that can be reduced in manufacturing cost by simplifying the manufacturing steps using a specially-designed lead frame, which comprises at least two stages, a frame having a plurality of leads encompassing the stages, and a plurality of interconnecting members for supporting the stages to be interconnected with the frame. Specifically, the interconnecting members are subjected to plastic deformation so that the stages are respectively inclined; the stages are then pressed under pressure while the frame is fixed in a prescribed position so that the interconnecting members are elastically deformed; magnetic sensor chips are bonded onto the stages that are arranged substantially in the same plane of the frame; wires are arranged to interconnect together the leads and the magnetic sensor chips; and finally, the stages are released from the pressure so that the interconnecting members are restored from the elastically deformed states thereof. As described above, the stages are inclined upon plastic deformation of the interconnecting members before the magnetic sensor chips are bonded onto the stages; that is, the stages can be reliably inclined at prescribed angles respectively simultaneously with the manufacture of the lead frame; therefore, it is possible to noticeably simplify the manufacturing steps for the magnetic sensor. In addition, the magnetic sensor chips can be easily and simultaneously bonded onto the stages, which are placed substantially in the same plane in advance.

In the above, one magnetic sensor chip has two sensing directions along the surface of the stage thereof, while the other magnetic sensor chip has a single sensing direction along the surface of the stage thereof. Herein, by respectively inclining the stages at prescribed angles during the manufacture of the lead frame, it is possible to establish a desired angular relationship between three sensing directions, which cross each other in a three dimensional manner. This allows the magnetic sensor to accurately detect components of magnetism in three sensing directions within a three-dimensional space, so that bearings of magnetism can be determined as a vector in the three-dimensional space.

In addition, it is possible to further arrange pressing members that are projected from the rectangular frame portion towards the stages, wherein the pressing members press the stages in the thickness direction of the lead frame. Under the condition where the stages are pressed by the pressing members in the thickness direction of the lead frame, the easy-to-deform portions of the interconnecting members (or leads) are elastically deformed so that the stages are maintained at prescribed positions against the frame. In order to mount magnetic sensor chips on the stages, the pressing members are separated from the stages, which are thus released from pressure applied thereto by the pressing members, whereby the stages can be placed substantially in the same plane; thus, it is possible to simultaneously bond the magnetic sensor chips onto the stages with ease.

In a second aspect of the invention, a lead frame comprises a frame, at least two stages, leads, and interconnecting members as well as projecting elements, which are projected upwardly or downwardly from the stages, respectively, wherein the interconnecting members have distorted portions that are subjected to plastic deformation upon depression of the projecting elements when the lead frame is placed in a metal mold that is closed, so that the stages can be easily inclined against the frame.

In the above, magnetic sensor chips can be simultaneously bonded onto surfaces of the stages, which are arranged substantially in the same plane, before being inclined in the metal mold. Then, the projecting elements are pressed by the metal mold so as to incline the stages, which are then encapsulated in a resin. Therefore, it is possible to accurately set a prescribed angle formed between the surfaces of the magnetic sensor chips with ease. In addition, the same metal mold is used to incline the stages and to form a molded resin casing encapsulating the lead frame including the inclined stages; hence, it is possible to simplify the manufacturing steps for producing a magnetic sensor. Furthermore, by adequately changing the shapes and dimensions of the projecting elements of the stages of the lead frame, it is possible to easily change the inclined angles of the stages, thus producing a variety of magnetic sensors using the same metal mold.

In a third aspect of the invention, a lead frame for use in the manufacture of a magnetic sensor comprises at least two stages for mounting magnetic sensor chips sensitive in a three-dimensional space, a frame having a plurality of leads arranged to encompass the stages, and a plurality of interconnecting members for interconnecting the stages with the frame. Herein, when the stages are inclined at prescribed angles against the frame, ends of the interconnecting members, which are fixed to both side ends of the stages, are subjected to plastic deformation. In addition, at least one stage interconnecting member is arranged to mutually interconnect the stages together, wherein it is subjected to plastic deformation as well. Specifically, a pair of stage interconnecting members each having reduced dimensions are arranged to interconnect together both side ends of the stages that are arranged adjacent to each other. Alternatively, at least one stage interconnecting member having a zigzag shape allowing plastic deformation is arranged between the stages.

In a fourth aspect of the invention, a magnetic sensor is constituted by using plural magnetic sensor chips, all of which are arranged inside of the same package and inclined against the bottom of the package. When using two magnetic sensor chips, a first magnetic sensor chip has two sensing directions, and a second magnetic sensor chip has a single sensing direction that crosses a plane defined by the two sensing directions of the first magnetic sensor chip. Alternatively, each of the first and second magnetic sensor chips has two sensing directions such that a first plane defined by the two sensing directions of the first magnetic sensor chip crosses a second plane defined by the two sensing directions of the second magnetic sensor chip. When using three magnetic sensor chips each having a single sensing direction, the sensing direction of the third magnetic sensor chip crosses the plane defined by the sensing directions of the other two magnetic sensor chips.

In a fifth aspect of the invention, interconnecting members are arranged in proximity to both side ends of stages and are arranged linearly symmetrical with respect to an axial line passing through the centers of the stages, and they have distorted portions that can be distorted upon plastic deformation. Herein, magnetic sensor chips are bonded onto the stages that are placed substantially in the same plane before the stages are inclined by pins and the like projected inside of a metal mold, for example.

BRIEF DESCRIPTION OF THE DRAWINGS

These and other objects, aspects, and embodiments of the present invention will be described in more detail with reference to the following drawings, in which.

DESCRIPTION OF THE PREFERRED EMBODIMENTS

This invention will be described in further detail by way of examples with reference to the accompanying drawings.

1. First Embodiment

Figure 1:
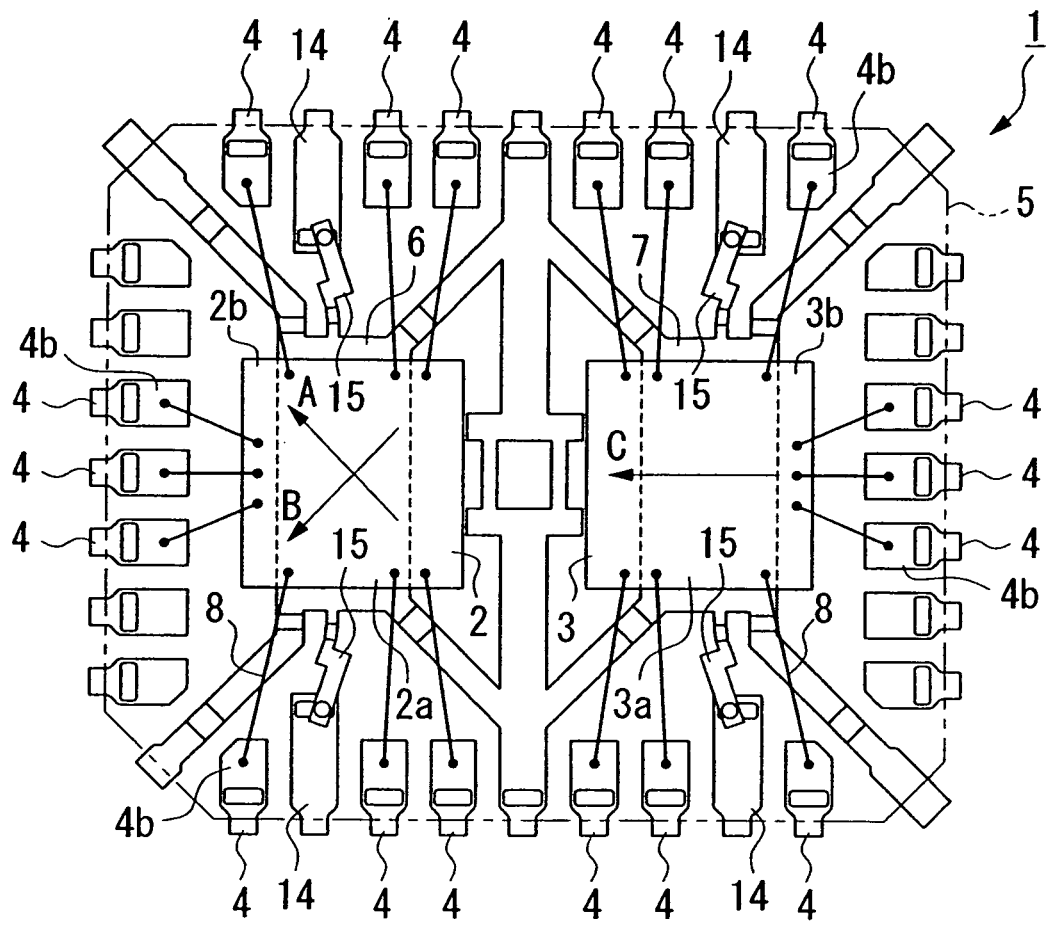
FIG. 1 is a plan view showing a magnetic sensor that is manufactured in accordance with a manufacturing method according to a first embodiment of the invention.
Figure 2:
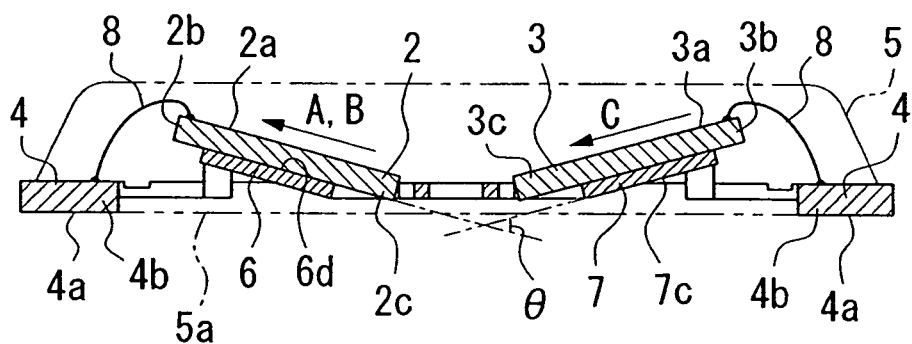
FIG. 2 is a longitudinal sectional view of the magnetic sensor shown in FIG. 1.

The overall configuration of a magnetic sensor, which is manufactured in accordance with a first embodiment of the invention, will be described with reference to FIGS. 1 and 2. That is, a magnetic sensor 1 of FIG. 1 is designed to measure the direction and magnitude of an external magnetic field applied thereto, and it comprises two magnetic sensor chips 2 and 3, a plurality of leads 4 for electrically connecting the magnetic sensor chips 2 and 3 with an external device (not shown), and a molded resin casing 5 for integrally fixing the magnetic sensor chips 2 and 3 and the leads 4 therein.

Each of the magnetic sensor chips 2 and 3 is formed in a rectangular plate-like shape in plan view, and they are mounted on stages 6 and 7 respectively. The magnetic sensor chips 2 and 3 are both encapsulated in the molded resin casing 5, which has a lower surface 5a and an upper surface 5c, and compared with leads 4, they are arranged in proximity to the upper surface 5c. In addition, the magnetic sensor chips 2 and 3 respectively having surfaces 2a and 3a are inclined with respect to the 'horizontal' lower surface 5a of the molded resin casing 5, and ends 2c and 3c of the surfaces 2a and 3a of the magnetic sensor chips 2 and 3 are directed to the lower surface 5a, while the other ends are respectively inclined in opposite directions at the same acute angle θ to the lower surface 5a.

In the above, the acute angle θ is formed between a surface 6d of the stage 6 and a backside 7c of the stage 7.

The magnetic sensor chip 2 is sensitive to two-directional components of terrestrial magnetism with respect to an external magnetic field. That is, it has two sensing directions (namely, directions A and B) that mutually cross at a right angle along the surface 2a of the magnetic sensor chip 2.

In contrast, the magnetic sensor chip 3 is sensitive to single-direction components of terrestrial magnetism with respect to an external magnetic field; that is, it has a single sensing direction (namely, a direction C) along a plane (or an A-B plane defined by A and B directions) of the surface 3a.

Each of the leads 4 is made of a prescribed metal material such as copper, wherein backsides 4a of the leads 4 are exposed in the lower surface 5a of the molded resin casing 5. Ends 4b of the leads 4 are electrically connected with the magnetic sensor chips 2 and 3 via metal wires 8, wherein connecting portions therebetween are embedded in the molded resin casing 5.

Next, a method for manufacturing the magnetic sensor 1 will be described in detail.

Figure 3:
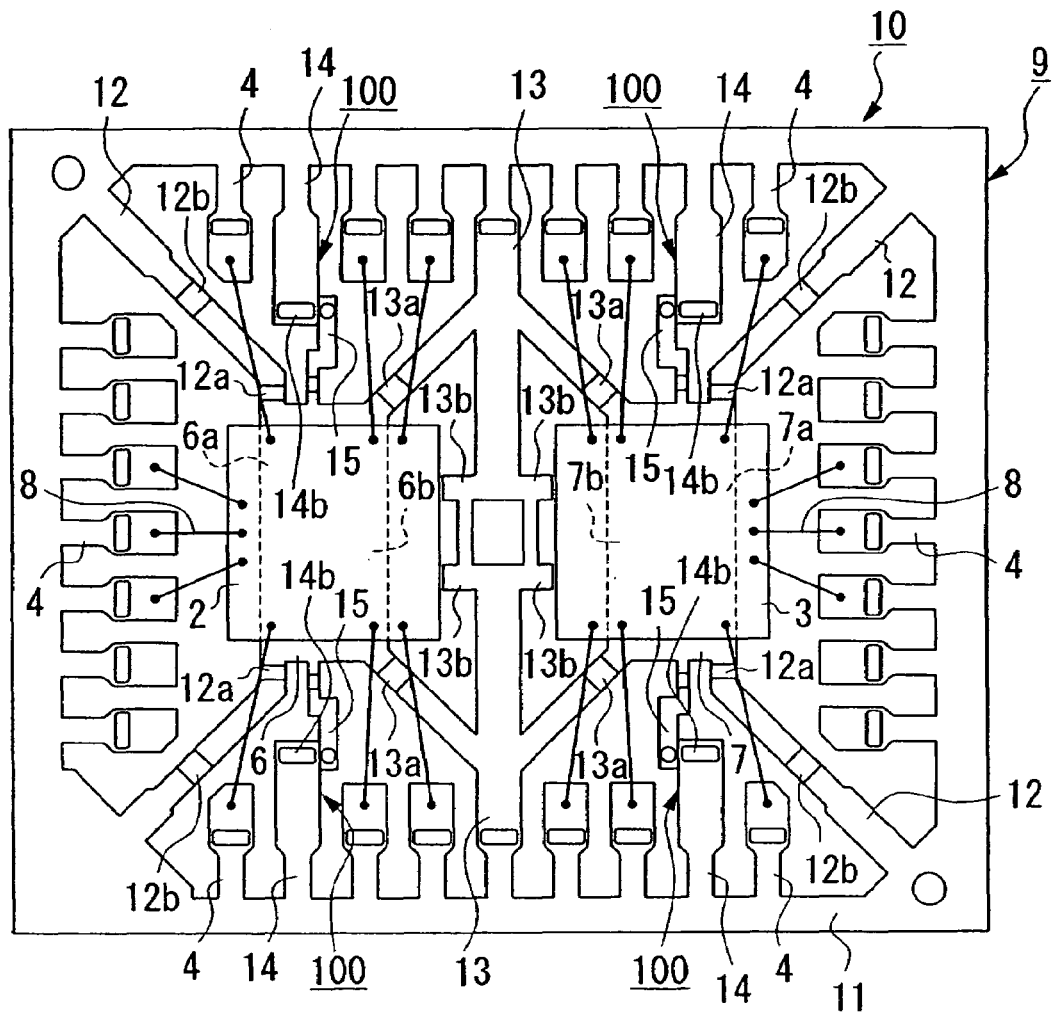
FIG. 3 is a plan view showing a lead frame on which magnetic sensor chips are mounted in accordance with the manufacturing method according to the first embodiment of the invention.
Figure 4:
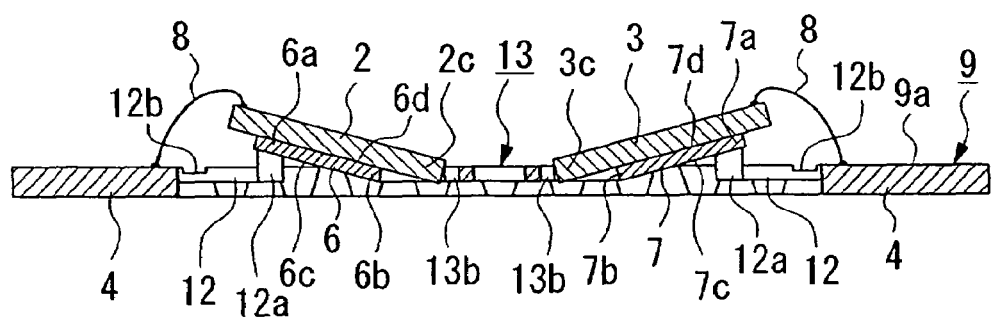
FIG. 4 is a longitudinal sectional view of the lead frame having the magnetic sensor chips shown in FIG. 3.

First, a thin metal plate is subjected to press working so as to form a lead frame 10 as shown in FIGS. 3 and 4 in which both the stages 6 and 7 are supported by a frame 9.

The frame 9 is constituted by a rectangular frame portion 11, which is formed in a rectangular shape in plan view to encompass the stages 6 and 7, and a plurality of leads 4, 12, 13, and 14 that project inwardly from the rectangular frame portion 11.

The leads (or interconnecting members) 12 and 13 are hanging leads for fixing the stages 6 and 7 in prescribed positions relative to the rectangular frame portion 11, and the leads 12 are interconnected with first sides 6a and 7a of the stages 6 and 7, while the leads 13 are interconnected with second sides 6b and 7b of the stages 6 and 7.

Specifically, the leads 13 have a specific structure having various components that are mutually interconnected together between the stages 6 and 7, wherein projecting portions 13b are projected from the center portions of the leads 13 and are directed towards the stages 6 and 7 respectively. When the stages 6 and 7, on which the magnetic sensor chips 2 and 3 are respectively mounted, are inclined, the projecting portions 13b prevent the magnetic sensor chips 2 and 3 from moving downwards along slopes.

The leads 14 (constituting second projecting portions) are projected towards the stages 6 and 7, from which projecting portions 15 (namely, first projecting portions) are projected from the stages 6 and 7 towards the rectangular frame portion 11 and the leads 14. Herein, the leads 14 and the projecting portions 15 form a hold mechanism 100 for holding the stages 6 and 7 in inclined conditions at prescribed angles.

Internal areas of the lead frame 10 including the stages 6 and 7, which are present inwardly from the leads 4, can be formed at an arbitrary thickness upon application of photo-etching processes, wherein they are formed to have roughly half the thickness compared with other portions of the lead frame 10 in order to prevent the leads 12 and the backsides 6c and 7c of the stages 6 and 7 from being exposed below the lower surface 5a of the molded resin casing 5.

Figure 5:
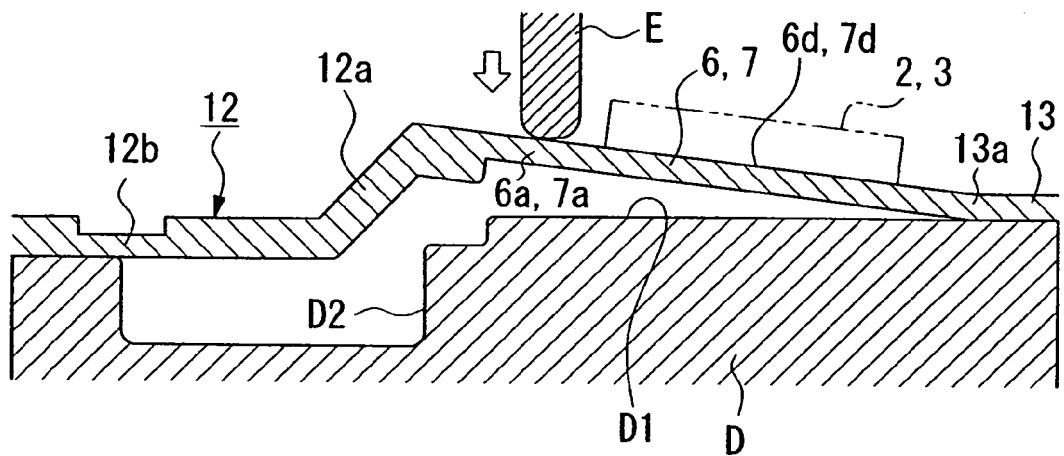
FIG. 5 is a cross sectional view in which a clamper is used to press a stage for mounting a magnetic sensor chip in a metal mold.

In addition to press working, bending working is performed to incline the stages 6 and 7 against the frame 9, so that they are mutually inclined to each other. Details will be described with reference to FIGS. 5 and 6. Due to bending working as shown in FIG. 5, ends 12a and 13a of the leads 12 and 13 (constituting bent portions), arranged in proximity to the stages 6 and 7, are bent and subjected to plastic deformation, so that the stages 6 and 7 are inclined at prescribed angles respectively. The bending working is performed using the same metal mold (not shown), which is used to perform the press working.

Then, the rectangular frame portion 11 of the frame 9 is fixed in a metal mold D, and a rod-like clamper E is used to press the surfaces 6d and 7d of the stages 6 and 7 at prescribed positions in proximity to first sides 6a and 7a of the stages 6 and 7. Herein, the metal mold D has a surface D1 and a hollow (or hole) D2, so that one end 12a of the lead 12 is put into the space of the hollow D2 and is thus prevented from being further deformed. The lead 12 has an easy-to-deform portion 12b, which can be elastically deformed with ease. A prescribed shape is adapted to the easy-to-deform portion 12b by a photo-etching process, wherein the easy-to-deform portion 12b is formed to have roughly half the thickness compared with other portions of the lead 12, for example.

Figure 6:
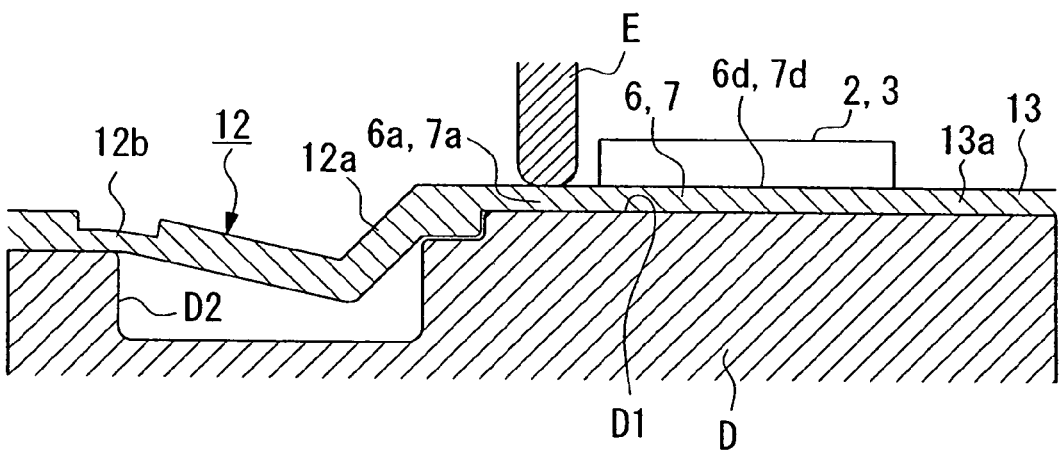
FIG. 6 is a cross sectional view in which the magnetic sensor chip is mounted on the stage clamped in the metal mold shown in FIG. 5.

Therefore, the easy-to-deform portion 12b of the lead 12 and the bent portion of the lead 13 (which has already been subjected to plastic deformation) are elastically deformed so that the surfaces 6d and 7d of the stages 6 and 7 are arranged along the surface D1 of the metal mold D, as shown in FIG. 6.

In the aforementioned condition shown in FIG. 6, the magnetic sensor chips 2 and 3 are respectively adhered to the surfaces 6d and 7d of the stages 6 and 7 by using silver paste, and the aforementioned wires 8 are arranged to electrically connect the magnetic sensor chips 2 and 3 with the leads 4 as shown in FIGS. 3 and 4.

In the next step after the aforementioned step for arranging the wires 8, the stages 6 and 7 are respectively inclined so that bonding portions between the wires 8 and the magnetic sensor chips 2 and 3, and other bonding portions between the wires 8 and the leads 4 may be separated from each other. For this reason, the wires 8 are arranged to have sufficient room in length or height.

Thereafter, the clamper E is gradually moved upwards above the stages 6 and 7, which are thus released so that the bent portions and the easy-to-deform portions 12b are restored from elastic deformation; thus, it is possible to restore the stages 6 and 7 to inclined states. At this time, ends 2c and 3c of the magnetic sensor chips 2 and 3 are brought into contact with the projecting portions 13b of the lead 13, so that even if the silver paste has not hardened, it is possible to reliably prevent the magnetic sensor chips 2 and 3 from being unexpectedly moved downwards along slopes.

When the silver paste has hardened, the magnetic sensor chips 2 and 3 are firmly fixed at prescribed positions on the surfaces 6d and 7d of the stages 6 and 7.

Figure 7:
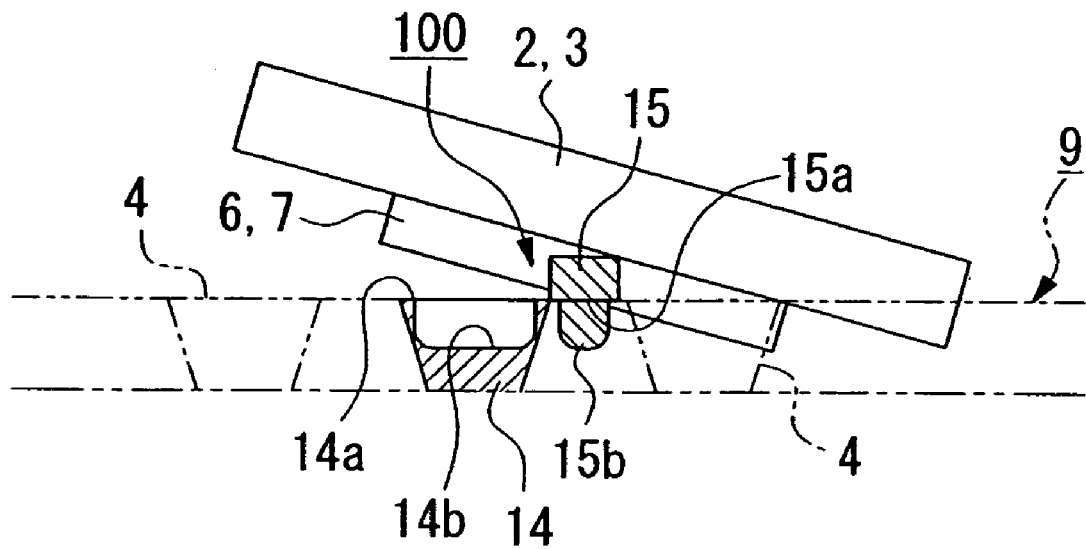
FIG. 7 diagrammatically shows a hold mechanism constituted by a lead inwardly projected from a rectangular frame portion of the lead frame and a projecting portion projecting from the stage for mounting the magnetic sensor chip.

Simultaneously with the hardening of the silver paste, the hold mechanism 100 holds the stages 6 and 7 in inclined conditions at prescribed angles. That is, as shown in FIG. 7, a hollow 14b is formed on a surface 14a of the lead 14 upon application of a photo-etching process. In addition, a projection 15b is formed on a lower end surface 15a of the projecting portion 15 upon application of the aforementioned press working.

Figure 8:
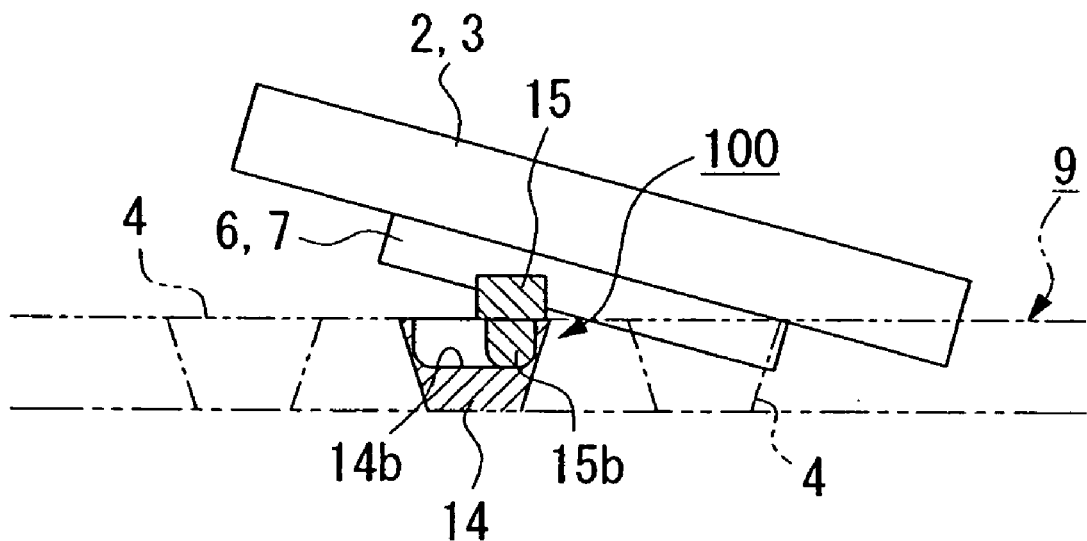
FIG. 8 diagrammatically shows the hold mechanism in which the lead and the projecting portion are engaged with each other so as to hold the stage in an inclined condition.

As shown in FIG. 8, the lead 14 and the projecting portion 15 are moved so as to vertically overlap each other in the thickness direction of the lead frame 10, and the projection 15b is inserted into the hollow 14b of the lead 14, thus constituting the hold mechanism 100. Due to the provision of the hold mechanism 100, the stages 6 and 7 that are inclined at prescribed angles are held so as not to return towards the frame 9.

In the above, it is necessary to move the projection 15b towards the hollow 14b of the lead 14 in the thickness direction of the lead frame 10. Herein, it may be possible to use a cam mechanism, by which the projection 15b can be inserted into the hollow 14b in response to a driving force for causing the clamper E to move up or down, for example.

The lead frame 10 on which the magnetic sensor chips 2 and 3 are mounted is arranged inside of a metal mold (not shown), into which a melted resin is introduced so as to form a molded resin casing for encapsulating the magnetic sensor chips 2 and 3 therein. Thus, it is possible to firmly fix the magnetic sensor chips 2 and 3, which are mutually inclined in opposite directions, inside of the molded resin casing. Thereafter, the 'unwanted' rectangular frame portion 11 is cut out, thus completing the manufacture of the magnetic sensor 1 shown in FIG. 1.

In the aforementioned manufacturing method, photo-etching processes that are effected on various parts of the lead frame 10 are performed before application of the press working on the thin metal plate.

The aforementioned magnetic sensor 1 is mounted on a board (or a substrate) installed in a portable terminal device (or a mobile terminal device, not shown), for example, in which bearings of terrestrial magnetism measured by the magnetic sensor 1 are displayed on a display screen. Next, a description will be given with respect to a method of measuring bearings of terrestrial magnetism using the magnetic sensor 1; hereinafter, 'terrestrial magnetism' will be simply referred to as 'magnetism'.

That is, the magnetic sensor chips 2 and 3 respectively detect components of magnetism in A, B, and C directions, thus producing values Sa, Sb, and Sc approximately in proportion to components of magnetism in these directions.

Figure 9:
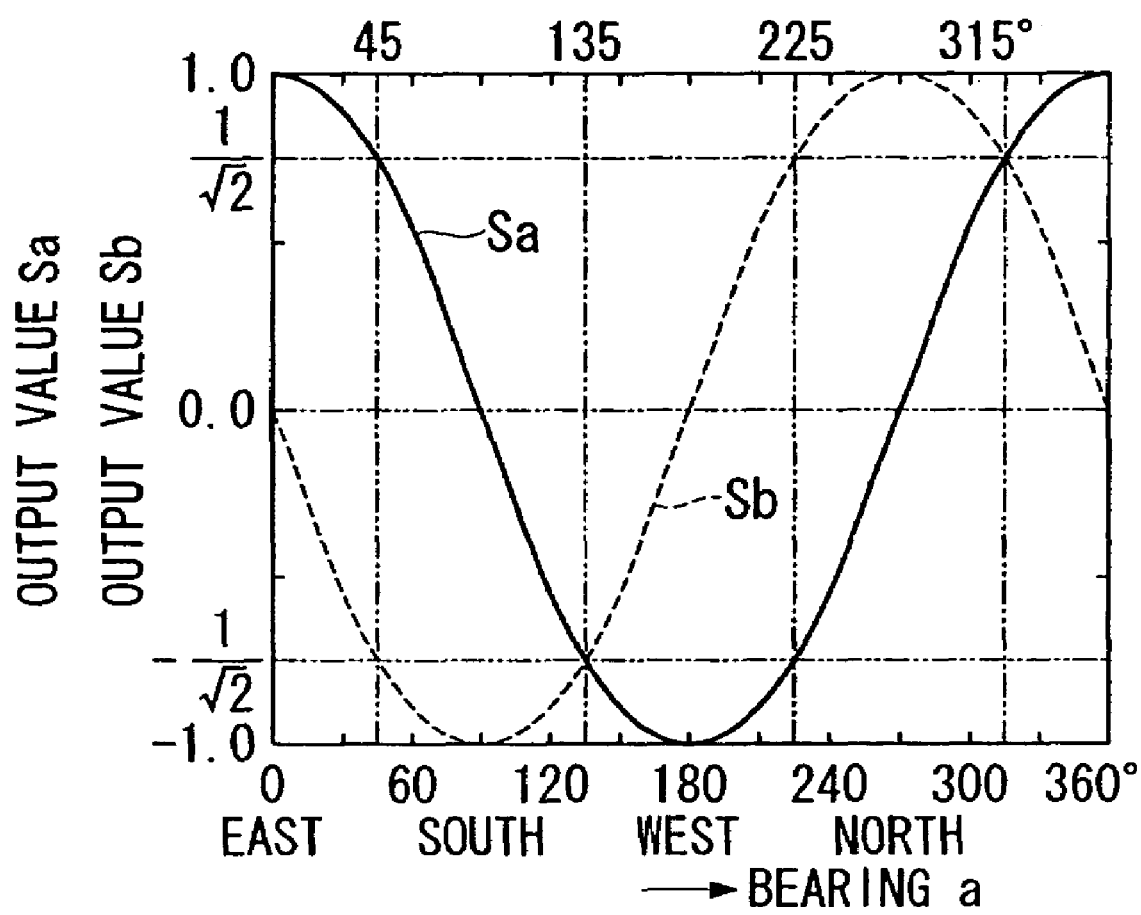
FIG. 9 is a graph showing a relationship between output values of a magnetic sensor chip used for measurement of two-directional components of magnetism.

FIG. 9 shows a relationship between output values Sa and Sb of the magnetic sensor chip 2. When a magnetism direction is defined along the A-B plane, the output value Sa becomes maximal when the direction B of the magnetic sensor chip 2 is directed towards the east, while it becomes minimal when the direction B is directed towards the west, and it becomes zero when the direction B is directed towards the south or the north.

In addition, the output value Sb becomes maximal when the direction B of the magnetic sensor chip 2 is directed towards the north, while it becomes minimal when the direction B is directed towards the south, and it becomes zero when the direction B is directed towards the east or the west.

Incidentally, the output values Sa and Sb shown in the graph of FIG. 9 are created such that the values actually output from the magnetic sensor 1 are each divided by half of the difference between the maximal value and the minimal value.

A bearing 'a' is displayed on a display screen of a portable terminal device in such a way that east is represented by 0°, and it is increased as the device is rotatably moved in a direction from the east to the south, west, and north in turn. The bearing 'a' is determined in accordance with mathematical expressions as written in a table shown in FIG. 84, for example.

When a magnetism direction is defined crossing the A-B plane, the magnetic sensor 1 uses an output of the magnetic sensor chip 3 in addition to outputs of the magnetic sensor chip 2, and the magnetic sensor chip 3 detects components of magnetism in the direction C (crossing the A-B plane) so as to produce a value Sc approximately in proportion to them.

Similar to the aforementioned values Sa and Sb, the output value Sc is created such that the value actually output from the magnetic sensor 1 is divided by half of the difference between the maximal value and the minimal value.

Upon detection of components of magnetism in the direction C (crossing the A-B plane), the output value Sc is produced and is combined with the aforementioned output values Sa and Sb so as to produce a vector in a three-dimensional space for determination of a magnetism direction.

An angle θ formed between the direction C and the A-B plane is greater than 0° and is not greater than 90°; theoretically, it is possible to determine three-dimensional bearings of magnetism when the angle θ is greater than 0°. Actually, however, it is preferable that the angle θ is not less than 20°, and it is further preferable that the angle θ is not less than 30°.

In the manufacturing method of the magnetic sensor 1 described above, the same metal mold is used to simultaneously perform the press working, in which a pattern of the lead frame 10 is extracted from a thin metal plate, and the bending working in which the stages 6 and 7 are inclined. Therefore, it is possible to simplify the manufacturing processes.

In addition, the clamper E is used to press the stages 6 and 7 to elastically deform the easy-to-deform portions 12b of the leads 12 and the bent portions of the leads 13, and the magnetic sensor chips 2 and 3 are bonded to the stages 6 and 7 that are arranged substantially in the same plane. Therefore, it is possible to simultaneously and easily bond a plurality of magnetic sensor chips onto the stages. That is, it is possible to reduce the manufacturing cost of the magnetic sensor 1.

The stages 6 and 7 are inclined in the manufacture of the lead frame 10; therefore, it is possible to accurately set inclined angles with respect to the stages 6 and 7. In addition, the lead 14 and the projecting portion 15 partially overlap each other and are fixed together; therefore, it is possible to reliably hold the stages 6 and 7 so as not to return towards the frame 9. Thus, it is possible to accurately set the angle formed between the surfaces 2a and 3a of the magnetic sensor chips 2 and 3 with ease.

As described above, it is possible to accurately cross a sensing direction of the magnetic sensor chip 3 with the A-B plane, thus establishing three sensing directions in total. This allows bearings of magnetism measured in three sensing directions to be determined as a vector in a three-dimensional space, whereby it is possible to accurately measure the bearings of magnetism within a three-dimensional space.

In the first embodiment, the bent portions of the lead 13 are adequately bent and are subjected to plastic deformation when the stages 6 and 7 are inclined. Of course, this invention is not necessarily limited to the first embodiment; therefore, the bent portions of the lead 13 for supporting the stages 6 and 7 are subjected to plastic deformation such that the stages 6 and 7 are inclined.

In the first embodiment, bent portions firstly being subjected to plastic deformation are ends 13a of the leads 13 for interconnecting the stages 6 and 7, and ends 12a of the leads 12 for interconnecting the frame 9 with the stages 6 and 7; and the next portions being subjected to elastic deformation are ends 13a of the leads 13, which have already been subjected to plastic deformation, and the easy-to-deform portions 12b of the leads 12. This invention is not necessarily limited to the first embodiment in terms of the positions of the bent portions and easy-to-deform portions 12b, the bending directions, and the directions of elastic deformation, which can be adequately set in response to the inclined directions and angles of the stages 6 and 7.

In the first embodiment, after the magnetic sensor chips 2 and 3 are bonded onto the surfaces 6d and 7d of the stages 6 and 7, the wires 8 are arranged, and then, the bent portions and easy-to-deform portions 12b are restored from the elastically deformed states thereof. Of course, this invention is not necessarily limited to the first embodiment. That is, it is possible to modify the first embodiment in such a way that after the bonding of the magnetic sensor chips 2 and 3, the stages 6 and 7 are respectively inclined at prescribed angles, and then, silver paste is hardened. Herein, the clamper E is activated again to arrange both surfaces 6d and 7d of the stages 6 and 7 substantially in the same plane, so that the wires 8 are arranged, and then, the bent portions and easy-to-deform portions 12b are restored from the elastically deformed states thereof.

In the first embodiment, after ends 13a of the leads 13 and the easy-to-deform portions 12b of the leads 12 are restored from the elastically deformed states thereof, the silver paste for bonding the magnetic sensor chips 2 and 3 onto the stages 6 and 7 is subjected to hardening, but this is not restrictive. That is, the silver paste can be hardened before ends 13a of the leads 13 and the easy-to-deform portions 12b of the leads 12 are restored from the elastically deformed states thereof. In this case, it is unnecessary to arrange the projecting portions 13b, which are originally arranged to prevent the magnetic sensor chips 2 and 3 from being unexpectedly moved when the stages 6 and 7 are inclined.

In addition, the magnetic sensor chips 2 and 3 are not necessarily inclined in such a way that ends 2b and 3b thereof are directed to the upper surface 5c of the molded resin casing 5. That is, it is required that the magnetic sensor chips 2 and 3 are mutually inclined to each other with respect to the frame 9, thus crossing the sensing direction of the magnetic sensor chip 3 with the A-B plane.

The first embodiment can be modified in a variety of ways, which will be described with reference to examples.

A first modified example of the first embodiment will be described in detail with reference to FIGS. 10 to 14, wherein the overall configuration of a magnetic sensor is basically identical to that of the foregoing magnetic sensor 1 shown in FIGS. 1 and 2, whereas the lead frame 10 (see FIG. 3) is replaced with a new one (see FIG. 10) for use in the manufacture of the magnetic sensor. In FIGS. 10 to 14, parts identical to those shown in FIGS. 1 to 8 are designated by the same reference numerals; hence, the detailed description thereof will be omitted.

Figure 10:
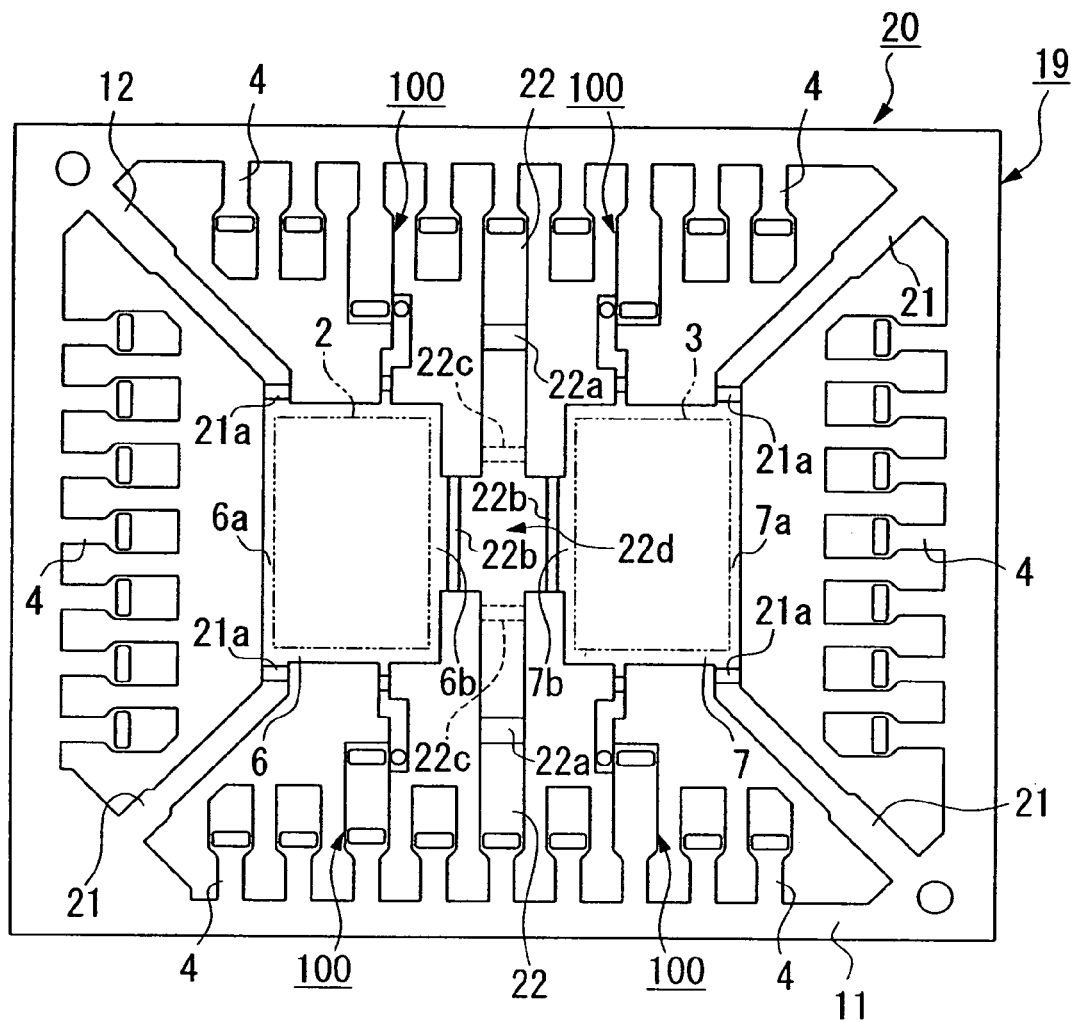
FIG. 10 is a plan view showing a lead frame for use in the manufacture of a magnetic sensor in accordance with a modification of the first embodiment.

Prior to the manufacture of a magnetic sensor, a thin metal plate is subjected to press working, photo-etching, and bending working simultaneously by use of the same metal mold, whereby it is possible to produce a lead frame 20 including two stages 6 and 7, which are supported by a frame 19 (see FIG. 10). The frame 19 comprises a plurality of leads 4, 21, and 22 that are inwardly projected from a rectangular frame portion 11.

The leads 21 and 22 are hanging leads for fixing the stages 6 and 7 in prescribed positions relative to the rectangular frame portion 11, and the leads 21 are arranged to be interconnected with first sides 6a and 7a of the stages 6 and 7 respectively. The leads 22 have a specific structure that is arranged between the stages 6 and 7, and they have an intermediate portion 22d interconnected with second sides 6b and 7b of the stages 6 and 7.

Ends 21a (i.e., bent portions) of the leads 21 are located in proximity to the stages 6 and 7, and they are bent in plastic deformation upon application of bending working so that the stages 6 and 7 will be inclined at prescribed angles. In addition, a pair of bent portions 22a are formed at prescribed positions of the leads 22, between which the intermediate portion 22d is sandwiched, and are subjected to plastic deformation upon bending working, so that the intermediate portion 22d of the leads 22 is slightly projected against the rectangular frame portion 11 in the thickness direction of the lead frame 20. Furthermore, a pair of bent portions 22b are bent in plastic deformation upon bending working and are arranged to adjoin the second sides of the stages 6 and 7 respectively.

Figure 11:
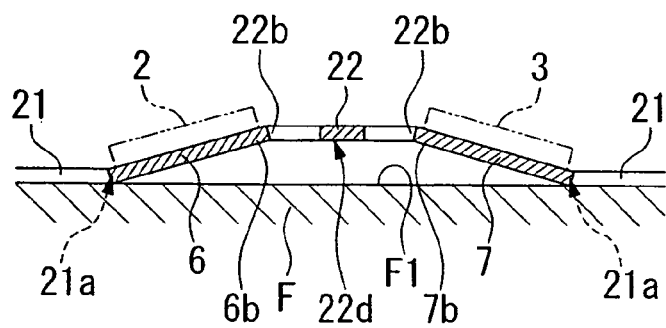
FIG. 11 is a longitudinal sectional view showing essential parts of the lead frame shown in FIG. 10.
Figure 12:
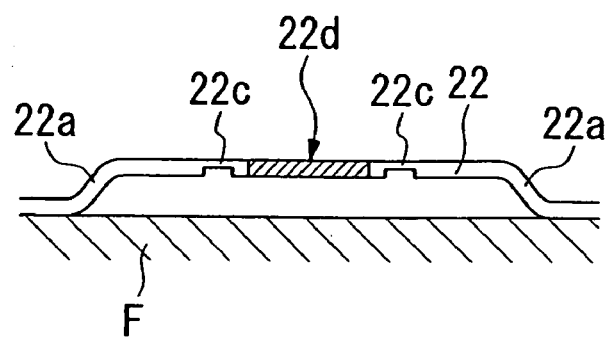
FIG. 12 is a longitudinal sectional view simply showing stages interconnected with a lead in the lead frame of FIG. 10.

Therefore, as shown in FIGS. 11 and 12, due to the provision of ends 21a of the leads 21 and the bent portions 22a and 22b of the leads 22, the stages 6 and 7 are mutually inclined to each other such that the second sides 6b and 7b thereof are moved in the same thickness direction of the rectangular frame portion 11.

In addition, easy-to-deform portions 22c that can be elastically deformed with ease are formed at positions between the pair of bent portions 22a and the intermediate portion 22d of the leads 22. They are specifically shaped by photo-etching and are formed to have roughly half the thickness compared with other portions of the lead 22.

Figure 13:
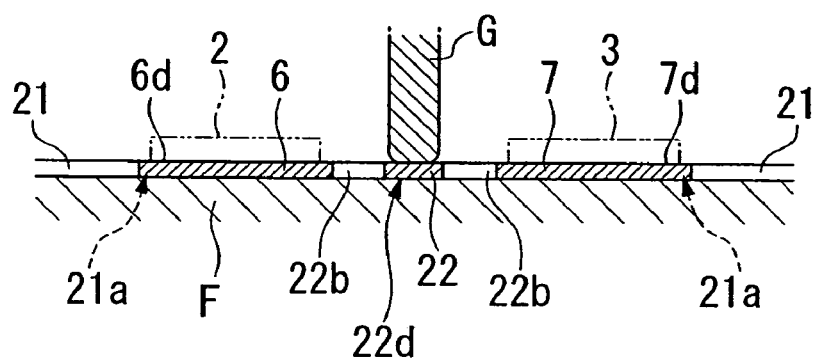
FIG. 13 is a longitudinal sectional view showing magnetic sensor chips to be mounted on stages of the lead frame of FIG. 10 pressed by a clamper.
Figure 14:
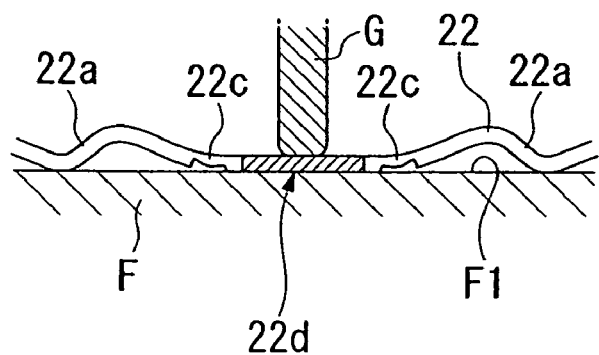
FIG. 14 is a sectional view showing the lead frame of FIG. 10 pressed by the clamper, which is taken in another direction compared with FIG. 13.

The aforementioned lead frame 20 is mounted on a planar surface F1 of a metal mold F as shown in FIGS. 13 and 14, and a clamper G having a rod-like shape is used to press the surface of the intermediate portion 22d of the leads 22, whereby the easy-to-deform portions 22c are elastically deformed so that the backside of the intermediate portion 22d of the leads 22 is brought into contact with the surface F1 of the metal mold F. At this time, surfaces 6d and 7d of the stages 6 and 7 interconnected with the intermediate portion 22d of the leads 22 are arranged along the surface F1 of the metal mold F.

In the aforementioned condition, the magnetic sensor chips 2 and 3 are bonded onto the surfaces 6d and 7d of the stages 6 and 7 by using silver paste, while the leads 4 are wired together with the magnetic sensor chips 6 and 7. After completion of hardening of the silver paste, the clamper G is released from the intermediate portion 22d of the lead 22, whereby ends 21a of the leads 21, and the bent portions 22b and easy-to-deform portions 22c of the leads 22 are all restored from the elastically deformed states, so that the stages 6 and 7 are correspondingly restored to the inclined states. Then, the aforementioned hold mechanism 100 holds the stages 6 and 7 to be respectively inclined at prescribed angles. Lastly, a molded resin casing is formed to encapsulate the magnetic sensor chips 2 and 3 in a resin; then, unwanted portions such as the rectangular frame portion 11 are cut, thus completing the manufacture of the magnetic sensor.

In the first modified example as shown in FIGS. 10 to 14, both the press working and bending working are simultaneously performed using the same metal mold; hence, it is possible to simplify the steps in the manufacture of the magnetic sensor. Herein, ends 21a of the leads 21 and the bent portions 22b and easy-to-deform portions 22c of the leads 22 are subjected to elastic deformation, whereby a plurality of magnetic sensor chips can be easily and simultaneously bonded onto a plurality of stages, which are placed substantially in the same plane. Thus, it is possible to reduce the manufacturing cost of the magnetic sensor.

During the manufacture of the lead frame 20, the stages 6 and 7 are inclined at prescribed angles respectively, and the hold mechanism 100 holds the stages 6 and 7 so as not to be restored in position towards the frame 9. Therefore, it is possible to accurately set a prescribed angle mutually formed between surfaces 2a and 3a of the magnetic sensor chips 2 and 3 with ease.

Next, a second modified example of the first embodiment will be described with reference to FIGS. 15 to 17, wherein parts identical to those shown in FIGS. 1 to 8 are designated by the same reference numerals; hence, the detailed description thereof will be omitted.

Figure 15:
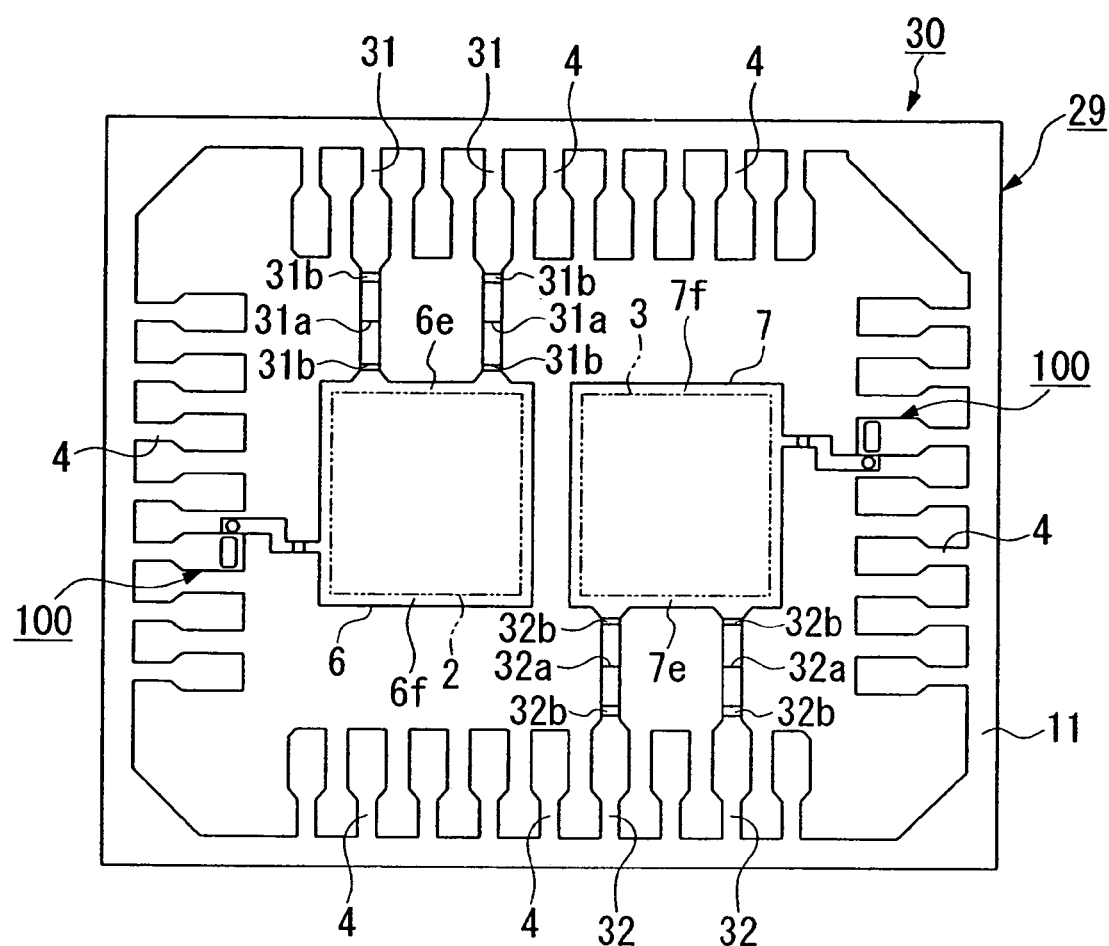
FIG. 15 is a plan view showing a lead frame for use in the manufacture of a magnetic sensor in accordance with another modification of the first embodiment.
Figure 16:
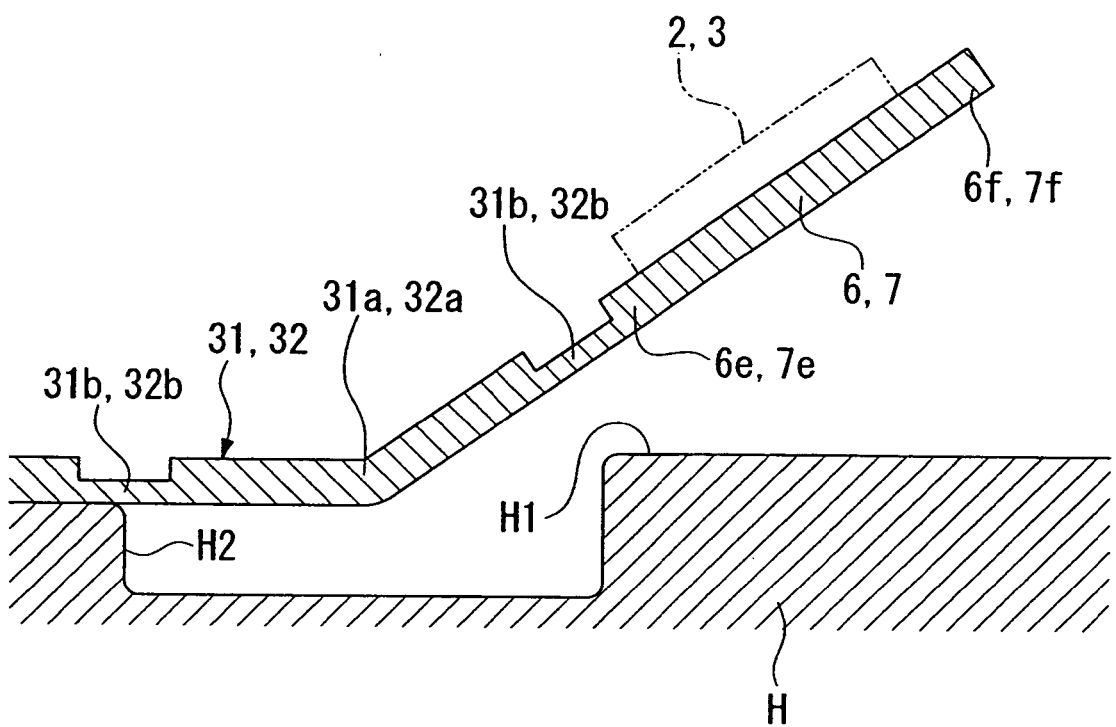
FIG. 16 is a longitudinal sectional view showing a stage connected with a lead of the lead frame of FIG. 15.

In the manufacture of a magnetic sensor, a thin metal plate is simultaneously subjected to press working, photo-etching, and bending working by using the same metal mold, thus producing a lead frame 30 including two stages 6 and 7, which are supported by a frame 29 as shown in FIG. 15. The frame 29 comprises a plurality of leads 4, 31, and 32 that are inwardly projected from a rectangular frame portion 11.

The leads 31 and 32 are hanging leads for fixing the stages 6 and 7 at prescribed positions relative to the rectangular frame portion 11, and a pair of leads 31 are arranged to be interconnected with a first side 6e of the stage 6, while a pair of leads 32 are arranged to be interconnected with a first side 7e of the stage 7. Herein, the first sides 6e and 7e are arranged in the width directions of the stages 6 and 7 and are both perpendicular to a direction for arranging the stages 6 and 7 so as to adjoin together, and they are arranged opposite second sides 6f and 7f in the stages 6 and 7 respectively, wherein they are respectively arranged on opposite sides with respect to the stages 6 and 7.

In addition, bent portions 31a and 32a are formed at prescribed positions of the leads 31 and 32 to incline the stages 6 and 7 against the rectangular frame portion 11, and they are subjected to plastic deformation upon bending working effected on the leads 31 and 32, so that the stages 6 and 7 are maintained to be inclined at prescribed angles respectively. Hence, the inclination angles of the stages 6 and 7 against the rectangular frame portion 11 depend upon the bend angles of the bent portions 31a and 32a respectively.

As described above, the second sides 6f and 7f of the stages 6 and 7 are both moved in the same thickness direction of the rectangular frame portion 11 and are mutually inclined to each other at prescribed angles. That is, the stages 6 and 7 are mutually inclined upon rotation about an axial line along the arranging direction thereof.

Furthermore, easy-to-deform portions 31b are formed at prescribed positions of the leads 31 in proximity to the first side 6e of the stage 6 as well as at other positions of the leads 31 in proximity to the rectangular frame portion, so that the bent portions 31a are sandwiched between pairs of easy-to-deform portions 31b respectively. Similarly, easy-to-deform portions 32b are formed at prescribed positions of the leads 32 in proximity to the first side 7e of the stage 7 as well as at other positions of the leads 32 in proximity to the rectangular frame portion 11, so that the bent portions 32a are sandwiched between pairs of easy-to-deform portions 32b respectively. All the easy-to-deform portions 31b and 32b are specifically shaped by photo-etching, so that as shown in FIG. 16, they are formed to have roughly half the thickness compared with other portions of the leads 31 and 32.

Figure 17:
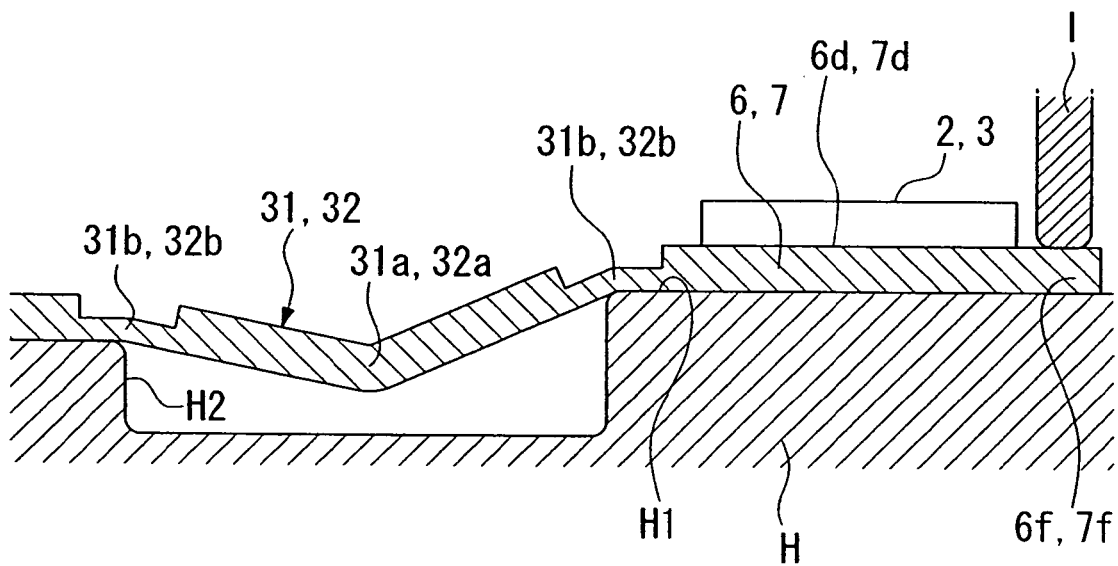
FIG. 17 is a longitudinal sectional view showing a magnetic sensor chip to be mounted on the stage of the lead frame of FIG. 15.

The aforementioned lead frame 30 is placed on a planar surface H1 of a metal mold H as shown in FIG. 17, and a clamper I is used to press surfaces 6d and 7d of the stages 6 and 7 in proximity to the second sides 6f and 7f. Herein, a hollow H2 is formed on the surface H1 of the metal mold H, so that the bent portions 31a and 32a of the leads 31 and 32 are forced so as to be inserted into the hollow H2, thus preventing them from being further deformed. At this time, the easy-to-deform portions 31b and 32b of the leads 31 and 32 are brought into contact with edge portions of the hollow H2 and are subjected to elastic deformation. Thus, the surfaces 6d and 7d of the stages 6 and 7 are forced so as to be arranged along the surface H1 of the metal mold H.

In the aforementioned condition, the magnetic sensor chips 2 and 3 are respectively bonded onto the surfaces 6d and 7d of the stages 6 and 7 by using silver paste; then, they are wired with the leads 4. After completion of hardening of the silver paste, the clamper I is released the stages 6 and 7, whereby the easy-to-deform portions 31b and 32b of the leads 31 and 32 are restored from the elastically deformed states thereof, so that the stages 6 and 7 are restored to the inclined states thereof.

Then, the hold mechanism 100 holds the stages 6 and 7 so as to be inclined at prescribed angles respectively. Lastly, a molded resin casing is formed to encapsulate the magnetic sensor chips 2 and 3 therein; then, unwanted portions such as the rectangular frame portion 11 are cut, thus completing the manufacture of the magnetic sensor.

In the second modified example described above, both the press working and bending working are simultaneously performed by using the same metal mold; therefore, it is possible to simplify the steps in the manufacture of the magnetic sensor. Due to elastic deformation of the easy-to-deform portions 31b and 32b of the leads 31 and 32, the stages 6 and 7 can be substantially placed in the same plane; therefore, it is possible to simultaneously bond a plurality of magnetic sensor chips onto a plurality of stages with ease, which in turn contributes to a reduction of the manufacturing cost of the magnetic sensor.

In the manufacture of the lead frame 30, the stages 6 and 7 are inclined, and the hold mechanism 100 holds them so as not to be restored towards the frame 9. Therefore, it is possible to accurately set a prescribed angle formed between the surfaces 2a and 3a of the magnetic sensor chips 2 and 3 with ease.

Incidentally, the aforementioned hold mechanism 100 is constituted such that the projection 15b formed on the lower end surface 15a of the projecting portion 15 is inserted into the hollow 14b of the lead 14, but this is not restrictive. Therefore, it is possible to modify the first embodiment in such a way that the lead 14 and the projecting portion 15 have projections respectively, for example, because it is required that the lead 14 and the projecting portion 15 somewhat overlap in position in the thickness direction of the lead frame 10.

The hold mechanism 100 is designed to hold the stages 6 and 7 in inclined states at prescribed angles respectively. If the stages 6 and 7 can be stabilized in inclined states at prescribed angles respectively even when ends 13a and 21a of the leads 13 and 21, the easy-to-deform portions 12b, 22c, 31b, and 32b of the leads 12, 22, 31, and 32, and the bent portions 22b of the leads 22 are restored from the elastically deformed states, it is unnecessary to provide the hold mechanism 100.

In addition, the easy-to-deform portions 12b, 22c, 31b, and 32b are each subjected to photo-etching so as to have roughly half the thickness compared with other portions of the leads 12, 22, 31, and 32, but this is not restrictive. That is, it is possible to arbitrarily determine the thickness of the easy-to-deform portions, or it is possible to partially change the thickness of the leads. Alternatively, it is possible to arrange notches on the leads without changing the thickness, or it is possible to form through holes at prescribed positions of the leads. In short, it is required that the leads 12, 22, 31, and 32 can be elastically deformed at prescribed positions with ease.

A third modified example of the first embodiment will be described with reference to FIGS. 18 to 21, wherein parts identical to those shown in FIGS. 1 to 8 are designated by the same reference numerals; hence, the detailed description thereof will be omitted.

Figure 18:
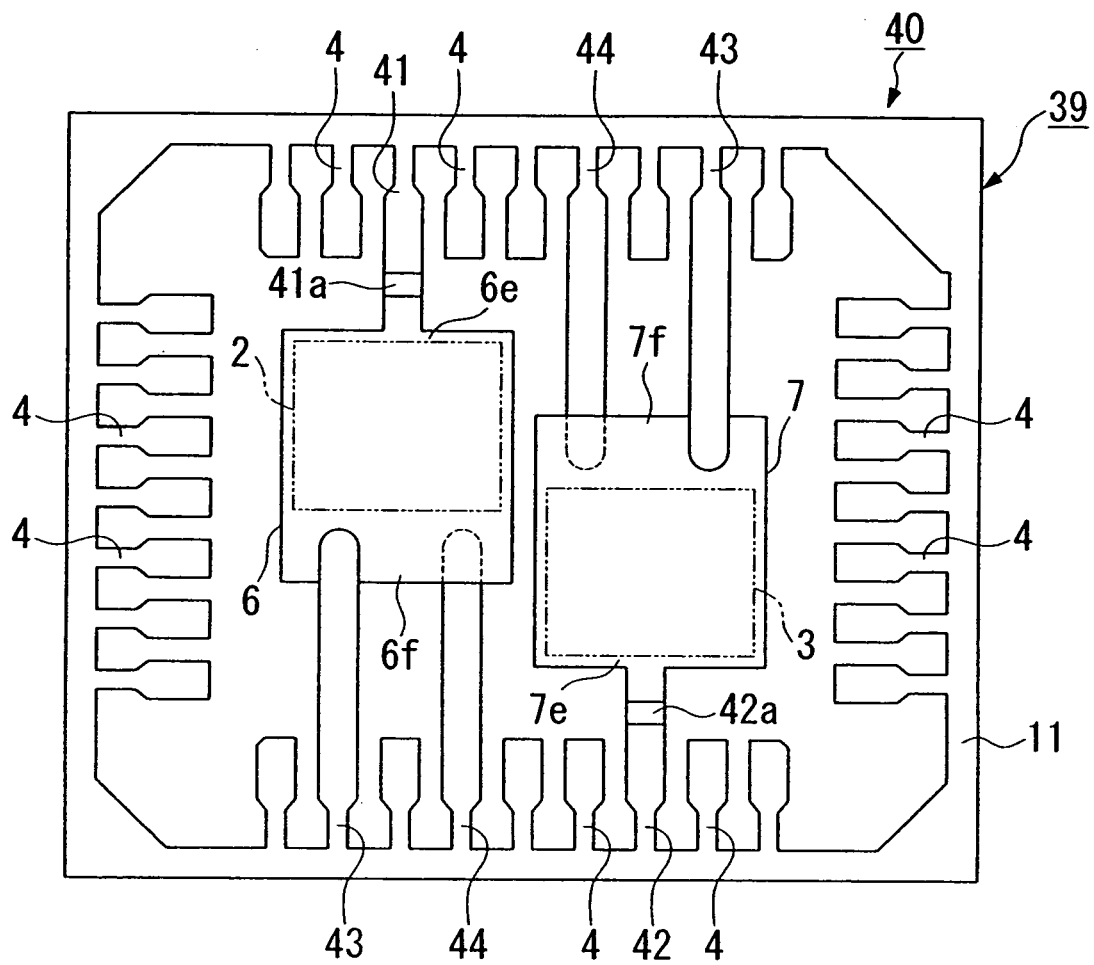
FIG. 18 is a plan view showing a lead frame for use in the manufacture of a magnetic sensor in accordance with a further modification of the first embodiment.

Prior to the manufacture of a magnetic sensor, a thin metal plate is subjected to press working, photo-etching, and bending working by using the same metal mold, thus producing a lead frame 40 including two stages 6 and 7, which are supported by a frame 39 as shown in FIG. 18. The lead frame 40 has a plurality of leads 4, and 41 to 44 that are inwardly projected from a rectangular frame portion 11.

The leads 41 and 42 are hanging leads for fixing the stages 6 and 7 to the rectangular frame portion 11 at prescribed positions, and the lead 41 is interconnected with a first side 6e of the stage 6, while the lead 42 is interconnected with a first side 7e of the stage 7.

A pair of leads (or pressing members) 43 and 44 are projected from the rectangular frame portion 11 towards a second side 6f opposite the first side 6e of the stage 6, and a pair of leads (or pressing members) 43 and 44 are projected from the rectangular frame portion 11 towards a second side 7f opposite the first side 7e of the stage 7.

Figure 19:
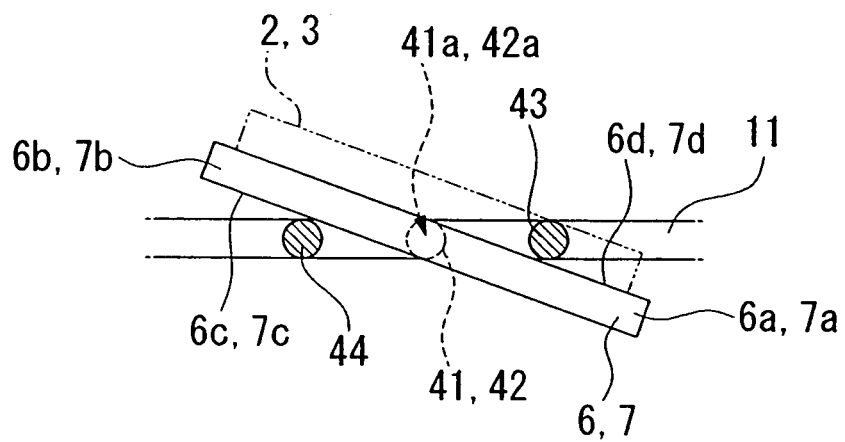
FIG. 19 is a longitudinal sectional view showing positional relationships between stages and leads in the lead frame of FIG. 18.

As shown in FIG. 19, tip ends of the leads 43 are arranged in contact with surfaces 6d and 7d of the stages 6 and 7 in proximity to ends 6a and 7a respectively, while tip ends of the leads 44 are arranged in contact with backsides 6c and 7c of the stages 6 and 7 in proximity to other ends 6b and 7b respectively. Under this condition, the surfaces 6d and 7d of the stages 6 and 7 are pressed downwardly due to elasticity of the leads 43, while the backsides 6c and 7c of the stages 6 and 7 are pressed upwardly due to elasticity of the leads 44. For this reason, the stages 6 and 7 are placed under the influence of forces causing rotations about axial lines interconnected between the first sides 6e and 7e, and the second sides 6f and 7f respectively. Due to such forces, easy-to-deform portions 41a and 42a of the leads 41 and 42 are subjected to elastic deformation and are distorted, so that the stages 6 and 7 are inclined respectively. That is, the stages 6 and 7 are inclined such that the other ends 6b and 7b thereof are moved in the same thickness direction of the rectangular frame portion 11.

Figure 20:
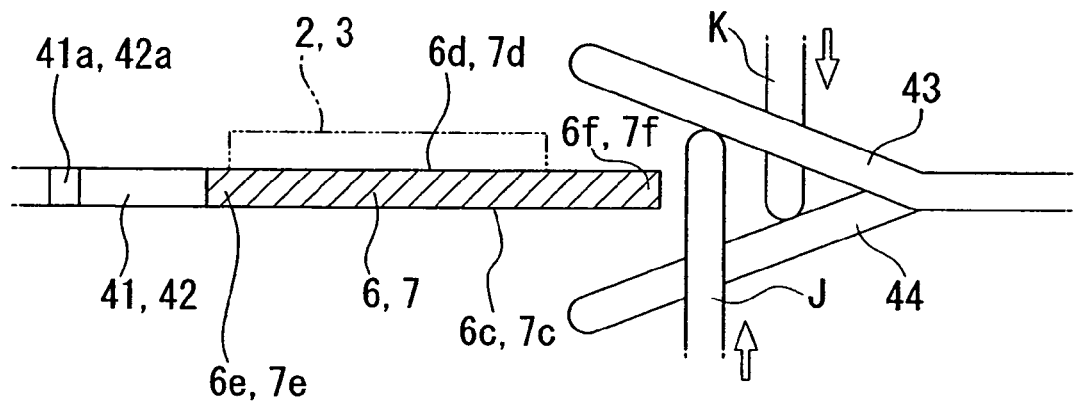
FIG. 20 is a longitudinal sectional view showing a magnetic sensor chip to be mounted on the stage of the lead frame of FIG. 18.
Figure 21:
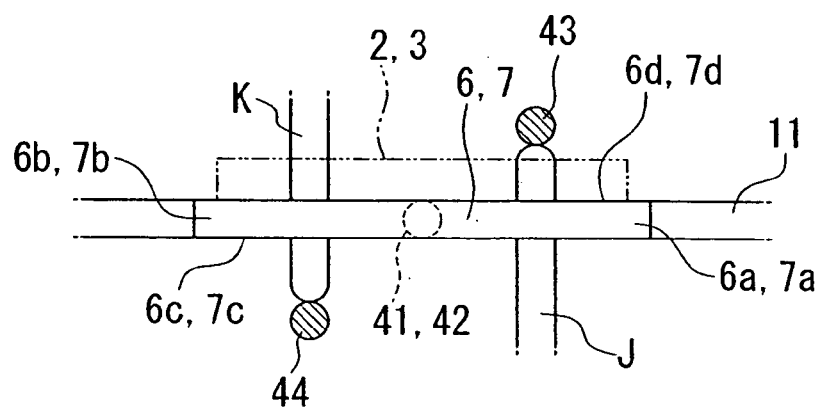
FIG. 21 is a longitudinal sectional view showing the magnetic sensor chip to be mounted on the stage of the lead frame of FIG. 18 pressed by pressing members.

Then, as shown in FIGS. 20 and 21, clampers J and K are brought into contact with the leads 43 and 44, which are thus spaced apart from the stages 6 and 7 respectively. At this time, the stages 6 and 7 are released from pressures applied thereto by the leads 43 and 44, so that the easy-to-deform portions 41a and 42a are restored from the elastically deformed states thereof. Therefore, both the stages 6 and 7 are placed substantially in the same plane of the rectangular frame portion 11 in the lead frame 40.

In the aforementioned condition, magnetic sensor chips 2 and 3 are respectively bonded onto the surfaces 6d and 7d of the stages 6 and 7 by use of silver paste, and they are wired with the leads 4. After completion of hardening of the silver paste, the leads 43 and 44 are released from pressures applied thereto by the clampers J and K. Thus, the leads 43 again press the surfaces 6d and 7d of the stages 6 and 7, and the leads 44 again press the backsides 6c and 7c of the stages 6 and 7. This causes the easy-to-deform portions 41a and 42a to be elastically deformed, by which the stages 6 and 7 are inclined again.

Lastly, a molded resin casing is formed to encapsulate the magnetic sensor chips 2 and 3 in a resin; then, unwanted portions such as the rectangular frame portion 11 are cut, thus completing the manufacture of the magnetic sensor.

In the aforementioned manufacturing method, the leads 43 and 44 for inclining the stages 6 and 7 are formed in a manufacturing process of the lead frame 40; therefore, after wiring the magnetic sensor chips 2 and 3 together with the leads 4, it is possible to easily incline the stages 6 and 7. That is, it is possible to simplify the manufacture of the magnetic sensor. In addition, the clampers J and K are used to separate the leads 43 and 44 from the stages 6 and 7 so that the easy-to-deform portions 41a and 42a of the leads 41 and 42 are restored from the elastically deformed states thereof, whereby the stages 6 and 7 are placed substantially in the same plane. This allows a plurality of magnetic sensor chips to be simultaneously bonded onto a plurality of stages with ease. Thus, it is possible to reduce the manufacturing cost of the magnetic sensor.

Due to the provision of the leads 43 and 44, the stages 6 and 7 can be reliably maintained in inclined states; therefore, it is possible to accurately set the prescribed angle between surfaces 2a and 3a of the magnetic sensor chips 2 and 3 with ease.

In the aforementioned examples related to the first embodiment, the magnetic sensor ships 2 and 3 are bonded onto the stages 6 and 7 by use of the silver paste, but this is not restrictive. That is, any conductive adhesive may satisfy the need for bonding the magnetic sensor chips 2 and 3 onto the stages 6 and 7.

In addition, the magnetic sensor chips 2 and 3 are bonded onto the surfaces 6d and 7d of the stages 6 and 7, but this is not restrictive. That is, at least one magnetic sensor chip can be bonded onto the backside (6c or 7c) of the stage (6 or 7).

Furthermore, the magnetic sensor uses two magnetic sensor chips 2 and 3, wherein the magnetic sensor chip 3 has a single sensing direction, but this is not restrictive. That is, it is possible to use a plurality of magnetic sensor chips to realize three or more sensing directions, which cross each other so as to allow a magnetism direction to be expressed as a vector in a three-dimensional space. For example, the magnetic sensor chip 3 can be modified to have two sensing directions. Alternatively, it is possible to use three magnetic sensor chips each having a single sensing direction.

In the above, the backsides 4a of the leads 4 are exposed below the lower surface 5a of the molded resin casing 5, but this is not restrictive. For example, the backsides 4a of the leads 4 can be partially arranged below the lower surface 5a of the molded resin casing 5.

This invention is not necessarily limited to the aforementioned examples related to the first embodiment in terms of the number and positions of the leads 4 and wires 8. That is, in response to the types of magnetic sensor chips, it is possible to arbitrarily change the number and positions of wires being bonded to the magnetic sensor chips, and it is possible to arbitrarily change the number and positions of the leads.

Moreover, the aforementioned magnetic sensor 1 is designed to allow installation into a portable terminal device, but this is not restrictive. For example, the magnetic sensor 1 can be redesigned for medical instruments such as catheters, fiberscopes, and cameras that are inserted into human bodies. In order to measure bearings of a camera that is inserted into a human body, the human body is placed under the influence of a magnetic field so that a magnetism direction is measured by the magnetic sensor 1. Therefore, it is possible to determine a relative angle between the magnetic sensor and the magnetic field in a three-dimensional manner. Thus, it is possible to accurately detect bearings of a camera with reference to the magnetism direction.

As described heretofore, the first embodiment and its related examples have a variety of effects and technical features, which will be described below.

(1) A lead frame adapted to a magnetic sensor comprises at least two stages and interconnecting members having elastically deforming abilities, so that various types of magnetic sensors can be manufactured with ease by adequately setting positional relationships between magnetic sensor chips mounted on stages.

(2) Bent portions that can be bent upon plastic deformation are formed in the interconnecting members, which allow the stages to be arranged at desired positions with ease. Specifically, easy-to-deform portions that can be elastically deformed are formed in the interconnecting members with ease; therefore, it is possible to easily and simultaneously bond magnetic sensor chips onto the stages, the surfaces of which are substantially placed in the same plane.

(3) A first projecting portion (e.g., a lead) is projected inwardly from a frame of the lead frame, while a second projecting portion is projected from a stage. That is, the lead frame has first and second projecting portions, which are projected in opposite directions in proximity to each other and partially overlap each other in the thickness direction. Upon engagement of the first and second projecting portions, it is possible to prevent stages, once arranged at desired positions by adequately bending the bent portions, from being returned to the frame. Thus, it is possible to reliably fix sensor chips at desired positions.

(4) The stages are automatically inclined during the manufacture of the lead frame due to the provision of easy-to-deform portions in the interconnecting members, wherein a plurality of magnetic sensor chips can be simultaneously bonded onto the stages that are pressed by pressing members and are placed substantially in the same plane. Due to the provision of pressing members, the stages can be maintained at prescribed positions; therefore, it is possible to accurately set a prescribed angle between the surfaces of the magnetic sensor chips.

(5) In the manufacture of the magnetic sensor, it is possible to simultaneously bond a plurality of magnetic sensor chips onto a plurality of stages, which are inclined and are placed substantially in the same plane as necessary; therefore, it is possible to reduce the number of steps in the manufacture of the magnetic sensor; thus, it is possible to reduce the manufacturing cost of the magnetic sensor.

(6) It is possible to accurately set a desired angle formed between the surfaces of the magnetic sensor chips with ease. When one magnetic sensor chip has two sensing directions while the other magnetic sensor chip has a single sensing direction, it is possible to accurately measure bearings of magnetism, which can be determined as a vector in a three-dimensional space.

(7) The stages can be maintained in inclined states so as not to return towards the frame; therefore, it is possible to reliably fix the magnetic sensor chips inclined at prescribed angles respectively.

(8) In the manufacture of the magnetic sensor, the pressing members are formed so as to incline the stages; therefore, it is possible to simplify the manufacturing process of the magnetic sensor. In addition, a plurality of magnetic sensor chips can be simultaneously bonded onto a plurality of stages with ease; therefore, it is possible to reduce the manufacturing cost of the magnetic sensor.

2. Second Embodiment

First, a description will be given with respect to the configuration of a magnetic sensor 101 that is manufactured by a manufacturing method according to a second embodiment of the invention with reference to FIGS. 22 and 23. Similar to the foregoing magnetic sensor 1 of the first embodiment, the magnetic sensor 101 of the second embodiment is designed to measure the direction and magnitude of an external magnetic field applied thereto, and it comprises two magnetic sensor chips 102 and 103, a plurality of leads 104 for electrically connecting the magnetic sensor chips 102 and 103 with an external device (not shown), and a molded resin casing 105 for encapsulating and integrally fixing the magnetic sensor chips 102 and 103 and the leads 104 at prescribed positions therein.

Each of the magnetic sensor chips 102 and 103 is roughly formed in a rectangular plate-like shape in plan view, and they are mounted on stages 106 and 107 respectively. The magnetic sensor chips 102 and 103 are embedded in the molded resin casing 105, wherein they are arranged above the leads 104 and in proximity to an upper surface 105c of the molded resin casing 105. In addition, the magnetic sensor chips 102 and 103 are respectively inclined towards a lower surface 105a of the molded resin casing 105, wherein ends 102b and 103b of the magnetic sensor chips 102 and 103 are directed towards the upper surface 105c of the molded resin casing 105, so that surfaces 102a and 103a of the magnetic sensor chips 102 and 103 are mutually inclined at an acute angle θ therebetween. That is, the acute angle θ is formed between a surface 106d of the stage 106 and a backside 107c of the stage 107.

In the above, the magnetic sensor chip 102 is sensitive to components of magnetism of an external magnetic field in two directions (namely, directions A and B), which cross at a right angle along the surface 102a thereof. In contrast, the magnetic sensor chip 103 is sensitive to components of magnetism of an external magnetic field in a single direction (namely, a direction C), which crosses at an acute angle to an A-B plane defined by the directions A and B along the surface 103a thereof.

The leads 104 are each made of a prescribed metal material such as copper, and backsides 104a of the leads 104 are exposed below the lower surface 105a of the molded resin casing 105. Ends 104b of the leads 104 are electrically connected with the magnetic sensor chips 102 and 103 via wires 108, and interconnecting portions therebetween are embedded in the molded resin casing 105.

Next, a manufacturing method of the magnetic sensor 101 will be described in accordance with the second embodiment of the invention.

Figure 24:
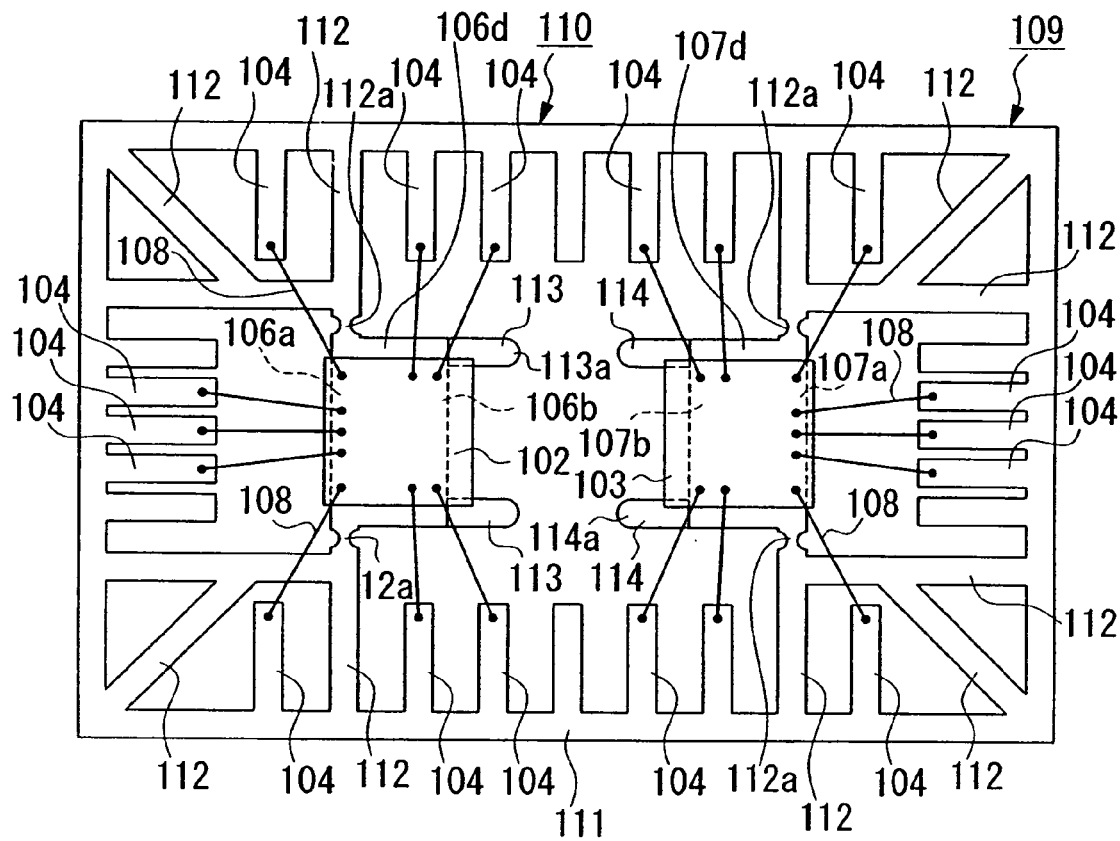
FIG. 24 is a plan view showing a lead frame in which magnetic sensor chips are mounted on stages.
Figure 25:
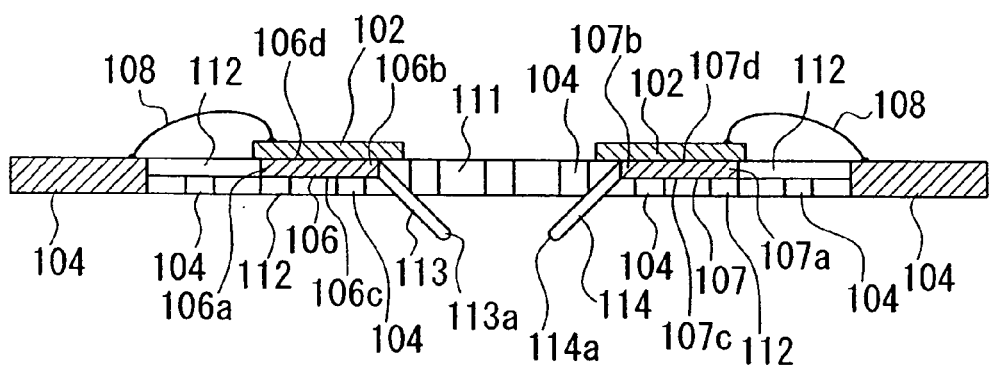
FIG. 25 is a longitudinal sectional view of the lead frame having projecting elements in the backsides of the stages shown in FIG. 24.

First, a thin metal plate is subjected to either press working or etching, or it is subjected to both press working and etching; thus, it is possible to form a lead frame 110 as shown in FIGS. 24 and 25 in which the stages 106 and 107 are supported by a frame 109. The frame 109 comprises a rectangular frame portion 111 that is formed s as to encompass the stages 106 and 107 therein, and a plurality of leads 104 and 112 that project inwardly from the rectangular frame portion 111.

The leads 112 are hanging leads that fix the stages 106 and 107 relative to the rectangular frame portion 111, wherein ends 112a of the leads 112 (namely, interconnecting members) are interconnected with side ends of first sides 106a and 107a of the stages 106 and 107 along the width directions. In addition, cutouts are formed at side positions of ends 112a of the leads 112, by which the widths are reduced compared with other portions of the leads 112. That is, ends 112a of the leads 112 have distorted portions that can be easily distorted and deformed when the stages 106 and 107 are inclined.

A pair of projecting elements 113 are formed in a backside 106c of the stage 106 relative to a second side 106b, and a pair of projecting elements 114 are formed in a backside 107c of the stage 107 relative to a second side 107b. The projecting elements 113 and 114 are arranged so as to incline the stages 106 and 107 respectively. Each of the projecting elements 113 and 114 is formed in a thin rod-like shape, wherein the projecting elements 113 for the stage 106 are arranged opposite the projecting elements 114 for the stage 107.

The projecting elements 113 that are formed along side ends of the stage 106 with a prescribed distance therebetween are spaced apart from the projecting elements 114 that are formed along side ends of the stage 107 with a prescribed distance therebetween, whereby it is possible to prevent defects from occurring in the supply of a resin during the formation of a molded resin casing 105. In order to accurately incline the stages 106 and 107 in a stable manner, it is preferable to increase the distance between the projecting elements 113 and the distance between the projecting elements 114. In addition, the projecting elements 113 and 114 have 'circular' tip ends 113a and 114a each having a hemispherical shape in order to minimize unwanted exposure of the projecting elements 113 and 114 below the lower surface of the molded resin casing 105.

The internal areas of the lead frame 110 including the stages 106 and 107 inside of the leads 104 are made thin compared with other areas of the lead frame 110 during application of photo-etching, and they are formed to have roughly half the thickness compared with the other areas, for example. The photo-etching is performed prior to press working effected on a thin metal plate in order to avoid unwanted exposure of the leads 112, and the backsides 106c and 107c of the stages 106 and 107 below the lower surface of the molded resin casing 105.

After preparation of the lead frame 110, the magnetic sensor chips 102 and 103 are respectively bonded onto the surfaces 106d and 107d of the stages 106 and 107; then, wires 108 are arranged so as to electrically connect the magnetic sensor chips 102 and 103 with the leads 104.

During the step of inclining the stages 106 and 107, bonded portions between the wires 108 and the magnetic sensor chips 102 and 103 are separated from bonded portions between the wires 108 and the leads 104. For this reason, the wires 108 should be arranged to have sufficient room in length or height.

Figure 26:
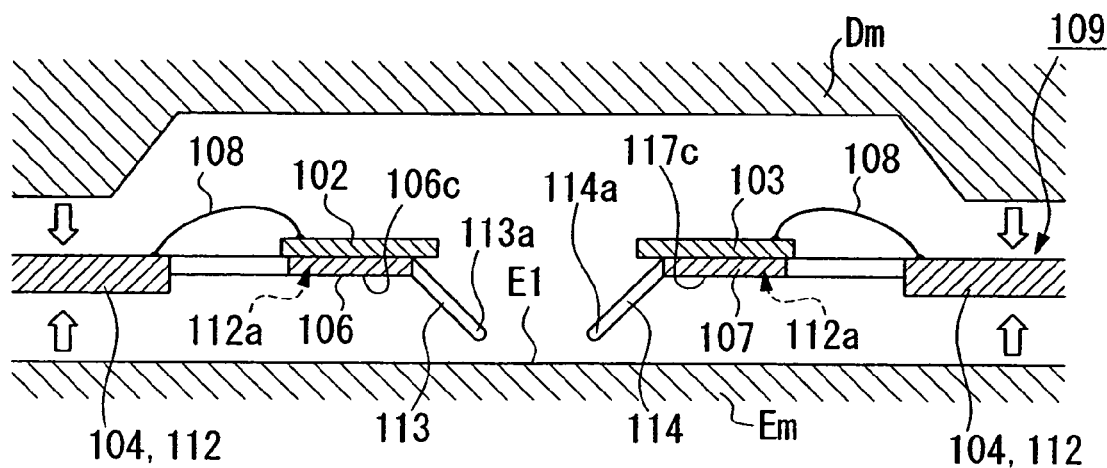
FIG. 26 is a longitudinal sectional view of the lead frame having the projecting elements shown in FIG. 25, which is placed in a metal mold.

As shown in FIG. 26, the frame 109, except for prescribed parts of the leads 104 and 112 is held and fixed in a metal mold consisting of an upper mold Dm and a lower mold Em, by which the magnetic sensor chips 102 and 103 are embedded in a resin.

Figure 27:
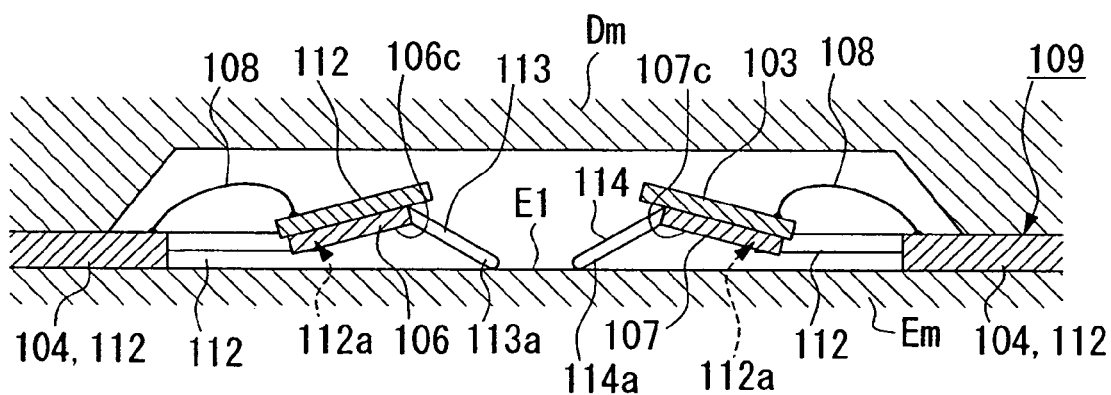
FIG. 27 is a longitudinal sectional view of the lead frame having the projecting elements shown in FIG. 25, which is placed in the metal mold activated to incline the stages together with the magnetic sensor chips.

When the frame 109 is held in the metal mold, an interior wall E1 of the lower mold Em presses the tip ends 113a and 114a of the projecting elements 113 and 114 so that the stages 106 and 107 are respectively rotated about axial lines, which interconnect together ends 112a of the leads 112 arranged on side ends of the stages 106 and 107, whereby ends 112a of the leads 112 are distorted and deformed. Thus, as shown in FIG. 27, the magnetic sensor chips 102 and 103 are inclined at prescribed angles against the leads 112 and against the interior wall E1 together with the stages 106 and 107.

Under the condition where the tip ends 113a and 114a of the projecting elements 113 and 114 are pressed by the interior wall E1 of the lower mold Em, a melted resin material is injected into the metal mold consisting of the upper mold Dm and the lower mold Em, thus forming a molded resin encapsulating the magnetic sensor chips 102 and 103. Therefore, it is possible to fixedly arrange the magnetic sensor chips 102 and 103, which are mutually inclined at prescribed angles, in the molded resin.

Figure 22:
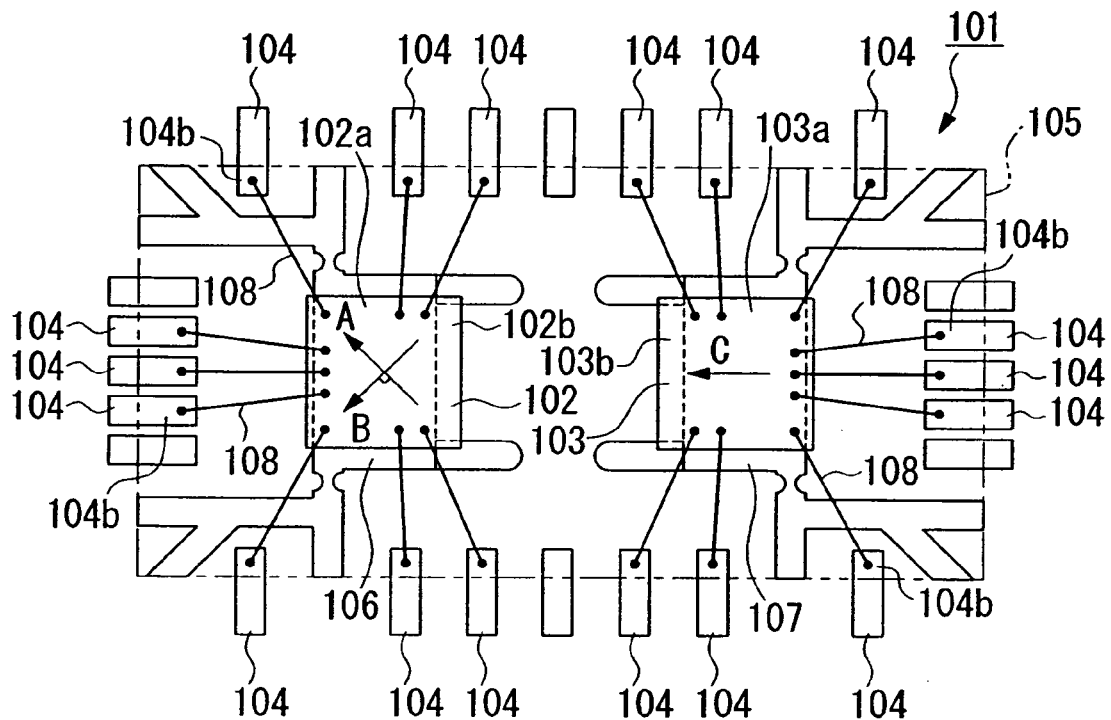
FIG. 22 is a plan view showing a magnetic sensor that is manufactured in accordance with a manufacturing method according to a second embodiment of the invention.
Figure 23:
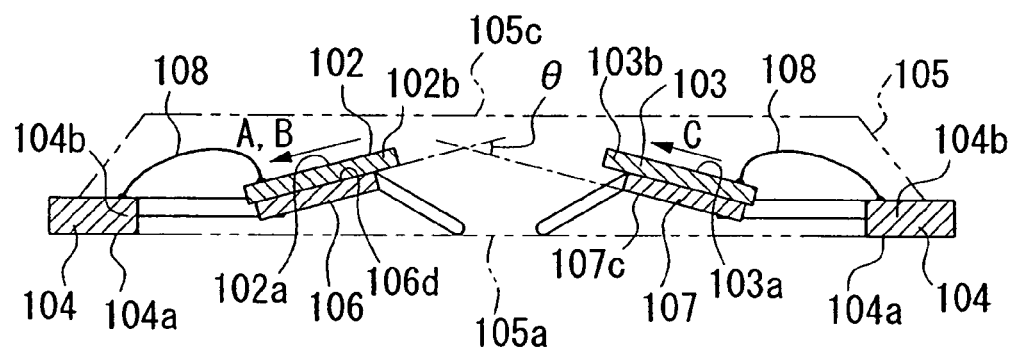
FIG. 23 is a longitudinal sectional view of the magnetic sensor shown in FIG. 22.

Thereafter, unwanted parts such as the rectangular frame portion 111 and the leads 112, which are projected outside of the molded resin, are cut so as to complete the manufacture of the magnetic sensor 101 shown in FIG. 22.

The magnetic sensor 101 is mounted on a board (or a substrate) arranged inside of a portable terminal device (not shown), for example, in which bearings of magnetism measured by the magnetic sensor 101 are displayed on a display screen.

Similar to the foregoing first embodiment, the magnetic sensor chips 102 and 103 detect components of magnetism in directions A, B, and C so as to produce values Sa, Sb, and Sc approximately in proportion to the detected components of magnetism. Details have already been described with reference to FIG. 9 in conjunction with the first embodiment. Thus, the second embodiment provides similar effects of the foregoing first embodiment.

In the second embodiment, the projecting elements 113 and 114 have 'hemispherical' tip ends 113a and 114a, but this is not restrictive. That is, it is required that the tip ends of the projecting elements 113 and 114 have desired shapes to minimize exposure thereof below the lower surface 105a of the molded resin casing 105. Therefore, each of the tip ends 113a and 114a of the projecting elements 113 and 114 can be formed in a sharp-pointed shape, for example.

In addition, it is possible to arrange insulators on the tip ends 113a and 114a of the projecting elements 113 and 114, by which metal parts of the tip ends 113a and 114a can be prevented from being exposed below the lower surface 105a of the molded resin casing 105. Furthermore, it is possible to form the lower surface 105a of the molded resin casing 105 in a convex shape, by which the tip ends 113a and 114a can be prevented from being exposed from the lowermost surface of the molded resin casing 105.

Figure 28:
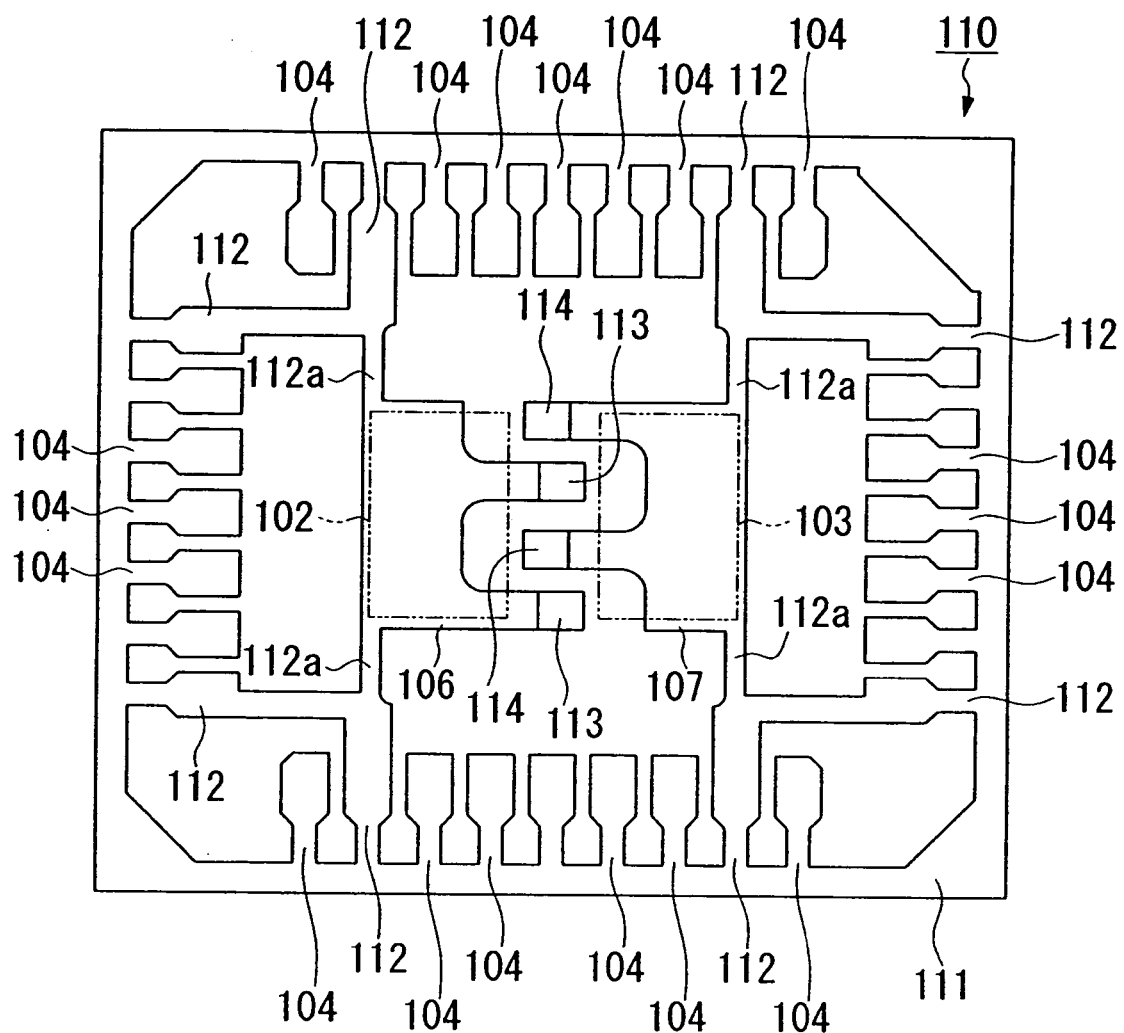
FIG. 28 is a plan view showing a lead frame for use in the manufacture of a magnetic sensor in accordance with a modification of the second embodiment.
Figure 29:
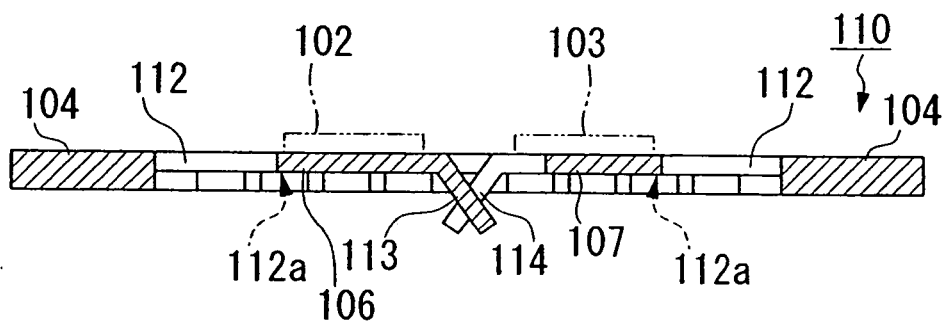
FIG. 29 is a longitudinal sectional view of the lead frame shown in FIG. 28.

In the above, the projecting elements 113 are arranged opposite each other along side ends of the stage 106 relative to the second side 106b, while the projecting elements 114 are arranged opposite to each other along side ends of the stage 107 relative to the second side 107b, but this is not restrictive. For example, as shown in FIGS. 28 and 29, it is possible to alternately arrange projecting elements 113 and 114 along the width directions of the stages 6 and 7. Due to the alternate arrangement of the projecting elements 113 and 114, it is possible to reduce a gap between the stages 106 and 107 that are arranged so as to adjoin together. Therefore, it is possible to reduce the overall size of the magnetic sensor 101 without changing the sizes of the magnetic sensor chips 102 and 103 mounted on the stages 106 and 107.

Figure 30:
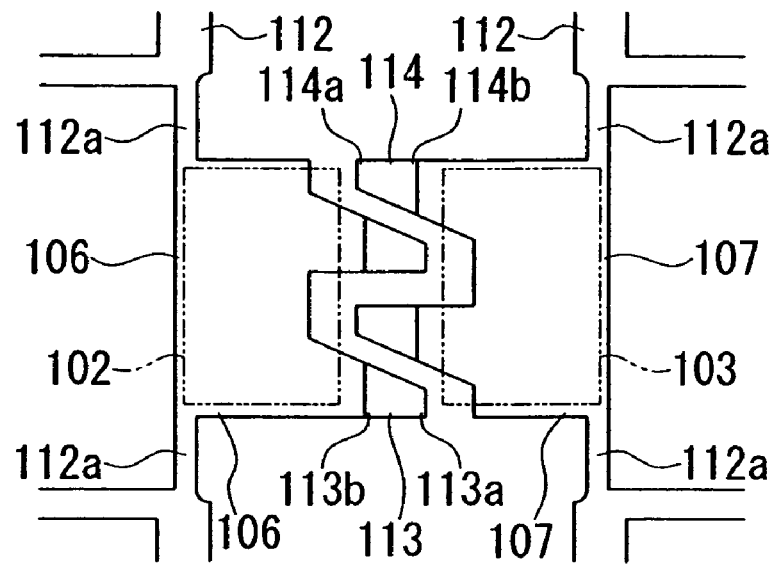
FIG. 30 is a plan view showing essential parts of a lead frame for use in the manufacture of a magnetic sensor in accordance with another modification of the second embodiment.
Figure 31:
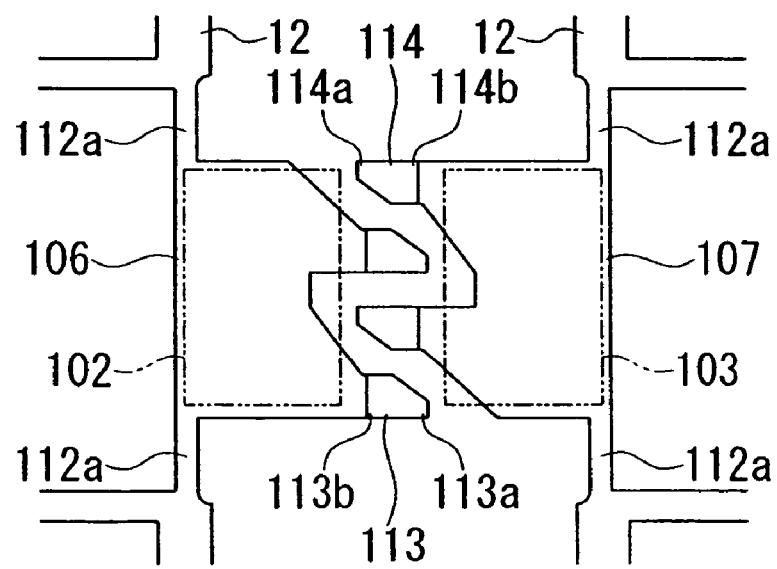
FIG. 31 is a plan view showing essential parts of a lead frame for use in the manufacture of a magnetic sensor in accordance with a further modification of the second embodiment.

In the second embodiment, each of the projecting elements 113 and 114 is formed in a thin rod-like shape, but this is not restrictive. For example, as shown in FIGS. 30 and 31, a tapered projecting element 113 for the stage 106 is engaged with a tapered projecting element 114 for the stage 107 with prescribed gaps therebetween, and the projecting element 113 has tapered shapes whose dimensions are gradually reduced from bases 113b towards tip ends 113a, and the projecting element 114 has tapered shapes whose dimensions are gradually reduced from bases 114b to tip ends 114a. Herein, it is possible to increase the dimensions of the bases 113b and 114b of the projecting elements 113 and 114 so as to be relatively large; therefore, it is possible to prevent the projecting elements 113 and 114 from being unexpectedly deformed when the stages 106 and 107 are inclined.

Figure 32:
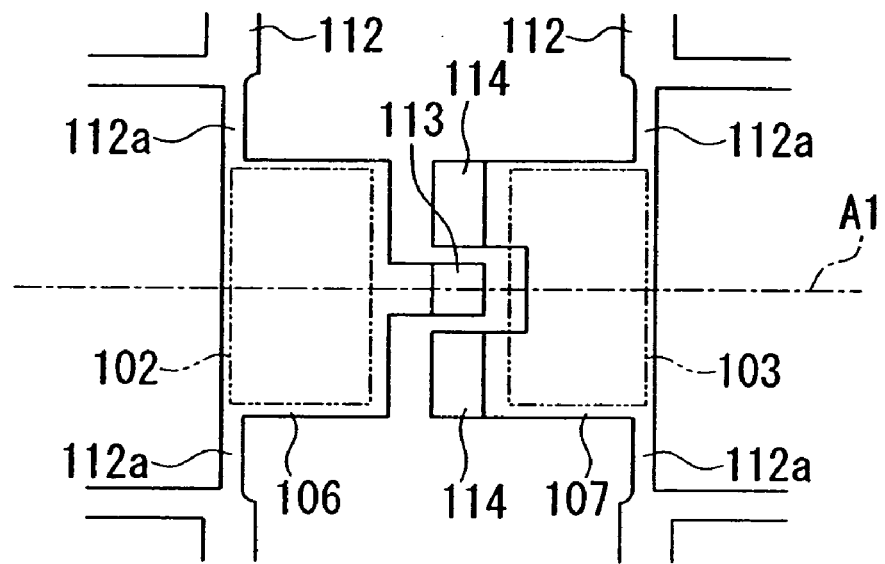
FIG. 32 is a plan view showing essential parts of a lead frame for use in the manufacture of a magnetic sensor in accordance with a further modification of the second embodiment.

In addition, it is possible to arrange projecting elements 113 and 114 linearly symmetrical with each other with respect to a center line A1, drawn through the centers of the stages 106 and 107 in the width directions, while increasing the width dimensions of the projecting elements 113 and 114 as shown in FIG. 32. Herein, when the stages 106 and 107 are inclined, it is possible to prevent the projecting elements 113 and 114 from being deformed, and it is therefore possible to prevent the stages 106 and 107 from being distorted. Since the width dimensions of the projecting element 113 for the stage 106 are increased, it is possible to arrange only the projecting element 113.

Figure 33:
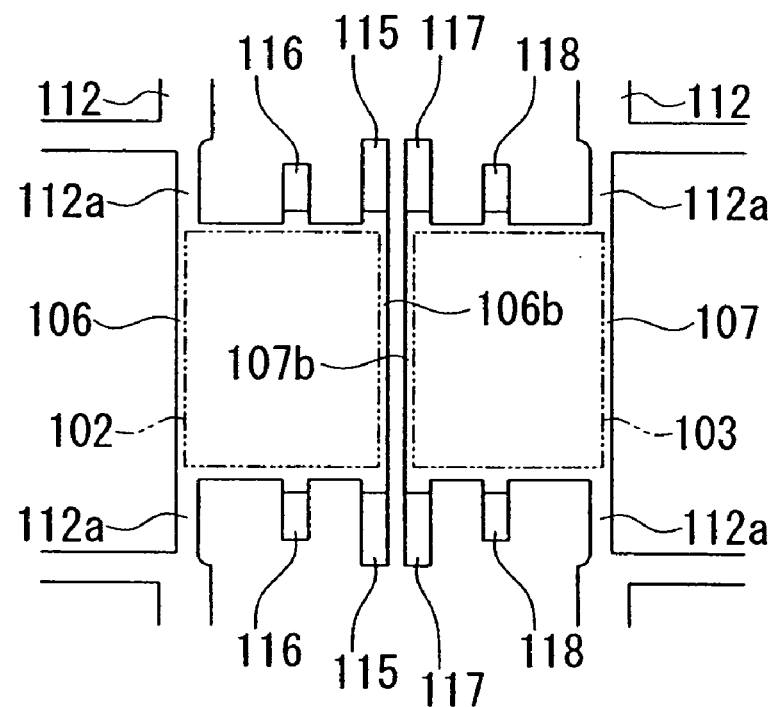
FIG. 33 is a plan view showing essential parts of a lead frame for use in the manufacture of a magnetic sensor in accordance with a further modification of the second embodiment.
Figure 34:
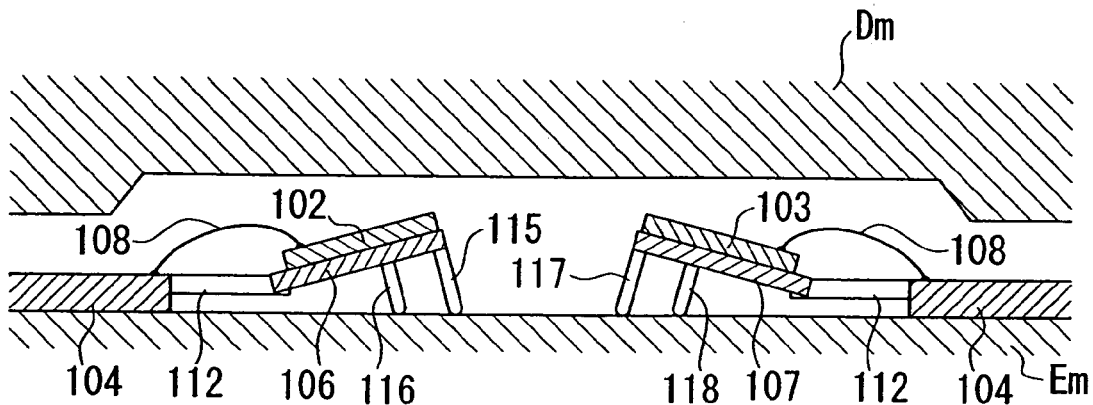
FIG. 34 is a longitudinal sectional view showing the lead frame of FIG. 33, which is held in a metal mold to incline stages together with magnetic sensor chips.

In the second embodiment, the projecting elements 113 and 114 are respectively projected from the second sides 106b and 107b of the stages 106 and 107, but this is not restrictive. For example, as shown in FIG. 33, it is possible to arrange projecting elements 115 and 116, which are projected from side ends relative to the second side 106b of the stage 106, and to arrange projecting elements 117 and 118, which are projected from side ends relative to the second side 107b of the stage 107. Particularly, when two or more projecting elements (115-118) are arranged on side ends of the stages 106 and 107 in parallel, it is possible to prevent the stages 106 and 107 from being deflected when the stages 106 and 107 are inclined upon pressure applied thereto by a metal mold Em.

In the above, the projecting elements 113 are projected in the backsides 106c and 107c of the stages 106 and 107 relative to the second sides 106b and 107b, but this is not restrictive. Herein, it is required that the projecting elements 113 be projected from the stages 106 and 107 either in the backsides 106c and 107c or in the surfaces 106d and 107d. For example, it is possible to modify the second embodiment as shown in FIG. 35 in which projecting elements 119 and 120 are projected in the surfaces 106d and 107d of the stages 106 and 107 relative to the first sides 106a and 107a.

Figure 35:
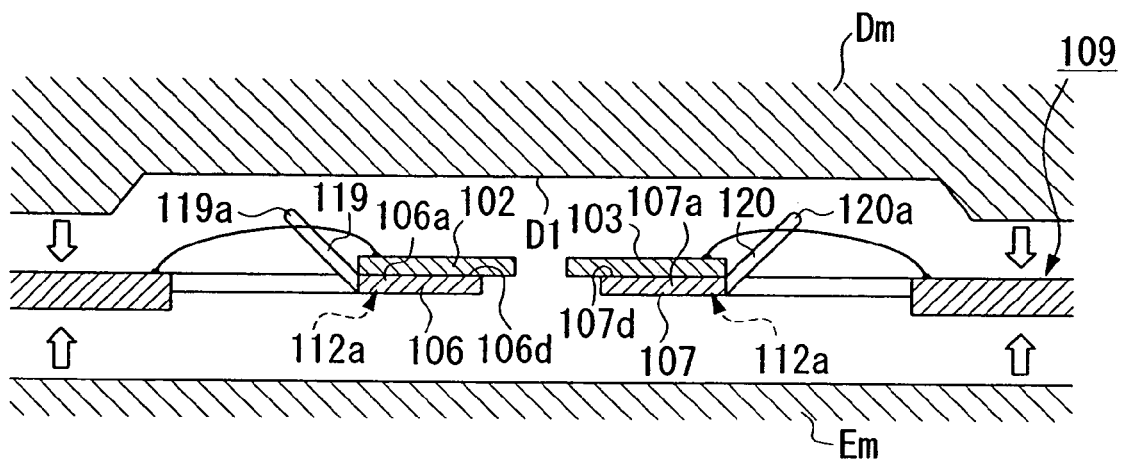
FIG. 35 is a longitudinal sectional view showing a lead frame having projecting elements in surfaces of stages relative to first sides, which is placed in a metal mold.

In FIG. 35, when the frame 109 is held between the upper mold Dm and the lower mold Em, tip ends 119a and 120a of the projecting elements 119 and 120 are pressed by an interior wall D1 of the upper mold Dm so that the stages 106 and 107 are respectively rotated about axial lines, which interconnect together ends 112a of the leads 112 on both sides of the stages 106 and 107, whereby ends 112a of the leads 112 are distorted and deformed.

A magnetic sensor that is manufactured as shown in FIG. 35 is characterized in that the tip ends 119a and 120a of the projecting elements 119 and 120 are not exposed below the lower surface of a molded resin because they do not come in contact with an interior wall E1 of the lower mold Em. This allows wiring to be arranged on the surface of a board (or a substrate) mounting a magnetic sensor arranged inside of a portable terminal device, which can be thus manufactured with ease.

Figure 36:
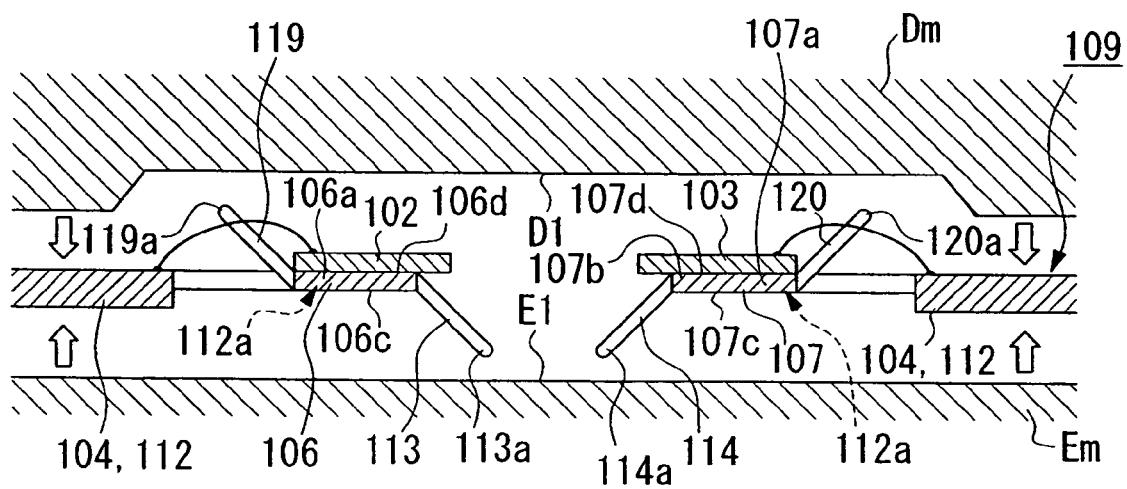
FIG. 36 is a longitudinal sectional view showing a lead frame having projecting elements in both surfaces and backsides of stages relative to first and second sides respectively, which is placed in a metal mold.

It is possible to modify the second embodiment as shown in FIG. 36 in which projecting elements 113 and 114 are projected in the backsides 106c and 107c of the stages 106 and 107 relative to the second sides 106b and 107b, and other projecting elements 119 and 120 are projected in the surfaces 106d and 107d of the stages 106 and 107 relative to the first sides 106a and 107a.

In the above, when the frame 109 is sandwiched between the upper mold Dm and the lower mold Em under pressure, tip ends 113a and 114a of the projecting elements 113 and 114 are pressed by the interior wall E1 of the lower mold Em while tip ends 119a and 120a of the projecting elements 119 and 120 are pressed by the interior wall D1 of the upper mold Dm. This increases the forces for rotating the stages 106 and 107. Therefore, it is possible to easily handle the lead frame 110 by employing strong structures for ends 112a of the leads 112 in the manufacture of the magnetic sensor 101.

In addition, both the projecting elements 113, 114, 119, and 120 can be formed by etching, wherein parts of the lead frame 110 other than the projecting elements 113, 114, 119, and 120 are made relatively thin by etching, for example.

Figure 37:
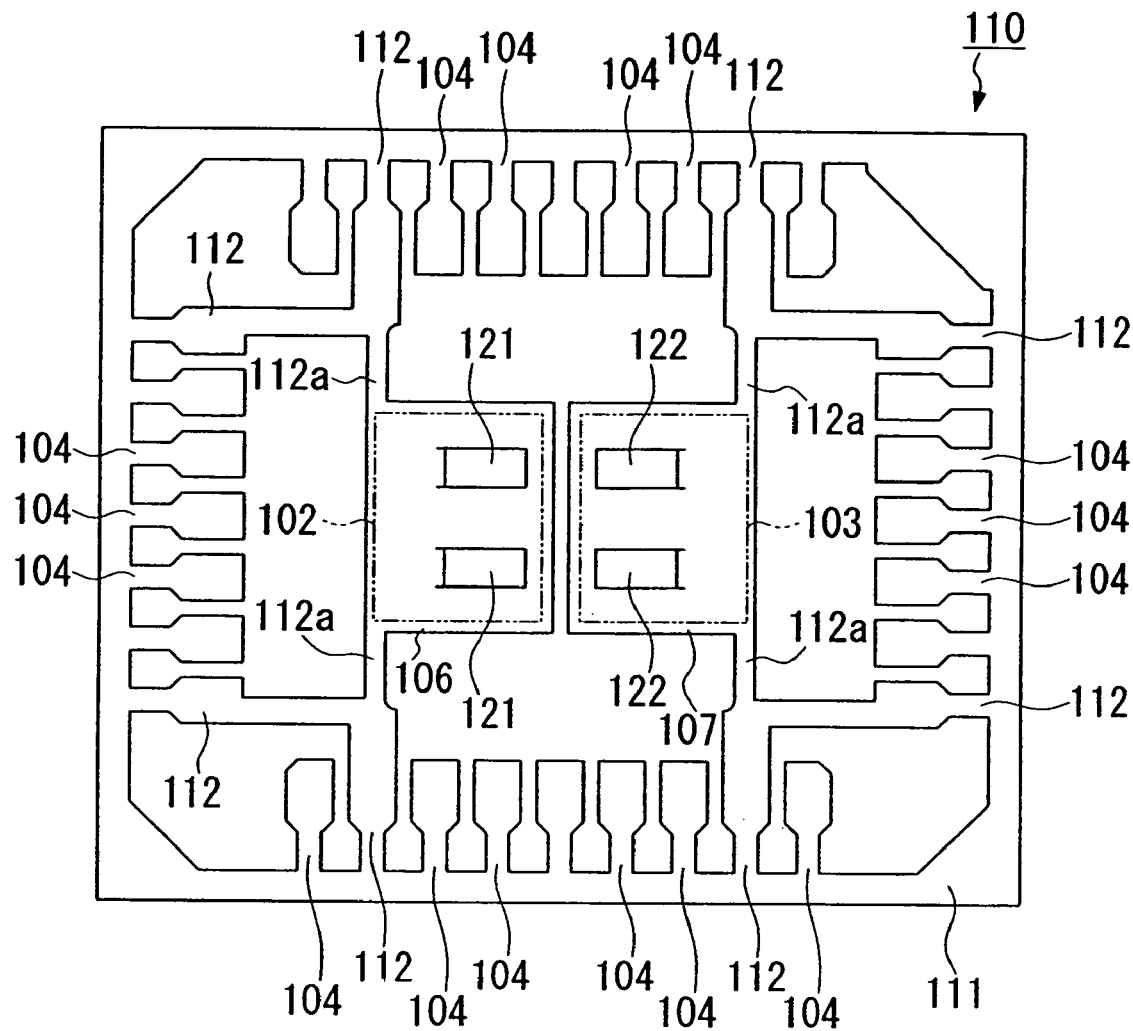
FIG. 37 is a plan view showing a lead frame for use in the manufacture of a magnetic sensor in accordance with a further modification of the second embodiment.
Figure 38:
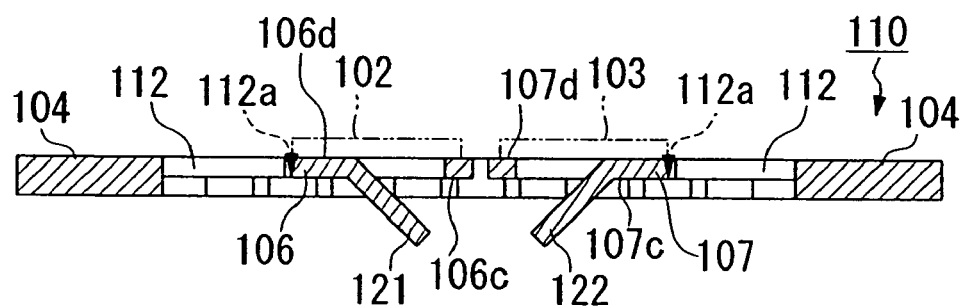
FIG. 38 is a longitudinal sectional view of the lead frame shown in FIG. 37.

The aforementioned projecting elements 113 and 114 are not necessarily projected from side ends of the first sides 106a and 107a or from side ends of the second sides 106b and 107b of the stages 106 and 107 respectively. That is, it is possible to modify the lead frame 110 as shown in FIGS. 37 and 38 in which cutting lines each having a rectangular U-shape are drawn in the stages 106 and 107, so that rectangular U-shaped areas encompassed by the cutting lines are subjected to bending working so as to form projecting elements 121 and 122 respectively.

In the above, when the magnetic sensor chips 102 and 103 are arranged on the surfaces 206d and 207d of the stages 206 and 207, it is required that the projecting elements 121 and 122 be projected in the backsides 106c and 107c of the stages 106 and 107 respectively. Herein, the projecting elements 121 and 122 are not projected externally from the stages 106 and 107; therefore, even when the magnetic sensor chips 102 and 103, and the stages 106 and 107 are increased in area, it is possible to reduce the overall size of the magnetic sensor.

Figure 39:
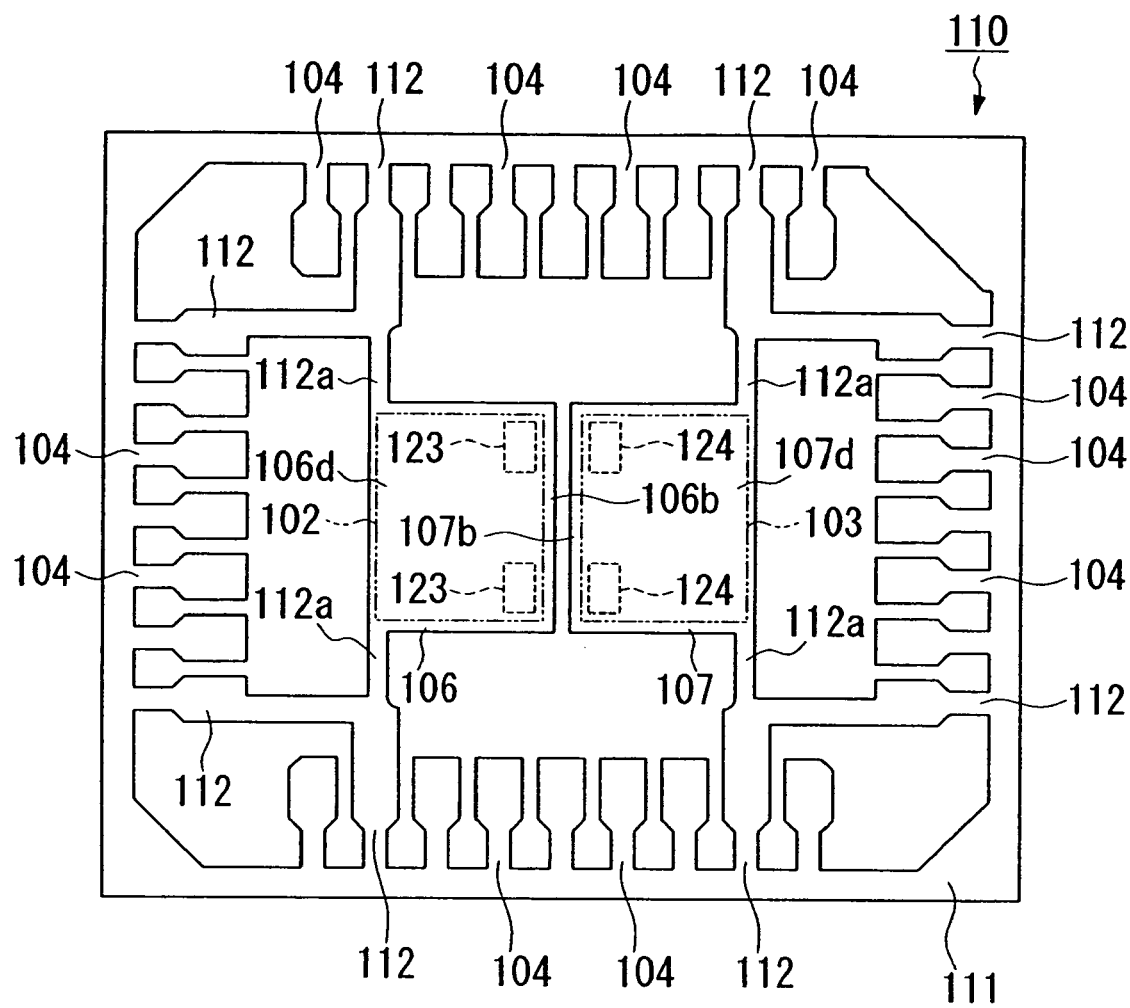
FIG. 39 is a plan view showing a lead frame for use in the manufacture of a magnetic sensor in accordance with a further modification of the second embodiment.
Figure 40:
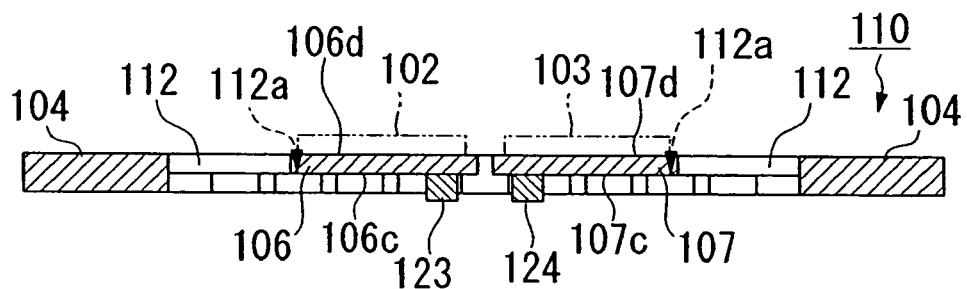
FIG. 40 is a longitudinal sectional view of the lead frame shown in FIG. 39.

In the second embodiment and its related examples, the projecting elements 113, 114, 119 to 122 are each integrally made of the thin metal plate constructing the lead frame 110, but this is not restrictive. For example, when the magnetic sensor chips 102 and 103 are mounted on the surface 106d and 107d of the stages 106 and 107 respectively, projecting elements that are formed independently of the thin metal plate of the lead frame 110 are attached to the backsides 106c and 107c of the stages 106 and 107. That is, as shown in FIGS. 39 and 40, it is possible to independently produce projecting elements 123 and 124, each having a roughly rectangular parallelepiped shape, which are made of the same material of the lead frame 110, whereby the projecting elements 123 and 124 are bonded onto the backsides 106c and 107c of the stages 106 and 107 respectively.

Each of the projecting elements 123 and 124 is not necessarily formed in a rectangular parallelepiped shape; therefore, it can be formed in a spherical shape or hemispherical shape. Alternatively, the projecting elements 123 and 124 bonded onto the backsides 106c and 107c of the stages 106 and 107 can have sharp-pointed tip ends.

In the above, the projecting elements 123 and 124 can be bonded onto the stages 106 and 107 by electric welding or by ultrasonic thermocompression bonding, for example. The ultrasonic thermocompression bonding is effected by frictional heat energy due to ultrasonic waves or upon heat energy and weight. Prior to the aforementioned bonding, it is preferable to remove surface oxide films from the stages and the like. Bonding effected between the projecting elements 123 and 124 and the stages 106 and 107 is not necessarily limited to the aforementioned methods. For example, it is possible to use adhesive tape, adhesive agent, and solder.

The projecting elements 123 and 124 are not necessarily bonded onto the backsides 106c and 107c of the stages 106 and 107. For example, the backsides 106c and 107c of the stages 106 and 107 are subjected to plating, by which the projecting elements 123 and 124 are formed. Alternatively, the backsides 106c and 107c of the stages 106 and 107 are subjected to etching, by which parts corresponding to the projecting elements 123 and 124 are formed.

Figure 41:
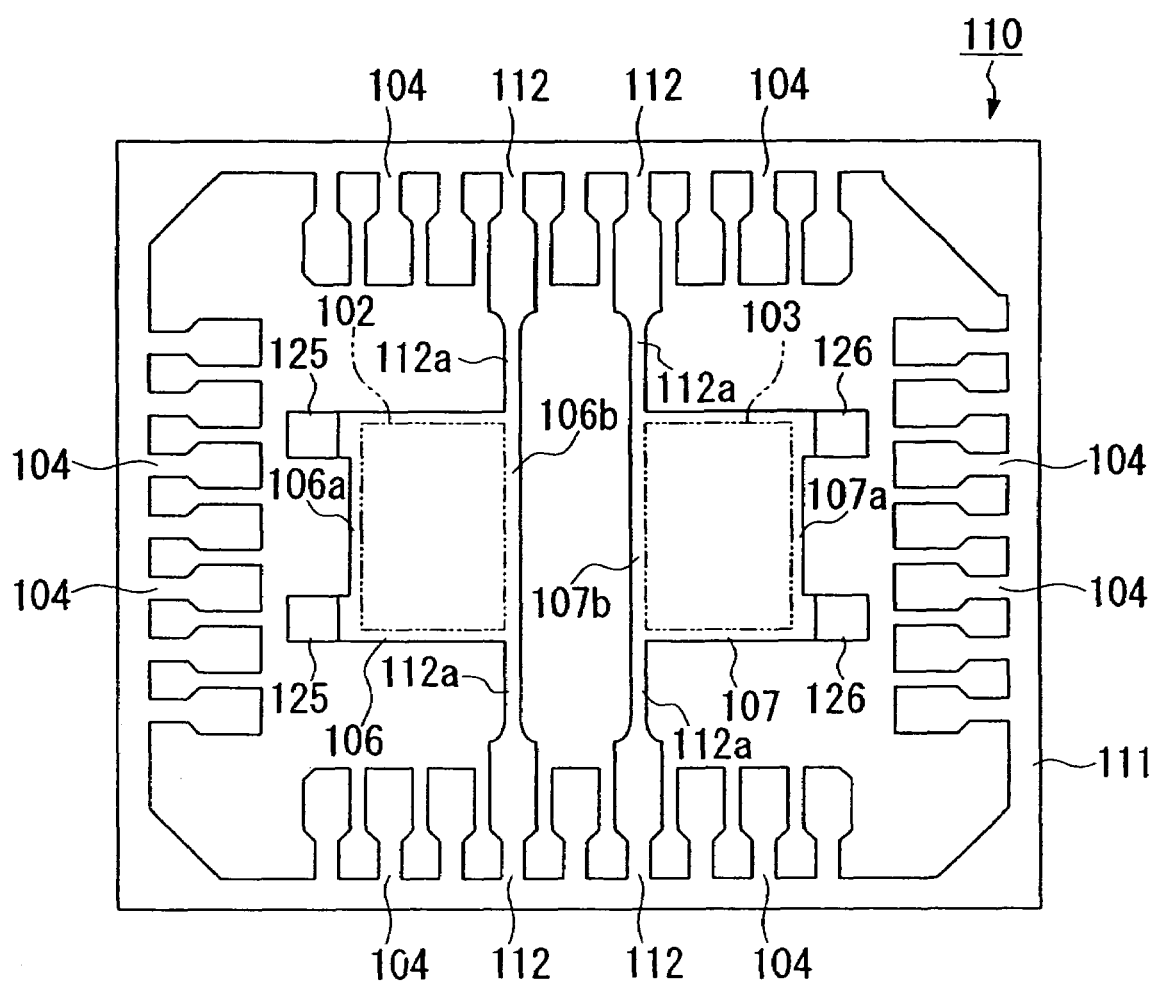
FIG. 41 is a plan view showing a lead frame for use in the manufacture of a magnetic sensor in accordance with a further modification of the second embodiment.

In the second embodiment, ends 112a of the leads 112 are connected with side ends of the first sides 106a and 107a of the stages 106 and 107, but this is not restrictive. Herein, it is required that ends 112a of the leads 112 be located at prescribed positions allowing the stages 106 and 107 to be inclined at prescribed angles. For example, as shown in FIG. 41, ends 112a of the leads 112 are connected with side ends of the second sides 106b and 107b of the stages 106 and 107, so that projecting elements 125 and 126 allowing the stages 106 and 107 to be inclined are formed in the first sides 106a and 107a of the stages 106 and 107. In this case, the second sides 106b and 107b act as centers of rotation of the stages 106 and 107.

In the second embodiment, ends 112a of the leads 112 have cutouts, but this is not restrictive. That is, it is required that they are distorted when the stages 106 and 107 are inclined. In addition, ends 112a of the leads 112 are distorted and deformed when the stages 106 and 107 are inclined, but this is not restrictive. That is, it is required that the leads 112 support the stages 106 and 107, which are subjected to plastic deformation and/or elastic deformation and are therefore inclined with ease.

In the second embodiment, the stages 106 and 107 are inclined upon rotation about axial lines connecting between ends 112a of the leads 112, but this is not restrictive. That is, it is required that the stages 106 and 107 be mutually inclined, thus securing the sensing direction of the magnetic sensor chip 103 to cross the A-B plane defined by two sensing directions of the magnetic sensor chip 102.

Figure 42:
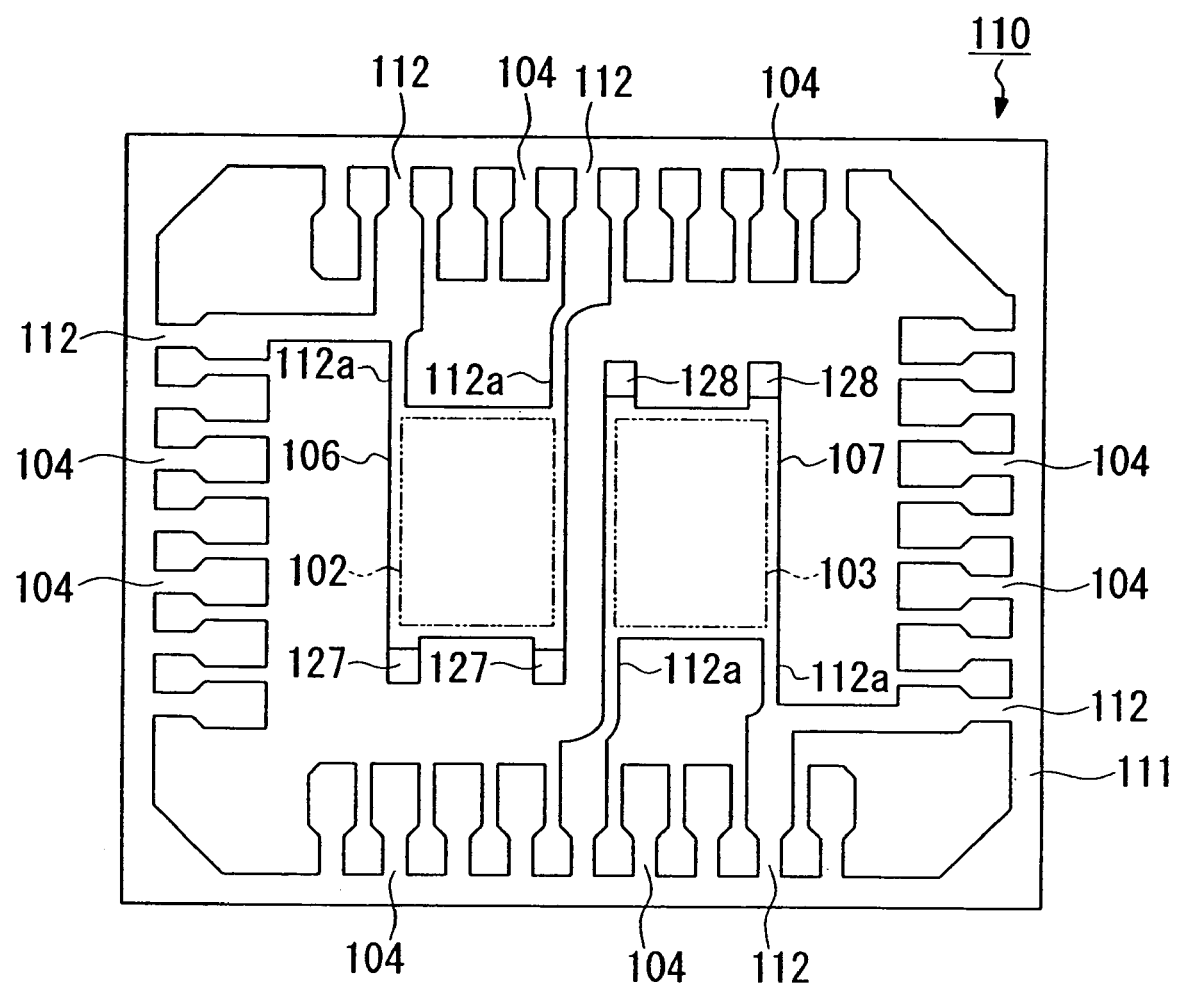
FIG. 42 is a plan view showing a lead frame for use in the manufacture of a magnetic sensor in accordance with a further modification of the second embodiment.

Therefore, it is possible to modify the lead frame 110 as shown in FIG. 42, in which ends 112a of the leads 112 are arranged on side ends of the stages 106 and 107 respectively, and projecting elements 127 and 128 are arranged on the other side ends of the stages 106 and 107 respectively. When pressing the projecting elements 127 and 128 by a metal mold (not shown), the stages 106 and 107 are inclined upon rotation about an axial line drawn in a direction for arranging the stages 106 and 107 in line, so that ends 112a of the leads 112 are bent and subjected to plastic deformation and/or elastic deformation.

In the second embodiment, the stages 106 and 107 are inclined due to the functions of the projecting elements 113, 114, 119, and 120, but this is not restrictive. That is, it is required that any projecting elements causing inclination of the stages 106 and 107 be projected in the surfaces 106d and 107d or in the backsides 106c and 107c of the stages 106 and 107 respectively.

Figure 43:
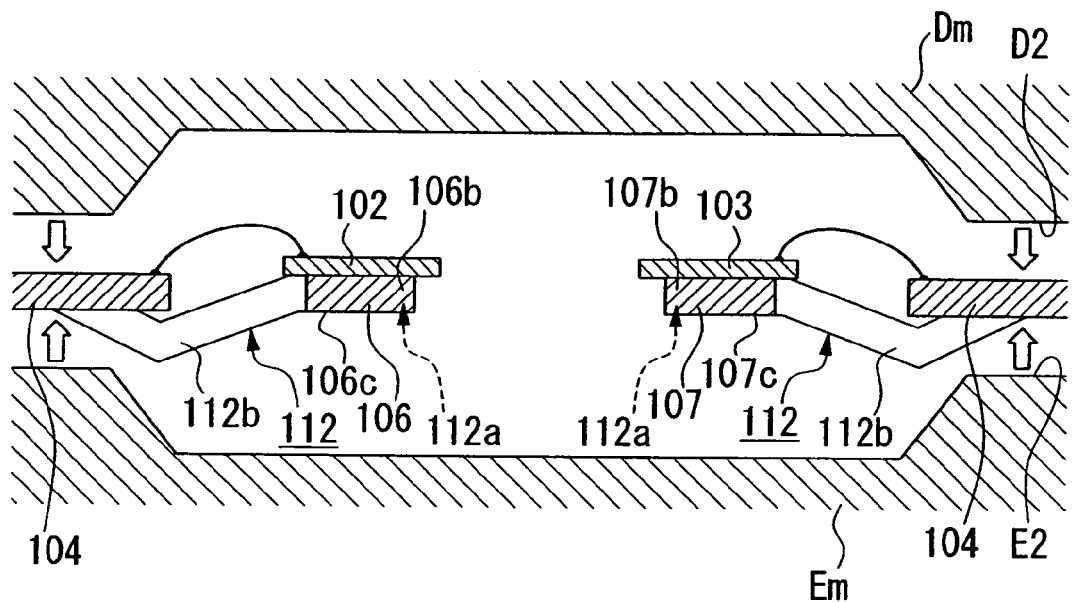
FIG. 43 is a longitudinal sectional view showing a lead frame having projecting elements in the backsides of stages, which is placed in a metal mold.
Figure 44:
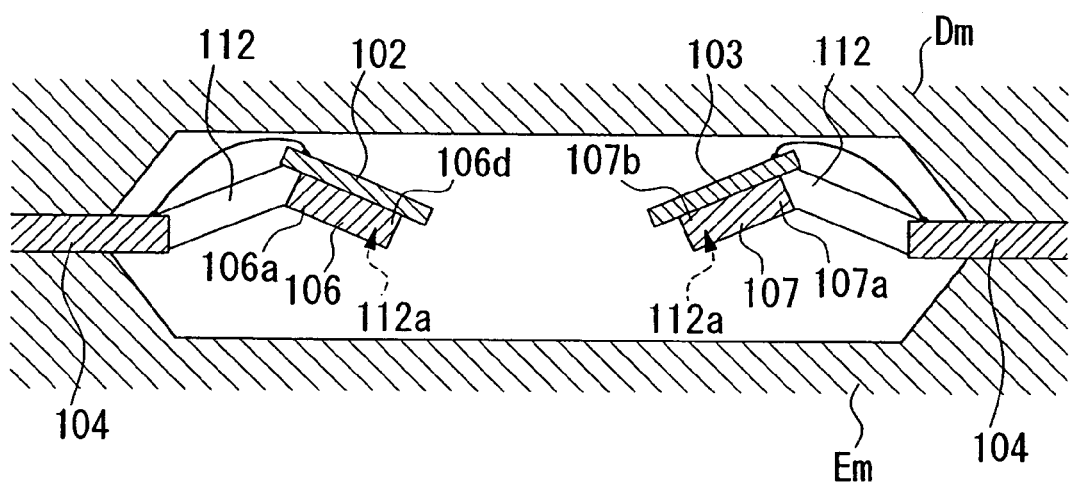
FIG. 44 is a longitudinal sectional view of the lead frame shown in FIG. 23, in which stages are inclined under pressure applied by the metal mold.

For example, as shown in FIG. 43, it is possible to form projecting elements 112b, which are projected in the backsides 106c and 107c of the stages 106 and 107, in the leads 112 for supporting the stages 106 and 107. The projecting elements 112b are partially held between interior walls D2 and E2 of an upper mold Dm and a lower mold Em together with the leads 104 as well as the other leads 112, wherein ends 112a, which are deformed in order to incline the stages 106 and 107, are formed in the other leads 112 other than the leads 112 having the projecting elements 112b and are interconnected with the second sides 106b and 107b of the stages 106 and 107 respectively.

In the above, when the projecting elements 112b are partially sandwiched between the molds Dm and Em, they are pressed upwards so that the first sides 106a and 107a of the stages 106 and 107 are rotated about the second sides 106b and 107b, and they are moved upwards as shown in FIG. 24.

3. Third Embodiment

A description will be given with respect to the configuration of a magnetic sensor that is manufactured by a manufacturing method according to a third embodiment of the invention with reference to FIGS. 45 and 46, wherein a magnetic sensor 201 is designed to measure the direction and magnitude of magnetism of an external magnetic field applied thereto. The magnetic sensor 201 comprises two magnetic sensor chips 202 and 203, a plurality of leads 204 for electrically connecting the magnetic sensor chips 202 and 203 with an external device (not shown), and a molded resin casing 205 for encapsulating the magnetic sensor chips 202 and 203 and the leads 204, which are integrally fixed at prescribed positions, in a resin.

Each of the magnetic sensor chips 202 and 203 is formed roughly in a rectangular plate-like shape in plan view, and they are respectively mounted on stages 206 and 207. The magnetic sensor chips 202 and 203 are both embedded in the molded resin casing 205, wherein they are arranged above bases 204a of the leads 204 in proximity to an upper surface 205c of the molded resin casing 205. In addition, the magnetic sensor chips 202 and 203 are respectively inclined at prescribed angles against a lower surface 205a of the molded resin casing 205, and ends 202b and 203b of the magnetic sensor chips 202 and 203 are directed towards the upper surface 205c of the molded resin casing 205; that is, the magnetic sensor chips 202 and 203 are mutually inclined to each other in such a way that an acute angle θ is formed between surfaces 202a and 203a thereof. Herein, the acute angle θ is formed between a surface 206a of the stage 206 and a backside 207b of the stage 207.

The magnetic sensor chip 202 is sensitive to components of magnetism with respect to an external magnetic field in two directions (namely, directions A and B), which cross at a right angle along the surface 202a thereof. The magnetic sensor chip 203 is sensitive to components of magnetism with respect to an external magnetic field in a single direction (namely, a direction C), which crosses at an acute angle to the A-B plane defined by the directions A and B.

Each of the leads 204 is made of a prescribed metal material such as copper, and it comprises a base 204a, a tip end 204b, and an interconnecting portion 204c for interconnecting between the base 204a and the tip end 204b, and it has a crank-like sectional shape, for example.

The bases 204a of the leads 204 are partially embedded in the molded resin casing 205 and are electrically connected with the magnetic sensor chips 202 and 203 via wires 208. Both the tip ends 204b and interconnecting portions 204c of the leads 204 are arranged outside of side surfaces 205b of the molded resin casing 205, and the tip ends 204b are arranged lower than the lower surface 205a of the molded resin casing 205.

Next, a description will be given with respect to a manufacturing method of the magnetic sensor 201 in accordance with the third embodiment of the invention.

Figure 47:
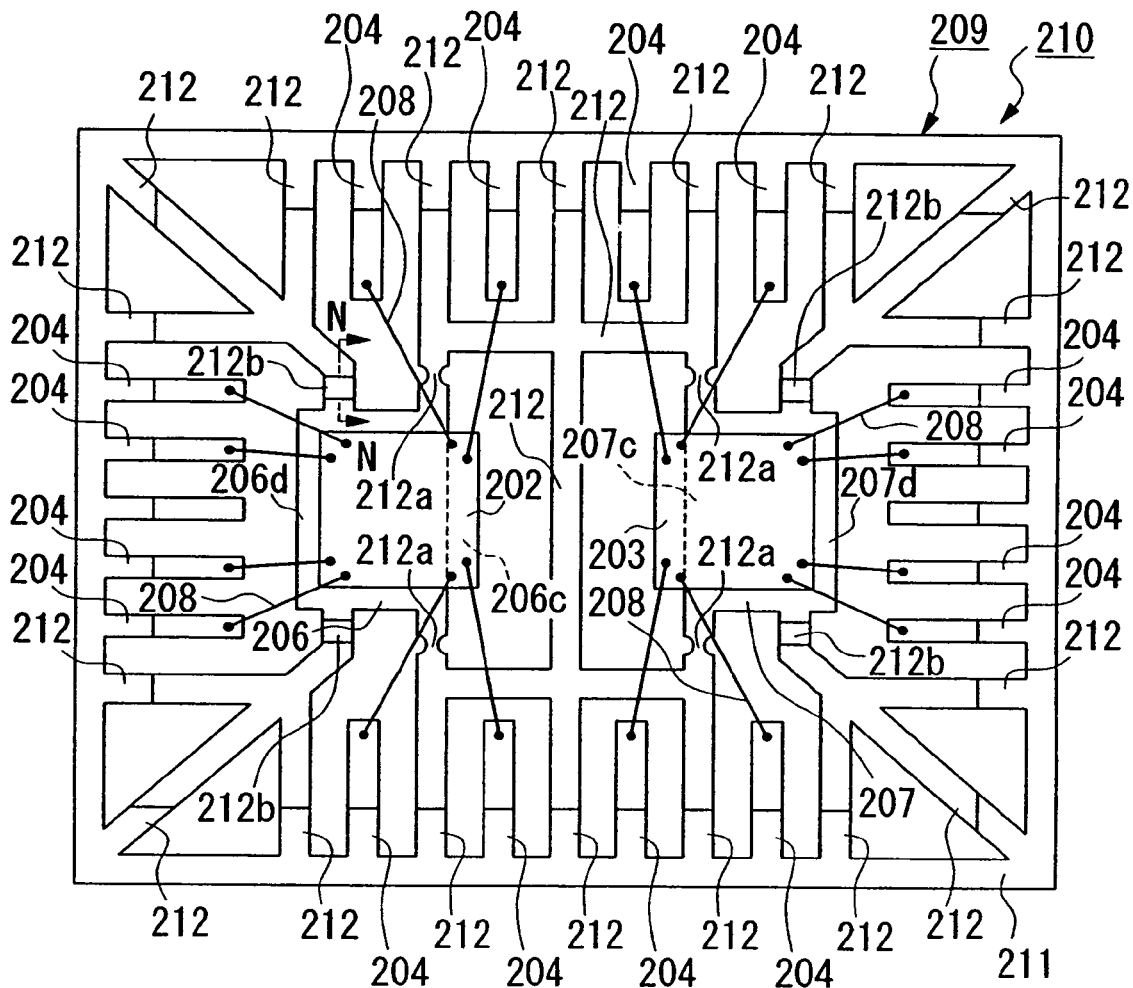
FIG. 47 is a plan view showing a lead frame for use in the manufacture of the magnetic sensor shown in FIG. 45.
Figure 48:
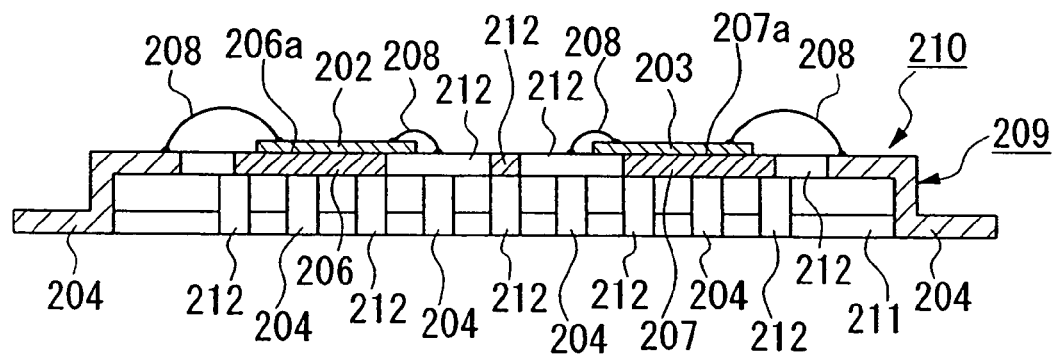
FIG. 48 is a longitudinal sectional view of the lead frame of FIG. 47 in which magnetic sensor chips are mounted on stages.

A thin metal plate is subjected to either press working or etching, or it is subjected to both press working and etching, thus producing a lead frame 210 including stages 206 and 207 supported by a frame 209 as shown in FIGS. 47 and 48. The frame 209 comprises a rectangular frame portion 211, which is formed in a rectangular shape in plan view for encompassing the stages 206 and 207, and a plurality of leads 204 and 212 that are projected inwardly from the rectangular frame portion 211.

The leads 212 are hanging leads for fixing the stages 206 and 207 at prescribed positions relative to the rectangular frame portion 211, wherein ends 212a and 212b are arranged in proximity to side ends of the stages 206 and 207. Ends 212a and 212b of the leads 212 have specific shapes allowing plastic deformation with ease when the stages 206 and 207 are inclined.

Figure 49:
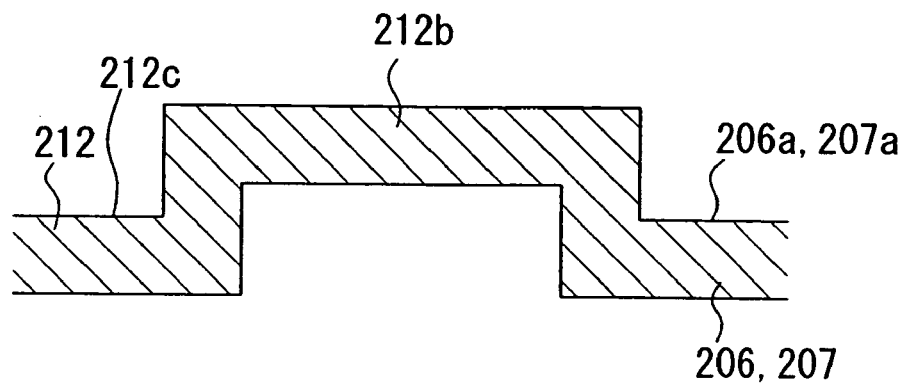
FIG. 49 diagrammatically shows a projected portion of a lead for supporting a stage.

Specifically, ends 212a of the leads 212 are arranged in proximity to first sides 206c and 207c of the stages 206 and 207, and cutouts are formed at both sides of ends 212a, which are thus reduced in width compared with other portions of the leads 212 and which can be easily distorted. The other ends 212b of the leads 212 are arranged in proximity to second sides 206d and 207d of the stages 206 and 207, whereby as shown in FIG. 49, they are subjected to bending working in advance so that they are projected higher above surfaces 212c of the leads 212 and can be therefore easily bent.

In the above, the stages 206 and 207 are arranged adjacent to each other with the first sides 206c and 207c thereof, while the second ends 206d and 207d are arranged opposite the first ends 206c and 207c in the stages 206 and 207.

After preparation of the lead frame 210, as shown in FIGS. 47 and 48, magnetic sensor chips 202 and 203 are respectively bonded onto surfaces 206a and 207a of the stages 206 and 207, which are then electrically connected with the leads 204 via wires 208. In the step for inclining the stages 206 and 207, bonding portions between the wires 208 and the magnetic sensor chips 202 and 203 must be separated from bonding portions between the wires 208 and the leads 204; therefore, the wires 208 are arranged so as to have sufficient room in length or height thereof.

Figure 50:
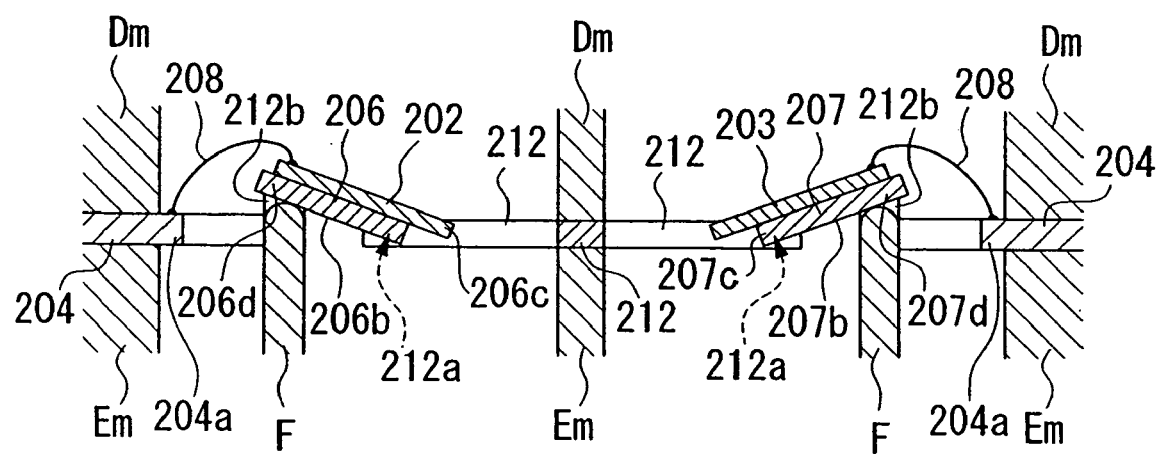
FIG. 50 is a longitudinal sectional view showing essential parts of the lead frame of FIG. 47 held by metal molds, in which stages are inclined together with magnetic sensor chips.

As shown in FIG. 50, the lead frame 210 is held between upper molds Dm and lower molds Em, except for the stages 206 and 207, and ends 212a and 212b of the leads 212. Then, pins F are used to press up backsides 206b and 207b of the stages 206 and 207 relative to the second sides 206d and 207d, so that the stages 206 and 207 are inclined at prescribed angles together with the magnetic sensor chips 202 and 203.

In the above, the stages 206 and 207 are respectively rotated about axial lines (see dotted lines shown in FIG. 47) connecting between ends 212a of the leads 212, which are fixed to both side ends of the stages 206 and 207, so that ends 212a are distorted upon plastic deformation, while the other ends 212b are bent upon plastic deformation. For this reason, it is possible to maintain the magnetic sensor chips 202 and 203 at inclined conditions against the bases 204a of the leads 204.

The aforementioned lead frame 210 equipped with the magnetic sensor chips 202 and 203 are placed in another metal mold (not shown), into which a melted resin is injected so as to form a molded resin for encapsulating the magnetic sensor chips 202 and 203 therein. Thus, it is possible to fixedly arrange the magnetic sensor chips 202 and 203 mutually inclined to each other inside of a molded resin.

Figure 45:
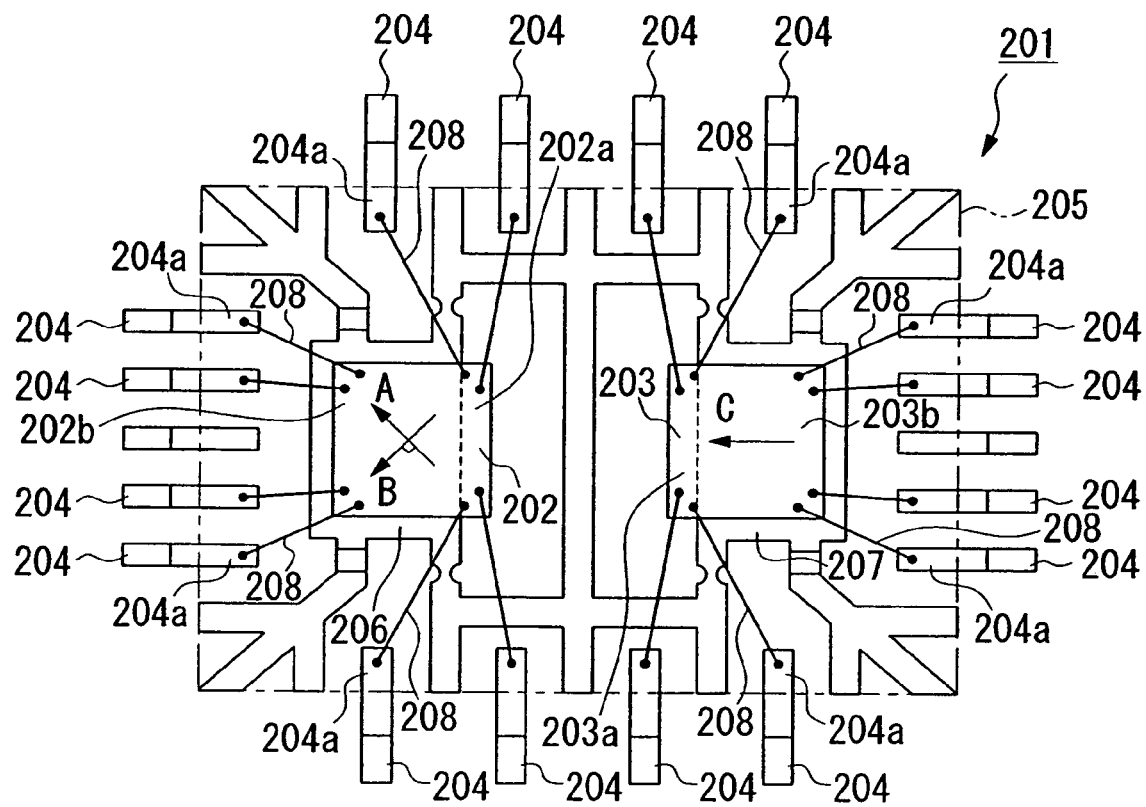
FIG. 45 is a plan view showing a magnetic sensor that is manufactured in a manufacturing method according to a third embodiment of the invention.

Lastly, the rectangular frame portion 211 is cut together with unwanted portions of the leads 212 that are projected outside of the molded resin, thus completing the manufacture of the magnetic sensor 201 shown in FIG. 45.

The aforementioned magnetic sensor 201 is mounted on a board (or a substrate) arranged inside of a portable terminal device (not shown), in which bearings of magnetism measured by the magnetic sensor 201 are displayed on a display screen.

That is, similar to the foregoing first embodiment, the magnetic sensor chips 202 and 203 detect components of magnetism in directions A, B, and C so as to produce values Sa, Sb, and Sc approximately in proportion to the detected components of magnetism. Details have already been described with reference to FIG. 9.

The third embodiment can be modified in a variety of ways; therefore, examples of modifications will be described below.

Figure 46:
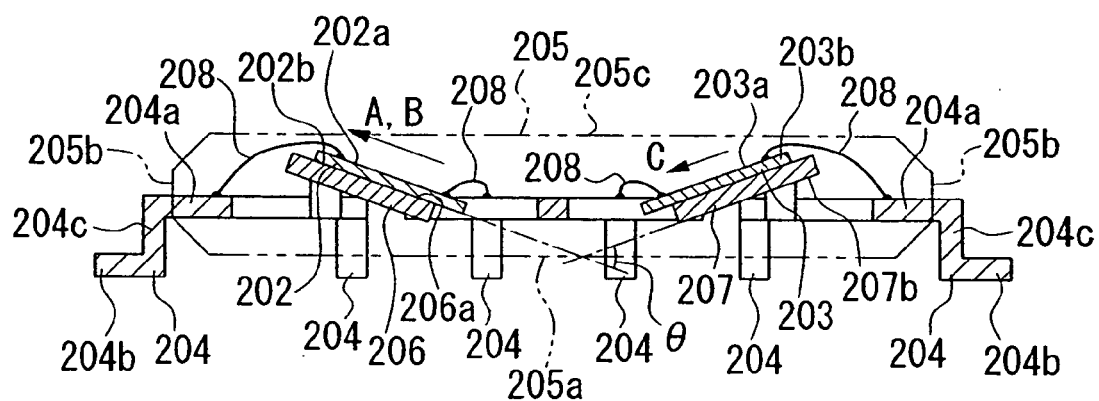
FIG. 46 is a longitudinal sectional view showing essential parts of the magnetic sensor shown in FIG. 45.

A modified example of the third embodiment will be described with reference to FIGS. 51 and 52, in which parts identical to those shown in FIGS. 45 and 46 are designated by the same reference numerals; hence, the detailed description thereof will be omitted as necessary.

Figure 51:
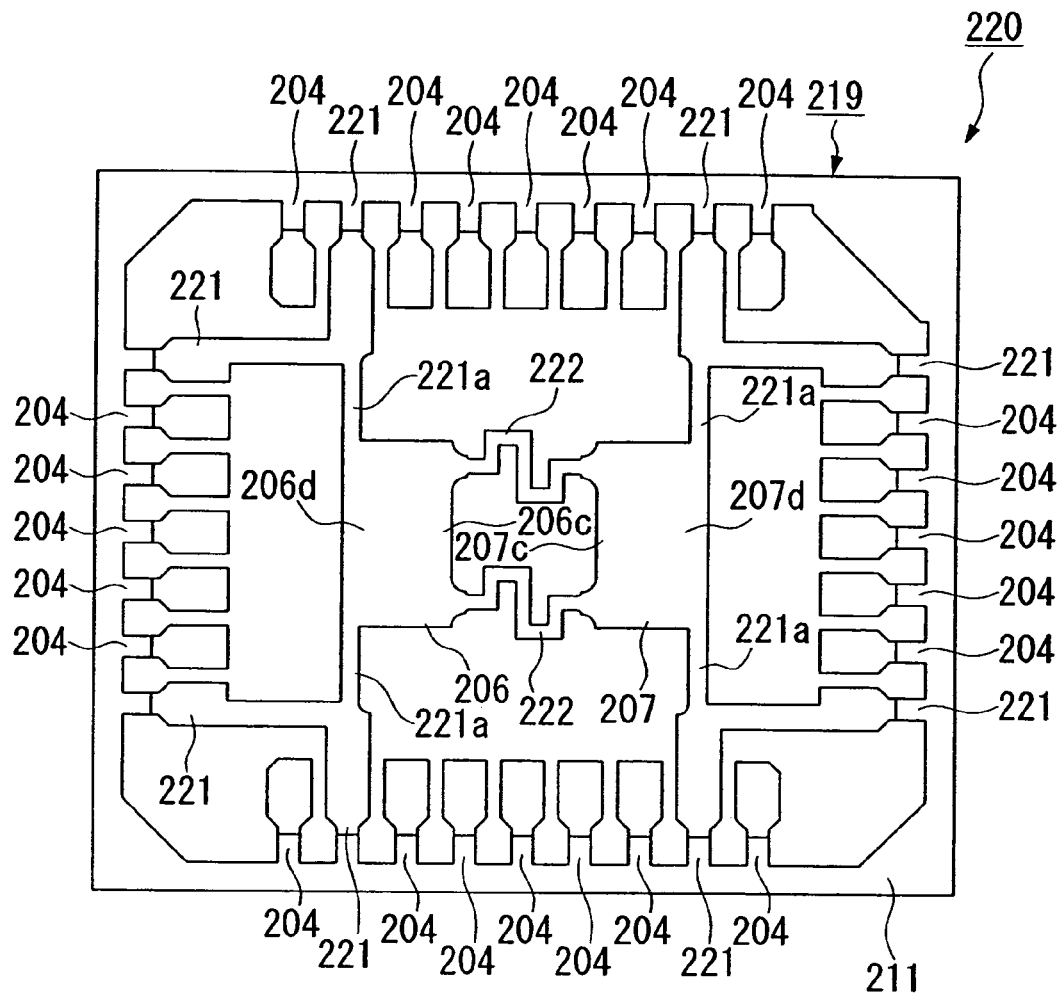
FIG. 51 is a plan view showing a lead frame for use in the manufacture of a magnetic sensor in accordance with a modification of the third embodiment.

Prior to the manufacture of a magnetic sensor, a thin metal plate is subjected to press working and etching, thus producing a lead frame 220 including two stages 206 and 207 supported by a frame 219 as shown in FIG. 51. The frame 219 has a plurality of leads 204 and 221 that are projected inwardly from a rectangular frame portion 211.

The leads 221 are hanging leads for fixing the stages 206 and 207 at prescribed positions relative to the rectangular frame portion 211, and ends 221a are fixed to both side ends of second sides 206d and 207d of the stages 206 and 207 respectively. Ends 221a of the leads 221 are formed thinner than other portions of the leads 221, so that they can be easily distorted.

A pair of stage interconnecting members 222 for interconnecting between the stages 206 and 207 are projected from a first side 206c of the stage 206 and are interconnected to a first side 207c of the stage 207. Each of the stage interconnecting members 222 is formed in a zigzag shape lying in a plane perpendicular to the thickness direction of the lead frame 220, so that they can be subjected to plastic deformation with ease.

Figure 52:
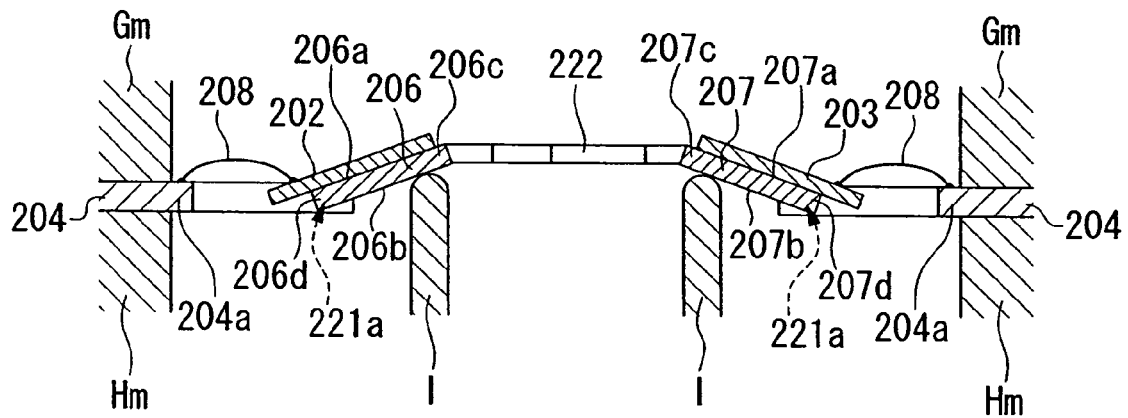
FIG. 52 is a longitudinal sectional view of the lead frame shown in FIG. 51, which is held between metal molds.

After preparation of the lead frame 220, as shown in FIG. 52, magnetic sensor chips 202 and 203 are bonded onto surfaces 206a and 207a of the stages 206 and 207; then, wires 208 are arranged between the magnetic sensor chips 202 and 203 and the leads 204.

Then, the lead frame 220 is held between upper molds Gm and lower molds Hm, except for the stages 206 and 207, ends 221a of the leads 221, and the stage interconnecting members 222. In this condition, pins I are used to press up backsides 206d and 207d of the stages 206 and 207 relative to the first sides 206c and 207c respectively, so that the stages 206 and 207 are inclined at prescribed angles together with the magnetic sensor chips 202 and 203.

In the above, the stages 206 and 207 are rotated about axial lines connecting between pairs of ends 221a of the leads 221, which are respectively fixed to both side ends of the stages 206 and 207, so that ends 221a of the leads 221 are distorted upon plastic deformation. At this time, the first sides 206c and 207c of the stages 206 and 207 are mutually separated from each other, so that the stage interconnecting members 222 are expanded upon plastic deformation. Thus, it is possible to maintain the magnetic sensor chips 202 and 203 in inclined states relative to the bases 204a of the leads 204.

Lastly, a molded resin is formed so as to encapsulate the magnetic sensor chips 202 and 203 therein; then, the rectangular frame portion 211 and unwanted portions of the leads 221 that are projected outside of the molded resin are cut, thus completing the manufacture of the magnetic sensor.

In the above, it is possible to simultaneously bond the magnetic sensor chips 202 and 203 onto the stages 206 and 207 of the lead frame 220 with ease; therefore, it is possible to reduce the number of steps in the manufacture, and it is possible to reduce the manufacturing cost of the magnetic sensor.

Since the stage interconnecting members 222 are shaped so as to allow plastic deformation thereof with ease, when the pins I press up the backsides 206b and 207b of the stages 206 and 207 relative to the first sides 206c and 207c, the stages 206 and 207 are subjected to plastic deformation so that they can be inclined against the frame 219 with ease. Since ends 221a of the leads 221 and the stage interconnecting members 222 are subjected to plastic deformation, it is possible to accurately set a prescribed angle formed between the surfaces 202a and 203a of the stages 202 and 203 with ease.

In addition, each of the stage interconnecting members 222 is formed in a zigzag shape lying in a plane perpendicular to the thickness direction of the lead frame 220. Therefore, it is possible to produce the lead frame 220 with ease because it is unnecessary to perform bending working and etching on the stage interconnecting members 222.

Figure 53A:
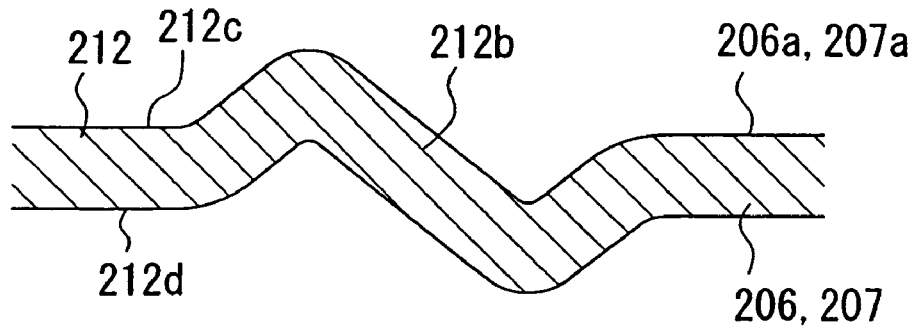
FIG. 53A diagrammatically shows a modification of a lead that is partially bent.

In the third embodiment, ends 212b of the leads 212 are projected from the surfaces 212c, but this is not restrictive. That is, it is required that the leads 212 can be subjected to plastic deformation with ease when the stages 206 and 207 are inclined. For example, as shown in FIG. 53A, the leads 212 are subjected to bending working so that one end 212b is projected in both of the surface 212c and the backside 212d.

Figure 53B:
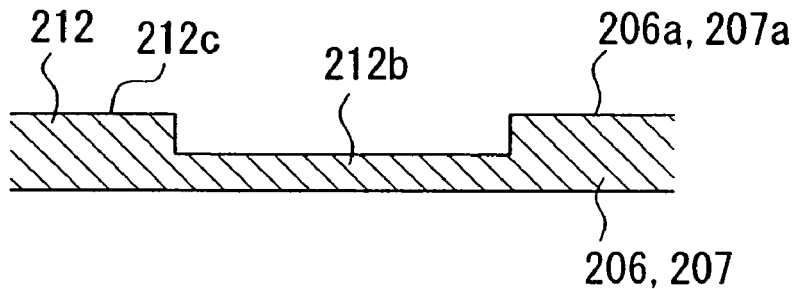
FIG. 53B diagrammatically shows another modification of a lead that is partially reduced in thickness.

Alternatively, as shown in FIG. 53B, the leads 212 are subjected to etching so that end 212b is reduced in thickness compared with other portions of the lead 212.

Figure 53C:
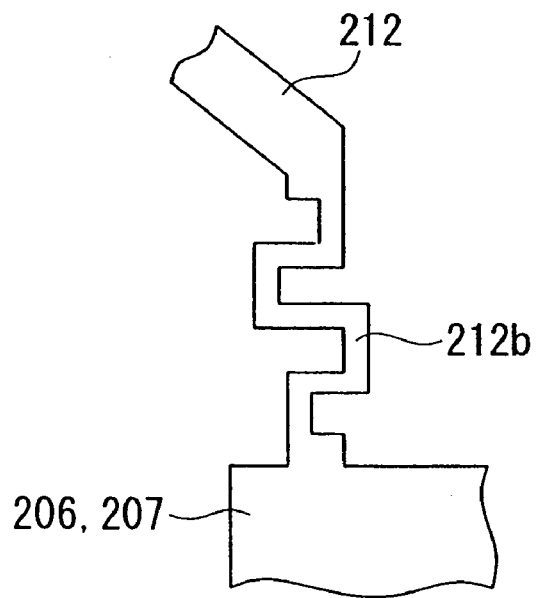
FIG. 53C diagrammatically shows a further modification of a lead that is partially formed in a zigzag shape.

It is possible to further modify the leads 212 such that, as shown in FIG. 53C, a prescribed portion of the leads 212 is formed in a zigzag shape lying in a plane perpendicular to the thickness direction of the lead frame 210. In such a modification, it is unnecessary to perform bending working or etching on the leads 212; therefore, it is possible to produce the lead frame 210 having a zigzag portion 212b with ease. Herein, it is preferable that the zigzag portion 212b is reduced in thickness compared with other portions of the lead 212.

Figure 54:
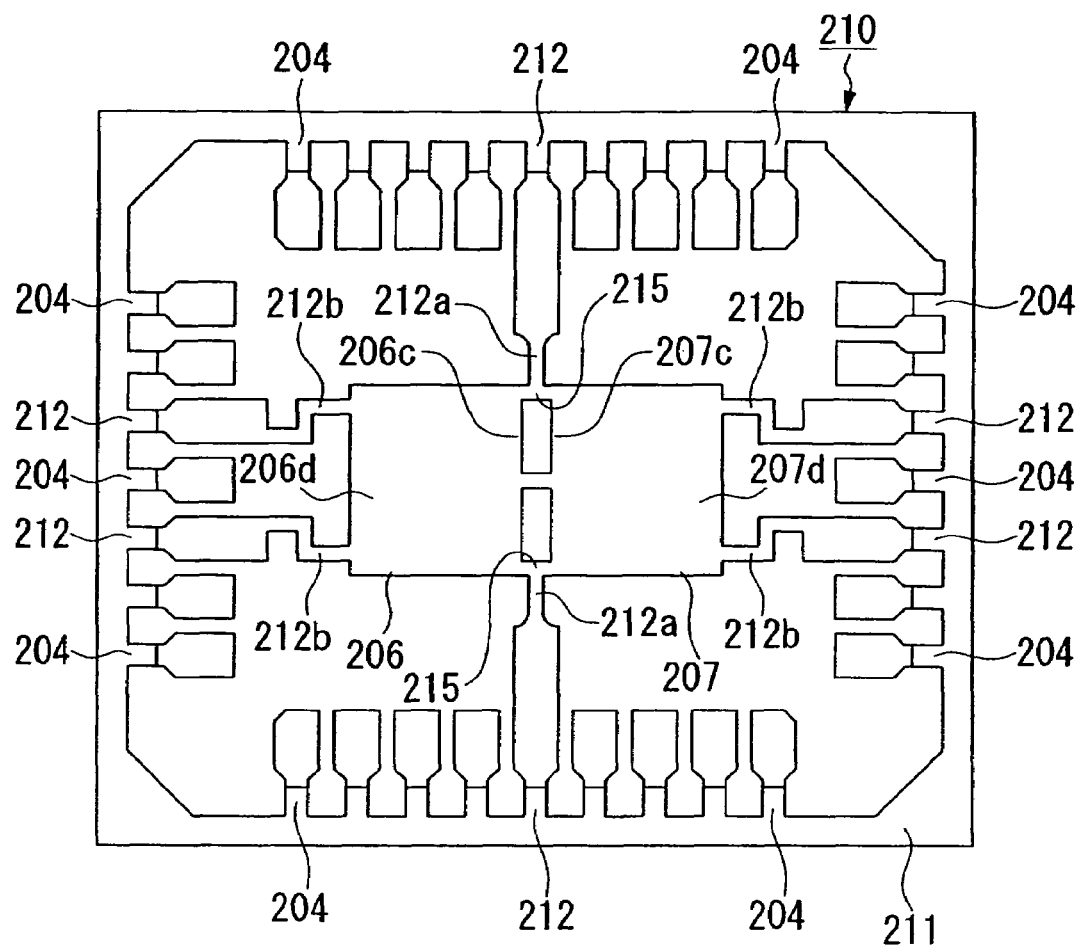
FIG. 54 is a plan view showing a lead frame for use in the manufacture of a magnetic sensor in accordance with another modification of the third embodiment.

In the third embodiment, ends 212a of the leads 212 are fixed to both side ends of the stages 206 and 207 relative to the first sides 206c and 207c, but this is not restrictive. That is, it is required that the stages 206 and 207 can be rotated about the first sides 206c and 207c thereof. For example, as shown in FIG. 54, the first sides 206c and 207c of the stages 206 and 207 are interconnected together via stage interconnecting members 215, to which ends 212a of the leads 212 are fixed.

In addition, the other ends 212b of the leads 212 are not necessarily fixed to both side ends of the stages 206 and 207 relative to the second sides 206d and 207d. That is, they can be directly fixed to the second sides 206d and 207d of the stages 206 and 207, for example.

In the third embodiment, the magnetic sensor chips 202 and 203 are respectively inclined at prescribed angles such that one ends 202b and 203b thereof are directed towards the upper surface 205c of the molded resin casing 205, but this is not restrictive. That is, the magnetic sensor chips 202 and 203 are mutually inclined to each other against the frame 209 such that the sensing direction of the magnetic sensor chip 203 crosses the A-B plane defined by the sensing directions of the magnetic sensor chip 202.

When the magnetic sensor chips 202 and 203 are changed in the inclination directions thereof, ends 212a and 212b of the leads 212 should be correspondingly changed in positions in the lead frame 210.

Figure 55:
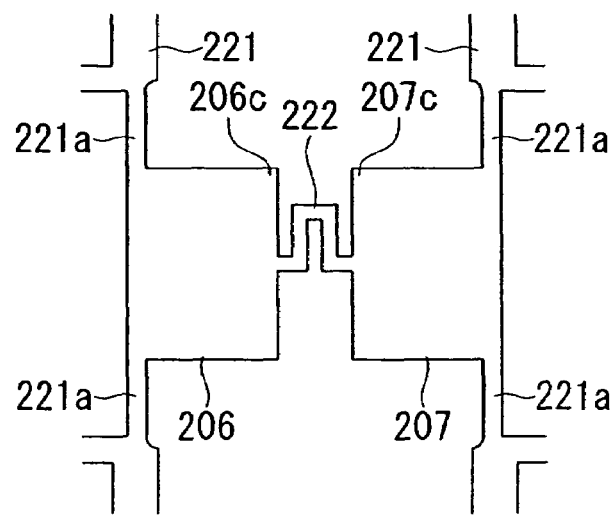
FIG. 55 is an enlarged plan view showing essential parts of a lead frame for use in the manufacture of a magnetic sensor in accordance with a further modification of the third embodiment.

Cutouts are not necessarily formed in ends 212a of the leads 212. That is, they should be shaped to allow plastic deformation with ease when the stages 206 and 207 are inclined. In addition, bent portions of the leads 212 are not necessarily formed as ends 212b of the leads 212 at prescribed positions proximate to the stages 206 and 207 respectively. For example, as shown in FIG. 55, a single stage interconnecting member 222 can be formed so as to interconnect together the stages 206 and 207. The stage interconnecting member 222 is not necessarily formed in a zigzag shape lying in the plane perpendicular to the thickness direction of the lead frame 220. That is, it should be shaped to allow plastic deformation with ease.

Figures 56A, 56B:
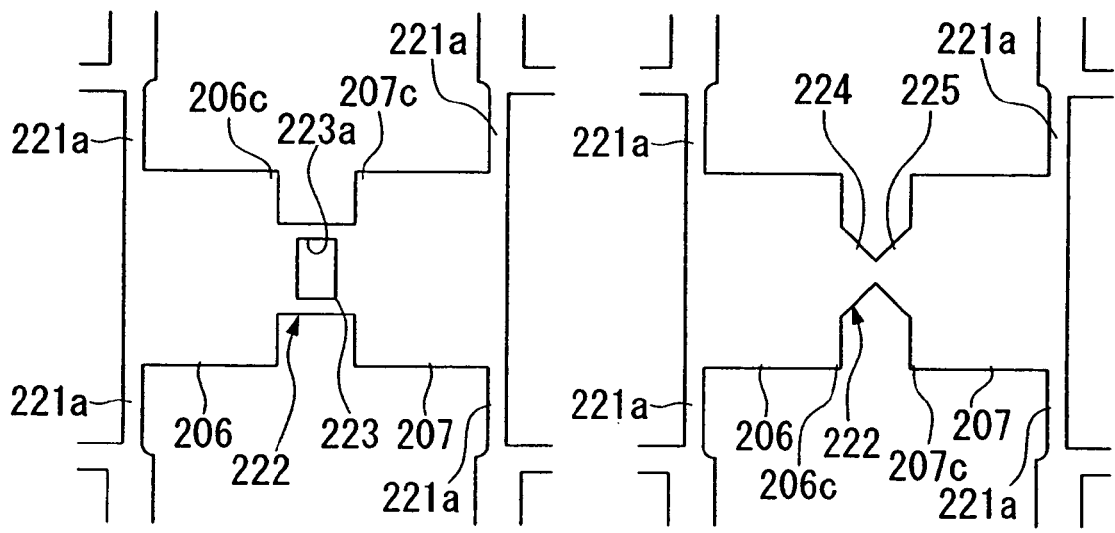
FIG. 56A is an enlarged plan view showing essential parts of a lead frame for use in the manufacture of a magnetic sensor in accordance with a further modification of the third embodiment.
FIG. 56B is an enlarged plan view showing essential parts of a lead frame for use in the manufacture of a magnetic sensor in accordance with a further modification of the third embodiment.

For example, as shown in FIG. 56A, both the stages 206 and 207 are integrally formed on a plate 223 roughly having a rectangular shape, in which a through hole 223a is formed to partition between the stages 206 and 207, which are thus bridged via interconnecting members 222. It is possible to further modify the lead frame as shown in FIG. 56B such that tapered projections 224 and 225 are respectively projected from the first sides 206c and 207c of the stages 206 and 207, wherein they are gradually reduced in dimensions towards the tip ends, which are mutually interconnected together.

Incidentally, it is possible to reduce the stage interconnecting members 222 in thickness compared with the stages 206 and 207.

Figure 57:
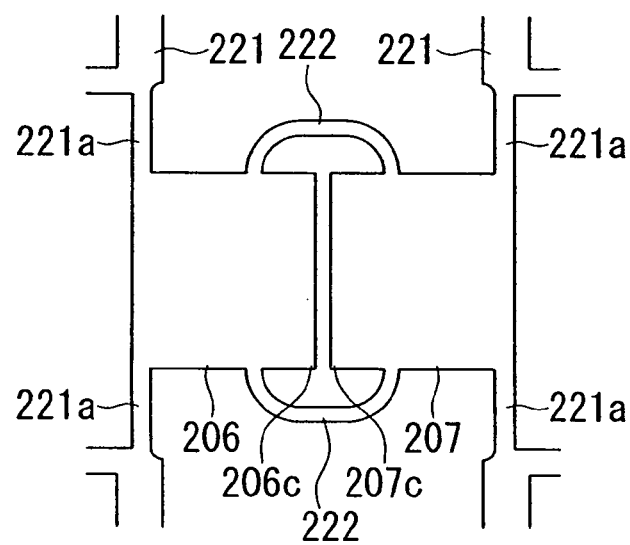
FIG. 57 is an enlarged plan view showing essential parts of a lead frame for use in the manufacture of a magnetic sensor in accordance with a further modification of the third embodiment.

The stage interconnecting members 222 are not necessarily arranged so as to mutually interconnect together the first sides 206c and 207c of the stages 206 and 207. For example, as shown in FIG. 57, interconnecting members 222 are arranged so as to interconnect together both side ends of the stages 206 and 207 relative to the first sides 206c and 207c respectively. Herein, each of the interconnecting members 222 is formed in a fan-like shape, which allows plastic deformation with ease. In FIG. 57, no interconnecting member is arranged in the gap between the stages 206 and 207 that are arranged adjacent to each other; therefore, it is possible to reduce the gap therebetween. In other words, it is possible to reduce the overall size of the magnetic sensor by using the aforementioned lead frame.

Figure 58:
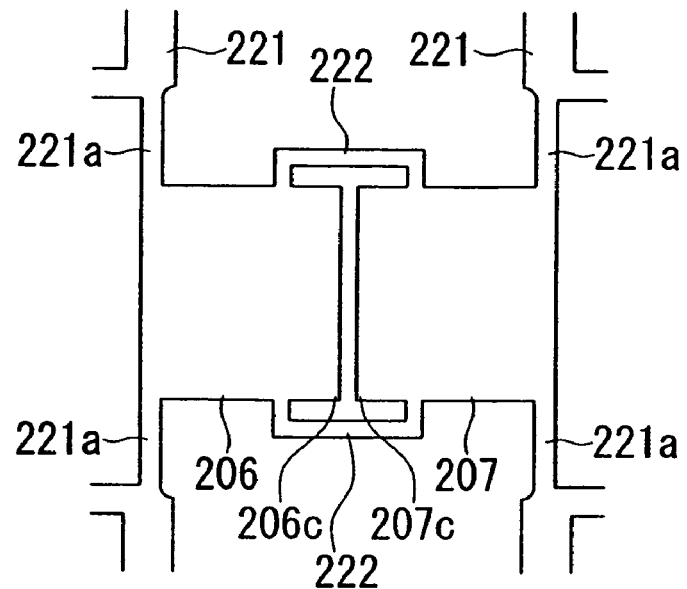
FIG. 58 is an enlarged plan view showing essential parts of a lead frame for use in the manufacture of a magnetic sensor in accordance with a further modification of the third embodiment.
Figure 59:
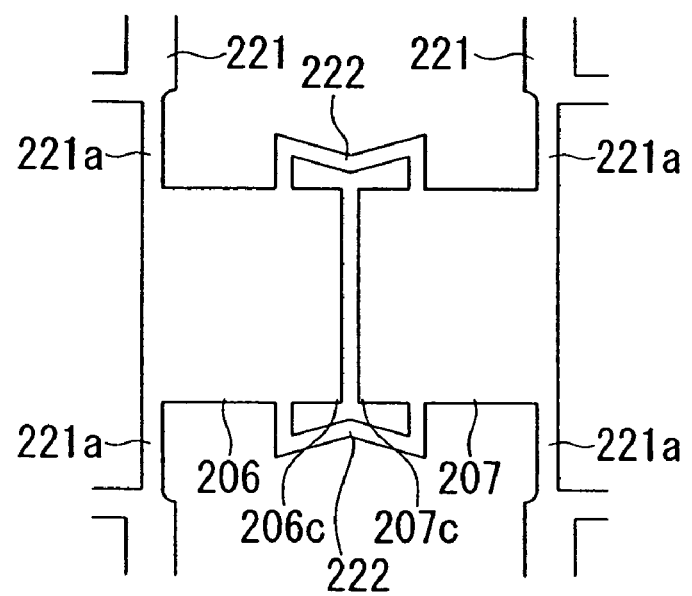
FIG. 59 is an enlarged plan view showing essential parts of a lead frame for use in the manufacture of a magnetic sensor in accordance with a further modification of the third embodiment.
Figure 60:
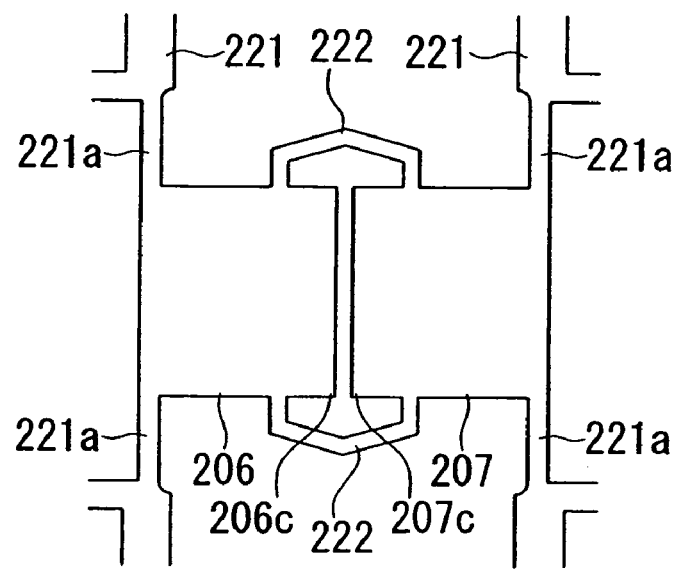
FIG. 60 is an enlarged plan view showing essential parts of a lead frame for use in the manufacture of a magnetic sensor in accordance with a further modification of the third embodiment.

The stage interconnecting members 222 that are fixed to side ends of the stages 206 and 207 are not necessarily formed in the aforementioned shapes. For example, as shown in FIG. 58, each of the stage interconnecting members 222 can be formed in a rectangular frame-like shape. Alternatively, it is possible to modify the stage interconnecting members 222 so as to be partially bent inwardly or outwardly as shown in FIGS. 59 and 60.

Figure 61:
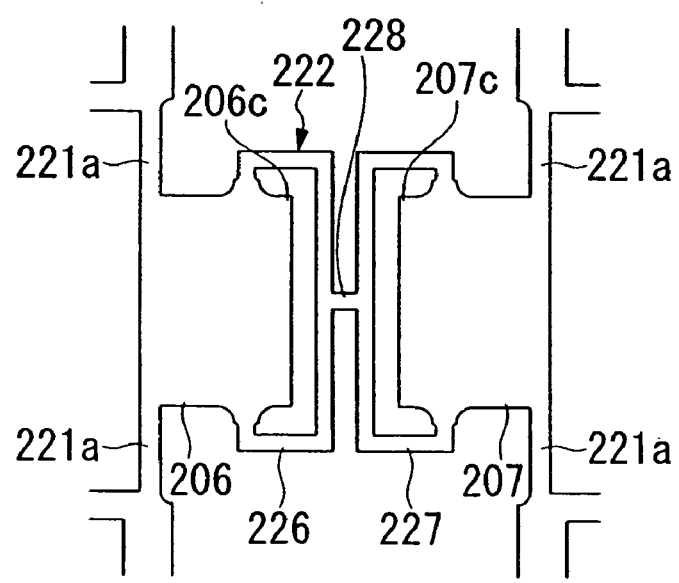
FIG. 61 is an enlarged plan view showing essential parts of a lead frame for use in the manufacture of a magnetic sensor in accordance with a further modification of the third embodiment.

In addition, the stage interconnecting members 222 are not necessarily arranged so as to directly interconnect together the stages 206 and 207. For example, as shown in FIG. 61, a rectangular frame portion 226 is arranged so as to interconnect between both side ends of the stage 206 and to encompass the first end 206c, while another rectangular frame portion 227 is arranged to interconnect between both side ends of the stage 207 and to encompass the first end 207c, and they are interconnected together via an interconnecting member 228.

Figure 62:
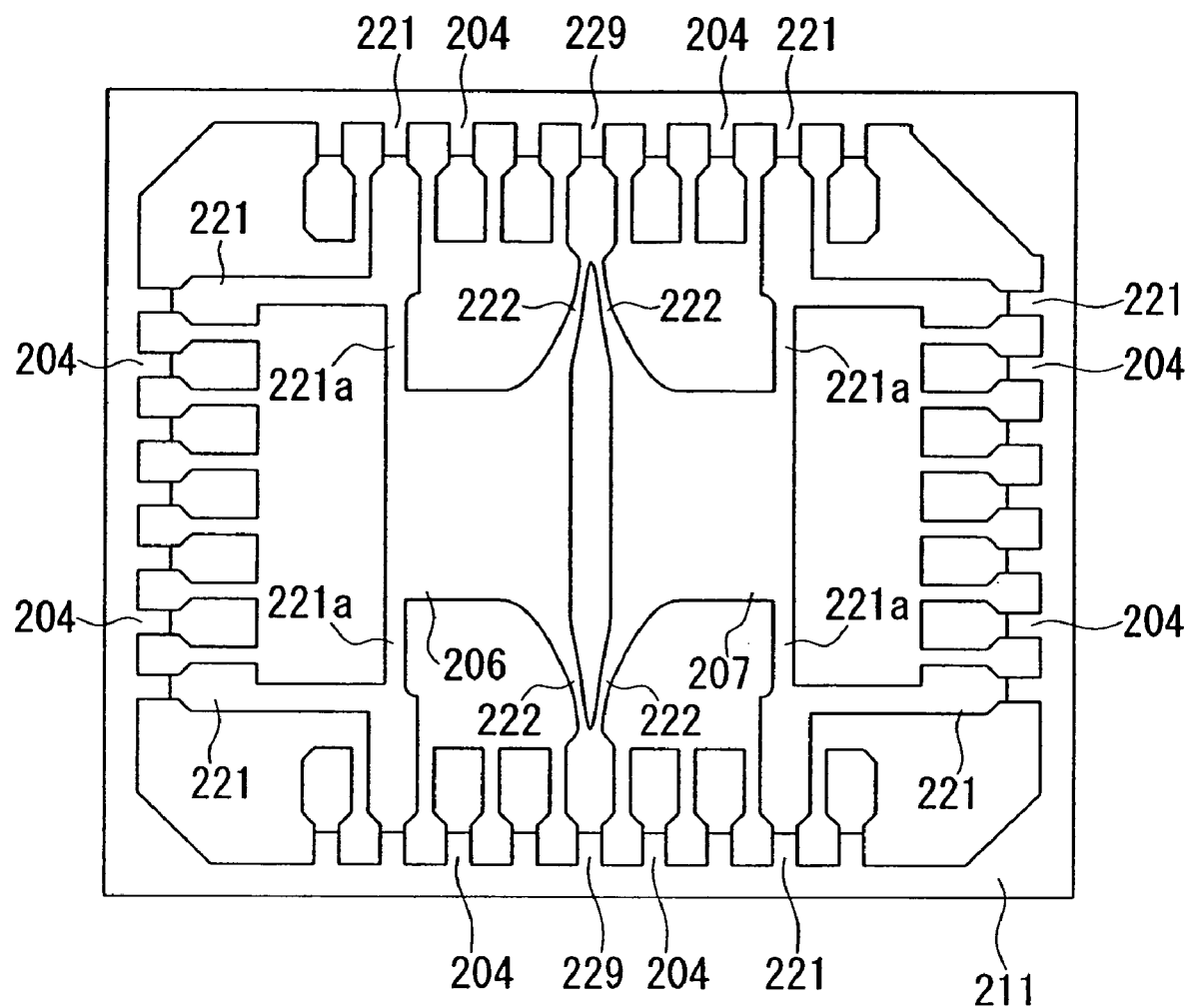
FIG. 62 is a plan view showing a lead frame for use in the manufacture of a magnetic sensor in accordance with a further modification of the third embodiment.

The stage interconnecting members 222 are not necessarily arranged to mutually interconnect together the stages 206 and 207. For example, as shown in FIG. 62, they are interconnected with leads 229 that are projected from the rectangular frame portion 211.

In the third embodiment and its related examples, pins F and I are used to press up the stages 206 and 207 relative to the first sides 206c and 207c and relative to the second sides 206d and 207d, so that the magnetic sensor chips 202 and 203 are respectively inclined at prescribed angles. Herein, the stages 206 and 207 are not necessarily inclined by using the pins F and I. That is, it is required that the stages 206 and 207 be inclined after the magnetic sensor chips 202 and 203 are bonded onto the surfaces 206a and 207a of the stages 206 and 207 and before the molded resin casing 205 is formed so as to encapsulate the stages 206 and 207 therein.

The magnetic sensor chips 202 and 203 are not necessarily bonded onto the surfaces 206a and 207a of the stages 206 and 207. That is, at lease one magnetic sensor chip can be bonded onto the backside of the stage (206 or 207).

4. Fourth Embodiment

Figure 75:
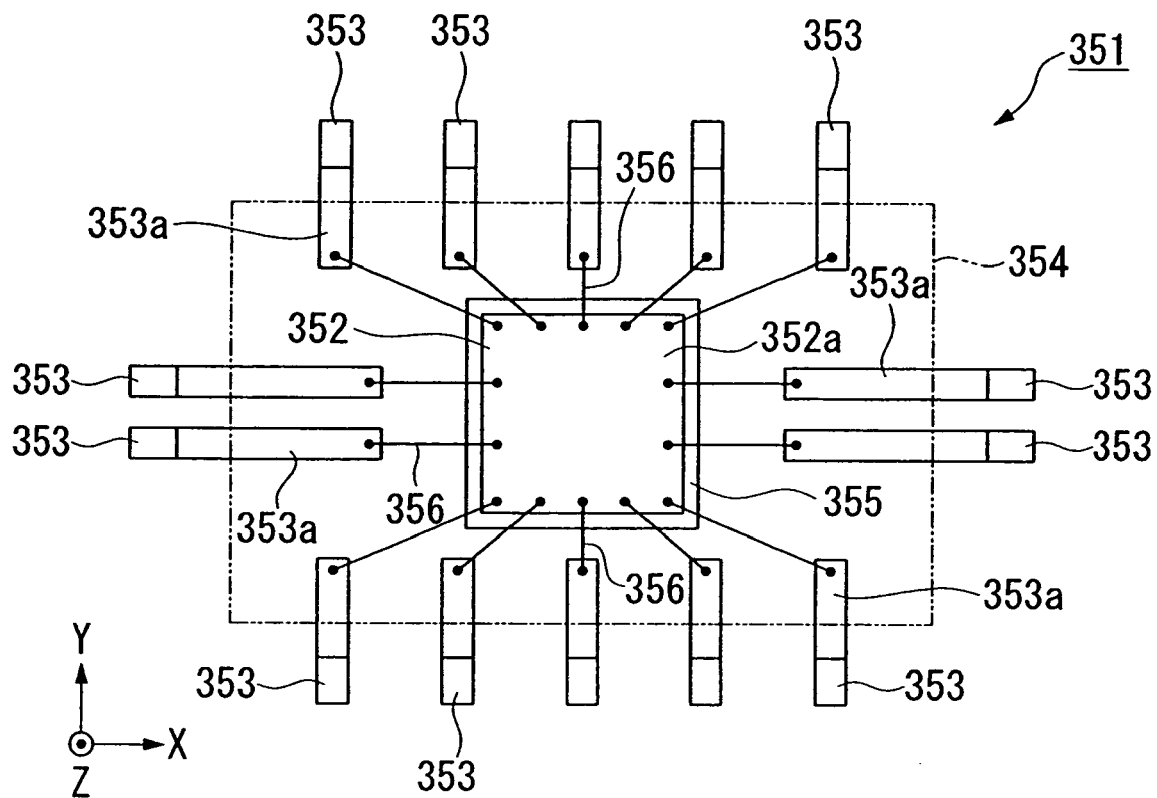
FIG. 75 is a plan view showing a magnetic sensor having a single magnetic sensor chip for consideration of the fourth embodiment of the invention.
Figure 76:
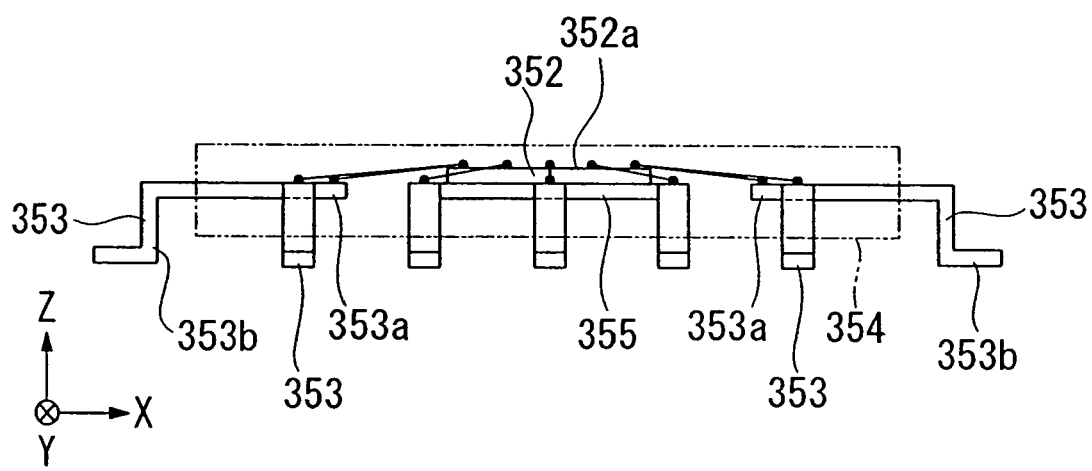
FIG. 76 is a side view simply showing essential parts of the magnetic sensor shown in FIG. 75.

Before specifically describing a fourth embodiment of the invention, the basic configuration and concept therefor will be described with reference to FIGS. 75 and 76, wherein a magnetic sensor 351 comprises a magnetic sensor chip 352, a plurality of leads 353 for electrically connecting the magnetic sensor chip 352 with an external device (not shown), and a molded resin 354 for integrally fixing them at prescribed positions therein.

The magnetic sensor chip 352 is arranged in an X-Y plane defined by an X-axis and a Y-axis on a stage 355, thus detecting components of an external magnetic field in both the X-axis and Y-axis directions.

Bases 353a of the leads 353 are electrically connected with the magnetic sensor chip 352 via metal wires 356, and tip ends 353b of the leads 353 are projected outside of the surface of the molded resin 354.

The aforementioned magnetic sensor 351 can be used in various fields, examples of which will be described below.

For example, the magnetic sensor 351 can be adapted to medical instruments such as tip ends of catheters, fiberscopes, or cameras, whereby it detects a direction of the tip end of a catheter or an image pickup direction of a camera. Therefore, it is possible to measure the direction of the tip end of the catheter or bearings of the camera, which is inserted into a human body, in a three-dimensional manner.

In addition, it is possible to install the magnetic sensor 351 in a portable terminal device, whereby terrestrial magnetism is detected so as to measure bearings of the portable terminal device, so that navigation functions for displaying measured bearing on a display screen can be adapted to the portable terminal device. In order to accurately determine bearings of magnetism, it is necessary to measure them in a three-dimensional manner.

However, the aforementioned magnetic sensor 351 cannot always secure the X-Y plane of the magnetic sensor chip 352 so as to be always directed in parallel with the direction of an external magnetic field when performing bearing measurement. For this reason, when the direction of an external magnetic field crosses the X-Y plane, the magnetic sensor chip 352 detects components of magnetism in the X-axis and Y-axis directions only, and it is difficult to detect components of magnetism in another direction crossing the X-Y plane. This indicates difficulties in accurately measuring bearings of an external magnetic field in a three-dimensional manner.

Figures 83, 84:
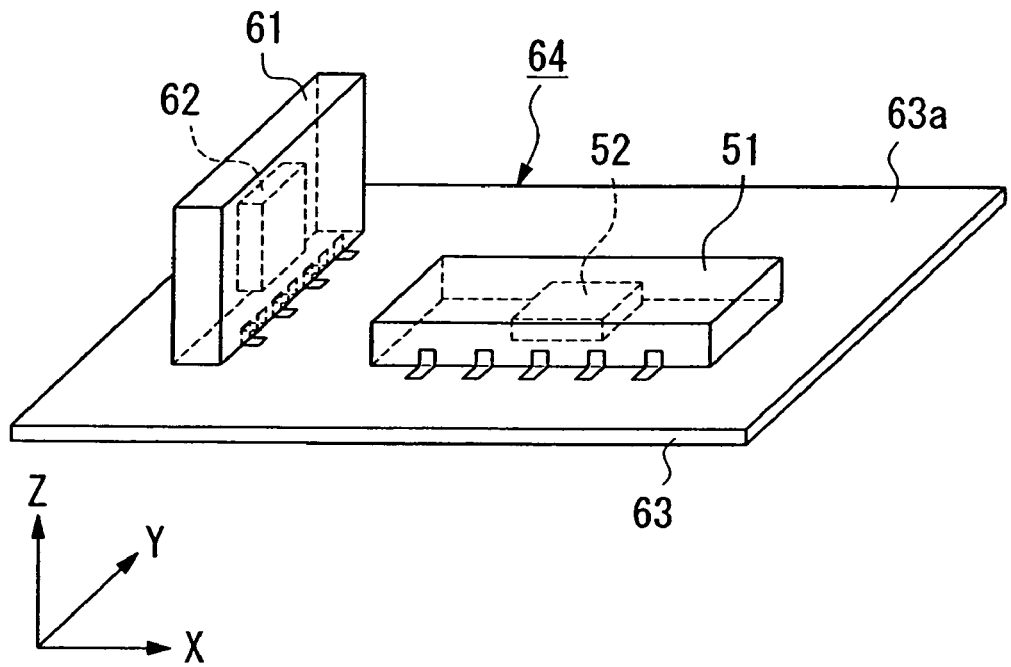
FIG. 83 is a perspective view showing a conventionally-known example of a magnetic sensor unit using two magnetic sensor chips for measurement of three-directional components of magnetism.
FIG. 84 shows a relationship between mathematical expressions and bearings with respect to the magnetic sensor chip measuring two-directional components of magnetism.

In order to accurately measure the three-dimensional bearings of an external magnetic field, it is possible to provide the foregoing magnetic sensor unit 64 shown in FIG. 83, details of which have been already described previously. In general, the magnetic sensor adapted to a medical instrument such as a catheter, a fiberscope, or a camera, which is inserted into a human body, should be reduced in size. However, the foregoing magnetic sensor unit 64 has difficulties in being adapted to such a medical instrument, wherein it is constituted by arranging the magnetic sensor 61 so as to be perpendicular to the surface 63a of the board 63, such that the magnetic sensor unit 64 is increased in the thickness dimensions in the Z-axis direction thereof. In addition, the manufacturing cost of the magnetic sensor unit 64 increases because of the requirement of two magnetic sensors 51 and 61 therefor. In short, it is strongly desired to reduce the overall size of the magnetic sensor that can accurately measure three-dimensional bearings of magnetism.

Figure 63:
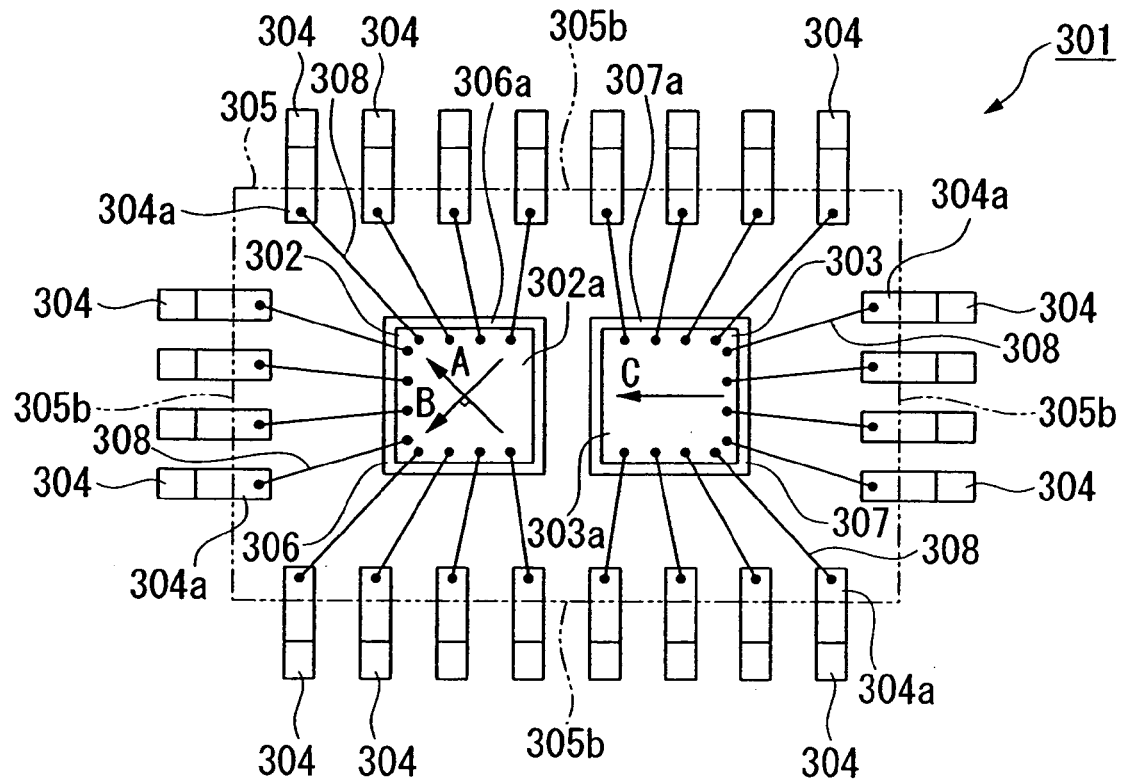
FIG. 63 is a plan view showing a magnetic sensor that is manufactured in a manufacturing method according to a fourth embodiment of the invention.
Figure 64:
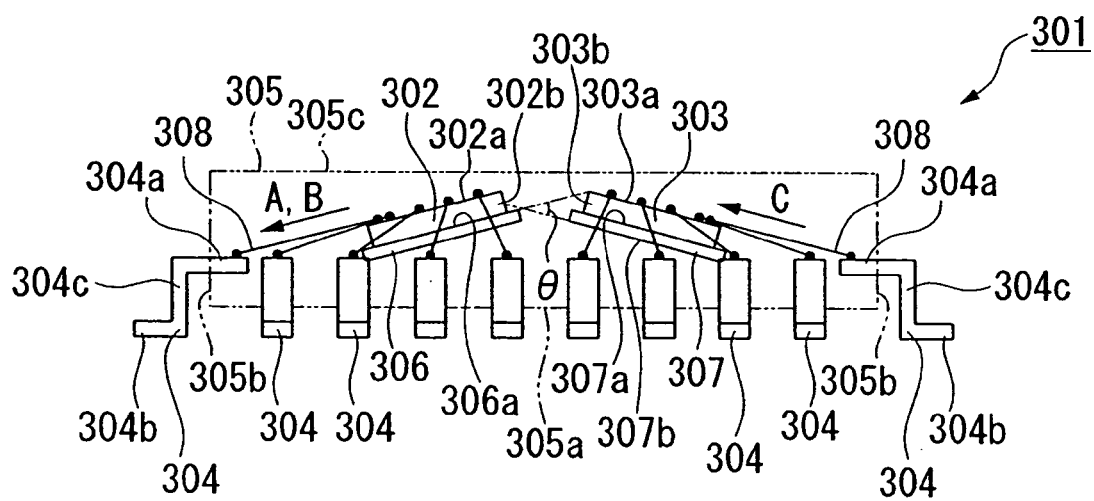
FIG. 64 is a side view showing essential parts of the magnetic sensor shown in FIG. 63.

A fourth embodiment of the invention will be described with reference to FIGS. 63 and 64, wherein a magnetic sensor 301 comprises two magnetic sensor chips 302 and 303, a plurality of leads 304 for electrically connecting the magnetic sensor chips 302 and 303 with an external device (not shown), and a molded resin casing 305 (e.g., a package) for integrally fixing the magnetic sensor chips 302 and 303 and the leads 304 at prescribed positions therein.

Each of the magnetic sensor chips 302 and 303 is formed in a rectangular plate-like shape in plan view, and they are mounted on stages 306 and 307 respectively. In addition, the magnetic sensor chips 302 and 303 are both encapsulated in the molded resin casing 305, and they are arranged above bases 304a of the leads 304 and in proximity to an upper surface 305c of the molded resin casing 305. Furthermore, the magnetic sensor chips 302 and 303 are respectively inclined at prescribed angles against a lower surface (or a bottom) 305a of the molded resin casing 305, and ends 302b and 303b thereof are directed towards the upper surface 305c of the molded resin casing 305, so that surfaces 302a and 303a thereof are mutually inclined to each other with an acute angle θ therebetween. Herein, the acute angle θ is formed between a surface 306a of the stage 306 and a backside 307b of the stage 307.

In the above, the magnetic sensor chip 302 is sensitive to components of an external magnetic field in two directions (i.e., directions A and B), which cross each other with a right angle therebetween along the surface 302a thereof. The magnetic sensor chip 303 is sensitive to components of an external magnetic field in a single direction (i.e., a direction C), which is laid along a surface 303a thereof and which crosses at an acute angle to the A-B plane defined by the directions A and B.

Each of the leads 304 is made of a prescribed metal material such as copper, and each comprises a base 304a, a tip end 304b, and an interconnecting portion 304c for interconnecting the base 304a and tip end 304b together, each of them having a crank-like sectional shape.

The bases 304a of the leads 304 are partially embedded inside of the molded resin casing 305, and the leads 304 are electrically connected with the magnetic sensor chips 302 and 303 via metal wires 308. Both the tip ends 304b and interconnecting portions 304c of the leads 304 are arranged outside of side surfaces 305b of the molded resin casing 305, and the tip ends 304b are arranged below the lower surface 305a of the molded resin casing 305.

Next, a description will be given with respect to a manufacturing method of the aforementioned magnetic sensor 301.

A thin metal plate is subjected to either press working or etching, or it is subjected to both press working and etching, thus producing a lead frame in which the leads 304 are integrally connected with the stages 306 and 307. The magnetic sensor chips 302 and 303 are respectively bonded onto the surfaces 306a and 307a of the stages 306 and 307; then, they are electrically connected with the leads 304 via the metal wires 308.

The lead frame is subjected to plastic and/or elastic deformation so that the stages 306 and 307 are inclined at prescribed angles respectively; thereafter, the molded resin casing 305 is formed so as to fix the magnetic sensor chips 302 and 303 at prescribed positions therein. Lastly, cutting is performed so as to separate the leads 304 from the stages 306 and 307, thus completing the manufacture of the magnetic sensor 301.

In the above, it is possible to mount the magnetic sensor chips 302 and 303 on the stages 306 and 307 and to arrange the metal wires 308 after the lead frame is subjected to plastic deformation and/or elastic deformation.

The aforementioned magnetic sensor 301 is mounted on a board (or a substrate) installed in a portable terminal device (not shown), wherein an LSI circuit (i.e., a Large Scale Integrated circuit) encapsulated in a molded resin is independently arranged on the board in order to process output signals of the magnetic sensor chip 301. Thus, the portable terminal device can display bearings of terrestrial magnetism measured by the magnetic sensor 301 on a display screen.

Similar to the foregoing first embodiment (see FIG. 9), the magnetic sensor chips 302 and 303 measure components of magnetism in the directions A, B, and C, thus producing values Sa, Sb, and Sc in proportion to measured components of magnetism.

In the magnetic sensor 301, the magnetic sensor chip 302 detects components of magnetism within the A-B plane, and the magnetic sensor chip 303 detects other components of magnetism in the direction C. Therefore, it is possible to determine the bearings of magnetism as a vector in a three-dimensional space; thus, it is possible to accurately measure the three-dimensional bearings of magnetism.

In the above, the magnetic sensor chips 302 and 303 are mutually inclined to each other with an acute angle therebetween, so that compared with the conventional magnetic sensor in which magnetic sensor chips are arranged so as to cross at a right angle therebetween, it is possible to reduce the thickness dimensions of the magnetic sensor 301, which are measured between the lower surface 305a and the upper surface 305c of the molded resin casing 305; that is, it is possible to reduce the overall size of the magnetic sensor 301.

In addition, both magnetic sensor chips 302 and 303 are completely encapsulated in the molded resin casing 305, whereby it is possible to reliably maintain the magnetic sensor chips 302 and 303 in inclined states. The magnetic sensor 301 can be easily installed in the portable terminal device because it is only necessary to match the lower surface 305a of the molded resin casing 305 with the surface of the board.

In the fourth embodiment, the magnetic sensor chips 302 and 303 are inclined to each other such that ends 302b and 303b thereof are directed towards the upper surface 305c of the molded resin casing 305, but this is not restrictive. That is, it is required that the magnetic sensor chips 302 and 303 be respectively inclined against the lower surface 305a of the molded resin casing 305.

Figure 65:
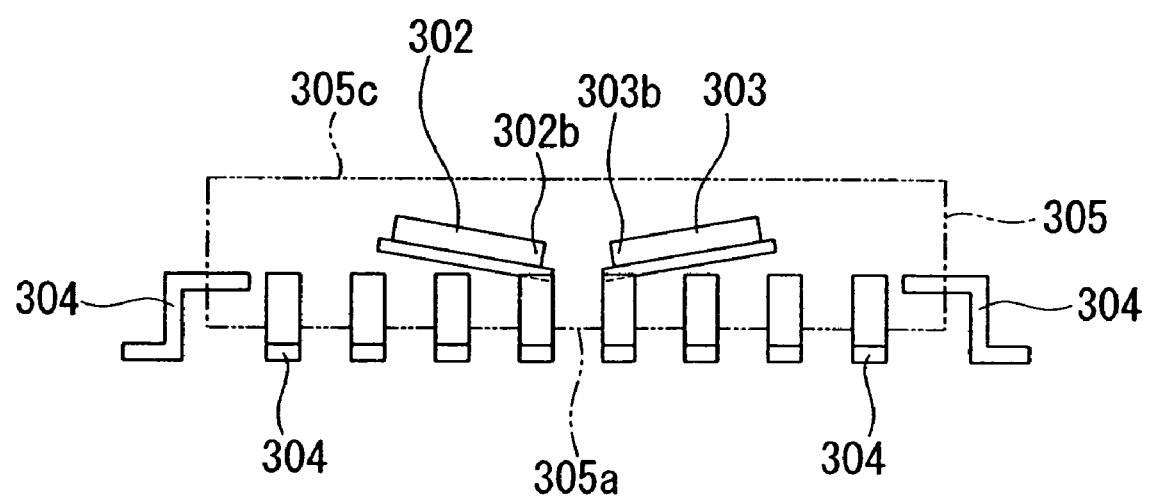
FIG. 65 is a side view showing a different arrangement of magnetic sensor chips in the magnetic sensor.
Figure 66:
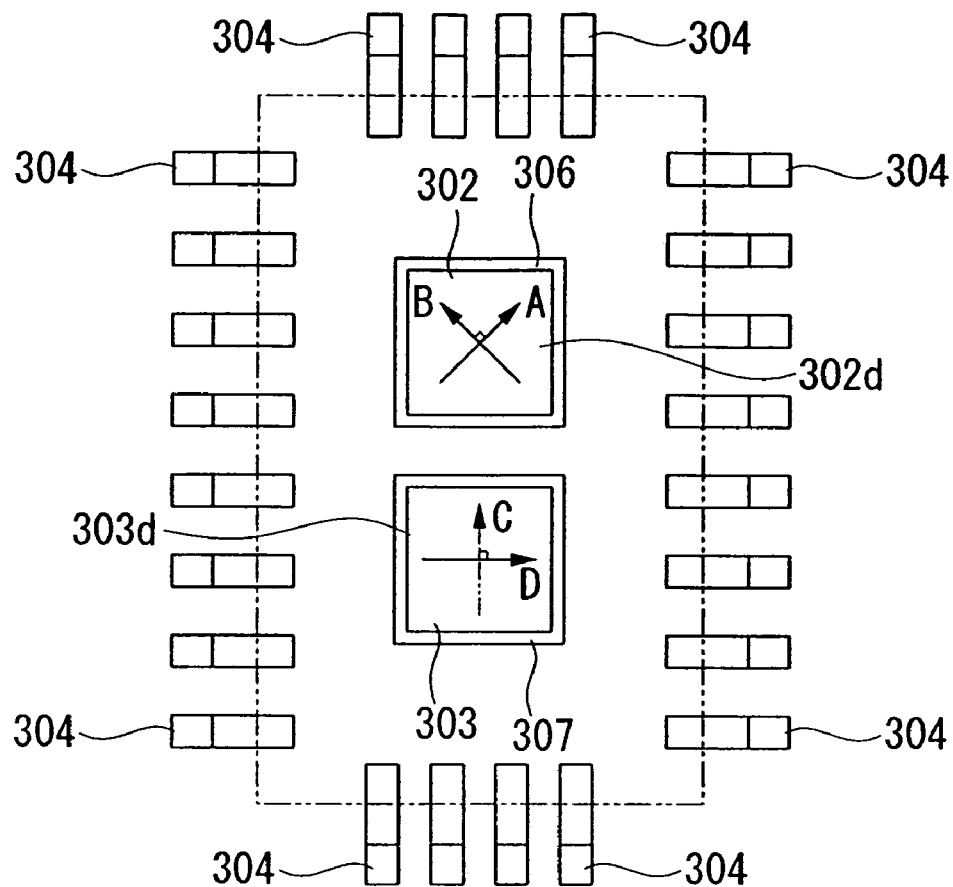
FIG. 66 is a plan view showing a magnetic sensor that is manufactured in accordance with a modification of the fourth embodiment.
Figure 67:
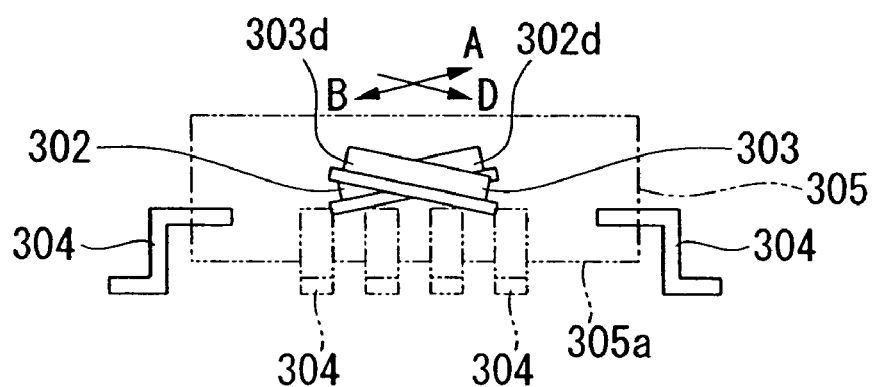
FIG. 67 is a side view showing essential parts of the magnetic sensor shown in FIG. 66.

For example, as shown in FIG. 65, the magnetic sensor chips 302 and 303 can be inclined inversely so that ends 302b and 303b thereof are directed towards the lower surface 305a of the molded resin casing 305. Alternatively, as shown in FIGS. 66 and 67, they can be inclined to each other so that opposite ends 302d and 303d thereof are directed towards the upper surface 305c of the molded resin casing 305. In this case, the magnetic sensor chip 303 is arranged so that the sensing direction thereof crosses the A-B plane, specifically, the sensing direction thereof matches a direction D perpendicular to the direction C along the surface 303a thereof.

Figure 68:
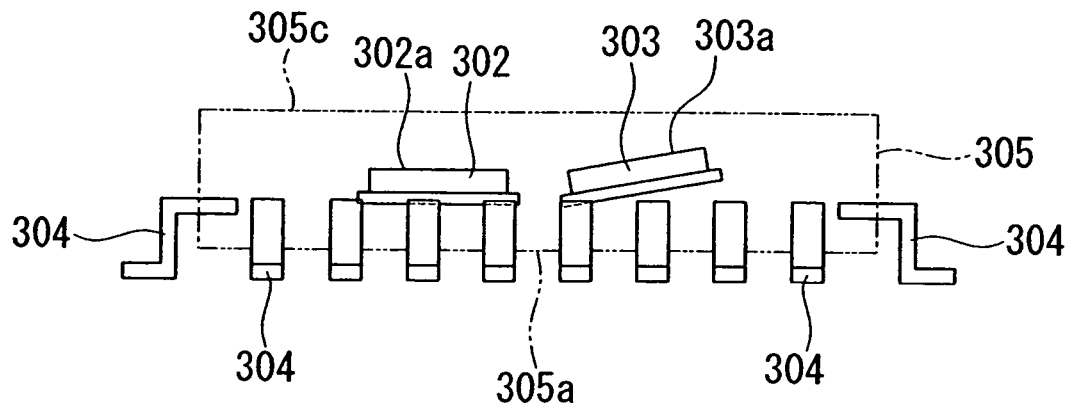
FIG. 68 is a side view showing a different arrangement of magnetic sensor chips in the magnetic sensor.

In the fourth embodiment, the magnetic sensor chips 302 and 303 are inclined to each other so that the surfaces 302a and 303a thereof are inclined against the lower surface 305a of the molded resin casing 305, but this is not restrictive. That is, it is required that the magnetic sensor chips 302 and 303 be mutually inclined. For example, it is possible to arrange the magnetic sensor chip 302 so that the surface 302a is laid in parallel with the bottom 305a as shown in FIG. 68.

Figure 69:
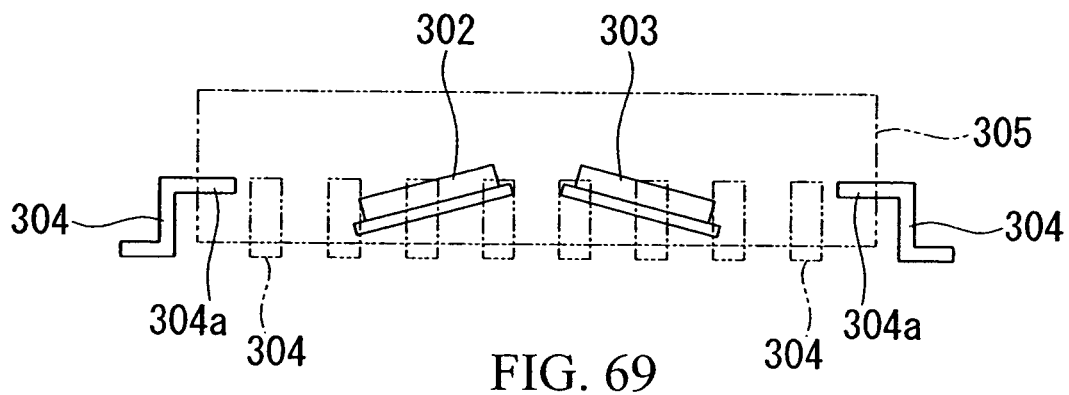
FIG. 69 is a side view showing a different arrangement of magnetic sensor chips in the magnetic sensor.

In addition, both magnetic sensor chips 302 and 303 are arranged above the bases 304a of the leads 304, but this is not restrictive. For example, as shown in FIG. 69, they can be arranged substantially below the bases 304a of the leads 304.

Figure 70:
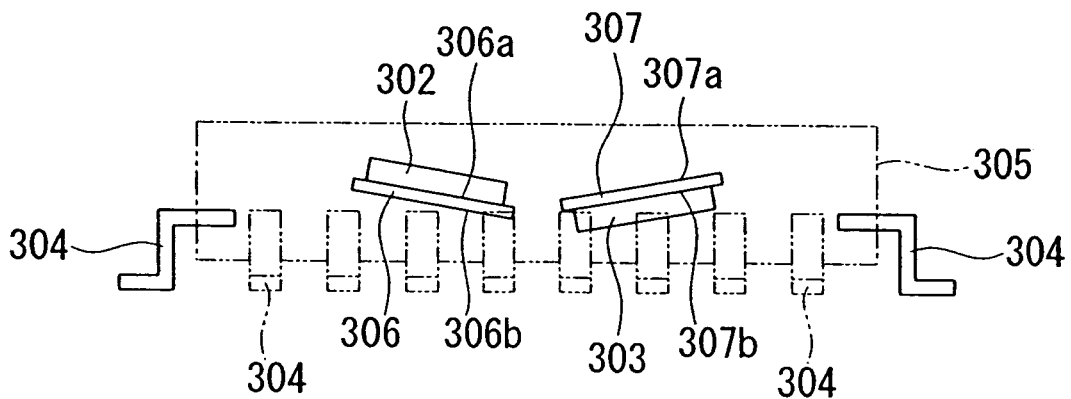
FIG. 70 is a side view showing a different arrangement of magnetic sensor chips in the magnetic sensor.

The magnetic sensor chips 302 and 303 are not necessarily bonded onto the surfaces 306a and 307a of the stages 306 and 307; therefore, they can be bonded onto backsides 306b and 307b of the stages 306 and 307. For example, as shown in FIG. 70, only the magnetic sensor chip 303 may be bonded onto the backside 307b of the stage 307.

The magnetic sensor chips 302 and 303 are not necessarily fixed inside of the molded resin casing 305. For example, a prescribed area of the magnetic sensor 301 is filled with ceramic paste, which is subjected to sintering so as to produce a ceramic package, by which the magnetic sensor chips 302 and 303 can be fixed in position.

The sensing direction of the magnetic sensor chip 303 is not necessarily limited to the direction C or D, wherein it is required that the sensing direction of the magnetic sensor chip 303 certainly crosses the A-B plane. Of course, the magnetic sensor chip 303 does not necessarily have a single sensing direction; therefore, as shown in FIGS. 71 and 72, the magnetic sensor chip 303 provides two sensing directions (namely, directions C and E) that cross each other along the surface 303a thereof.

Figure 71:
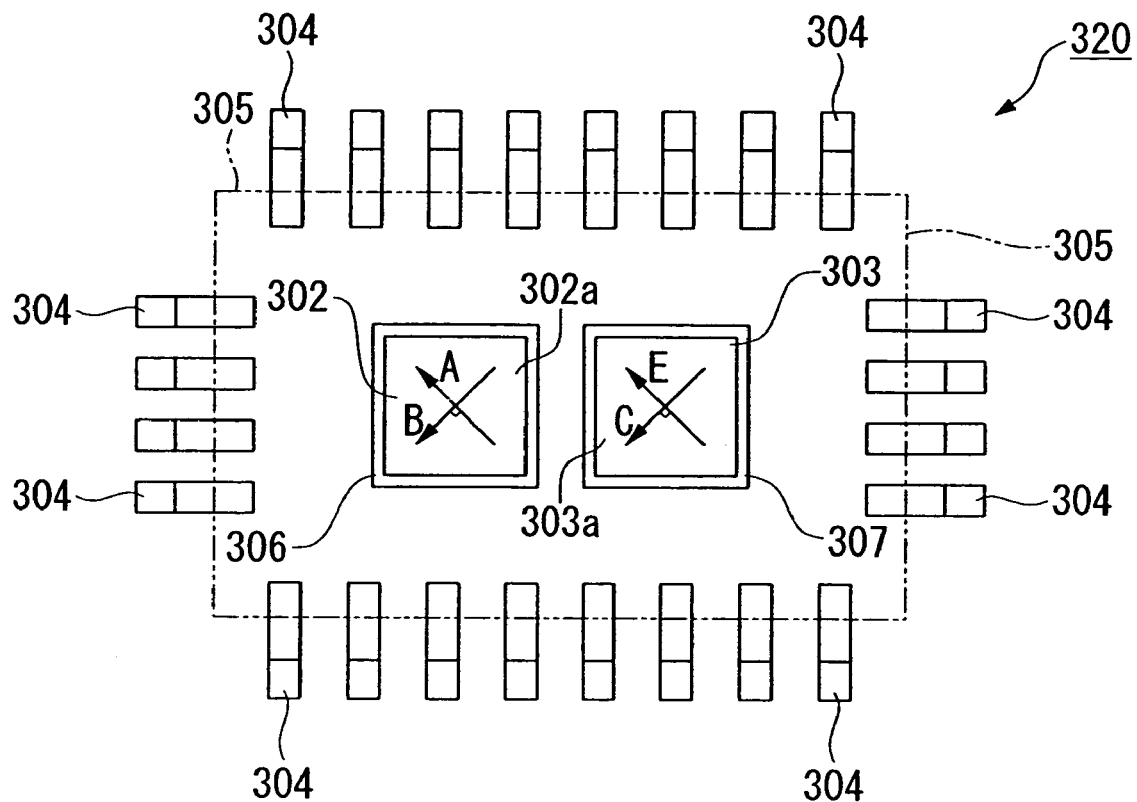
FIG. 71 is a plan view showing a magnetic sensor that is manufactured in accordance with a further modification of the fourth embodiment.
Figure 72:
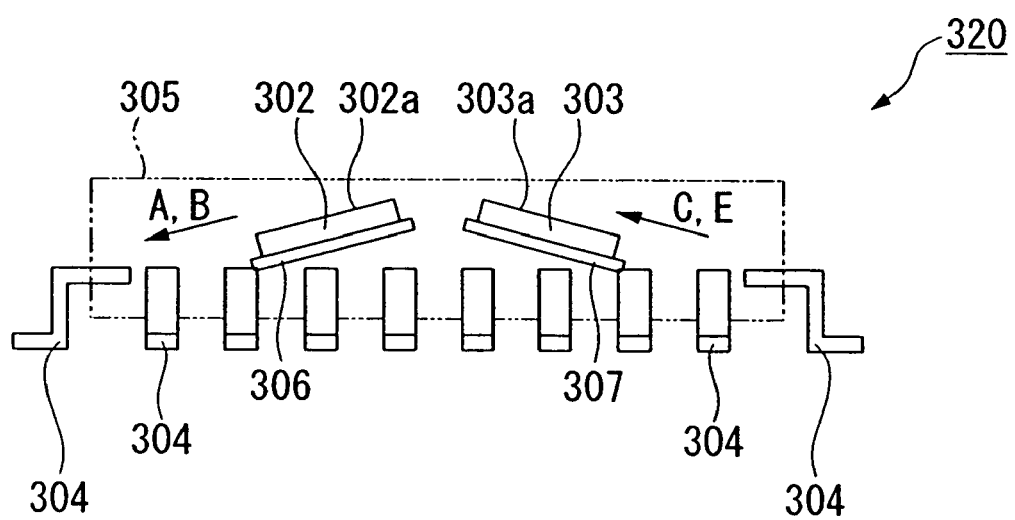
FIG. 72 is a side view showing essential parts of the magnetic sensor shown in FIG. 71.

In a magnetic sensor 320 shown in FIGS. 71 and 72, the plane including sensing directions of the magnetic sensor chip 302 crosses the plane including sensing directions of the magnetic sensor chip 303, whereby it is possible to simultaneously detect components of magnetism in four directions within a three-dimensional space. Therefore, it is possible to determine bearings of magnetism as a vector in a three-dimensional space; thus, it is possible to accurately measure bearings of magnetism.

In the above, the sensing directions of the magnetic sensor chips 302 and 303 can cross each other with acute angles therebetween, whereby compared to the foregoing magnetic sensor in which sensing directions merely cross each other with a right angle therebetween, it is possible to further reduce the thickness dimensions of the magnetic sensor 320, which can be thus reduced in size.

Since each of the magnetic sensor chips 302 and 303 has two sensing directions, it is possible to use magnetic sensor chips of the same type for the magnetic sensor 320, which can thus reduce the manufacturing cost.

Figure 73:
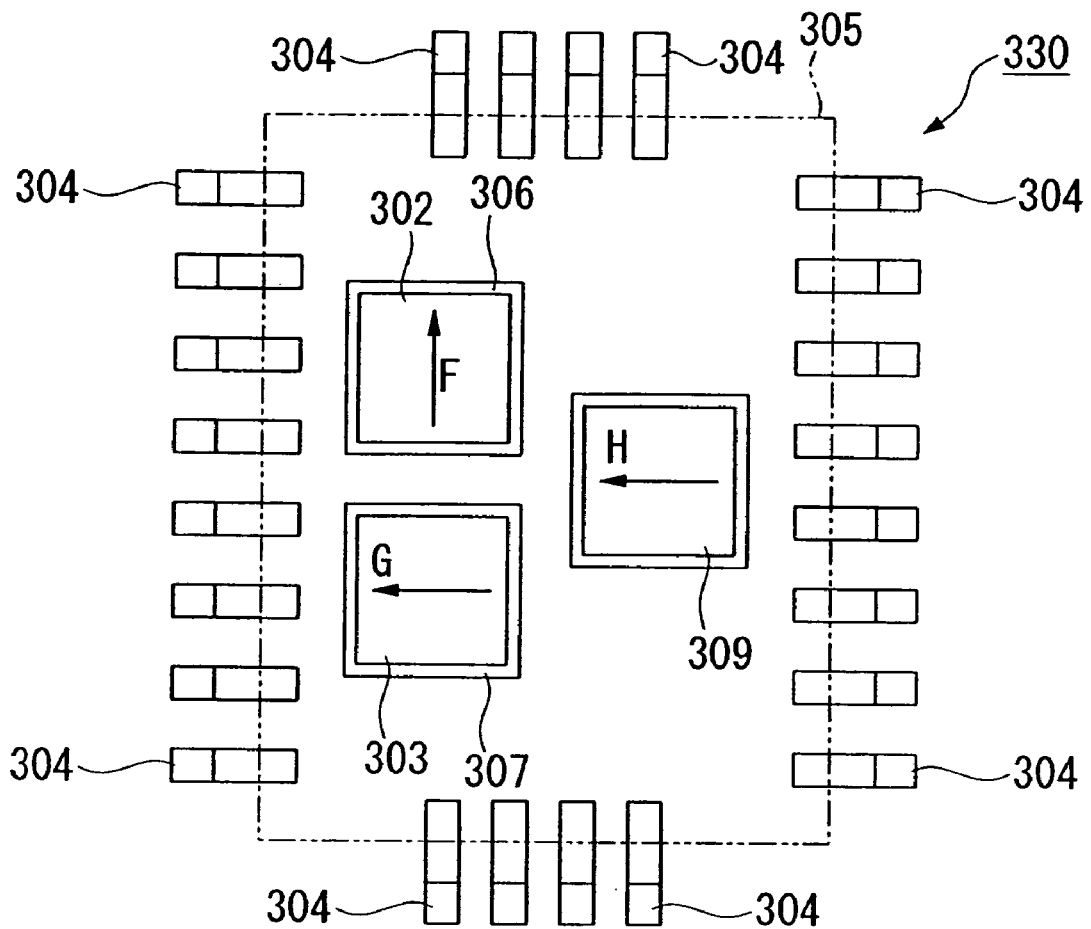
FIG. 73 is a plan view showing a magnetic sensor that is manufactured in accordance with a further modification of the fourth embodiment.
Figure 74:
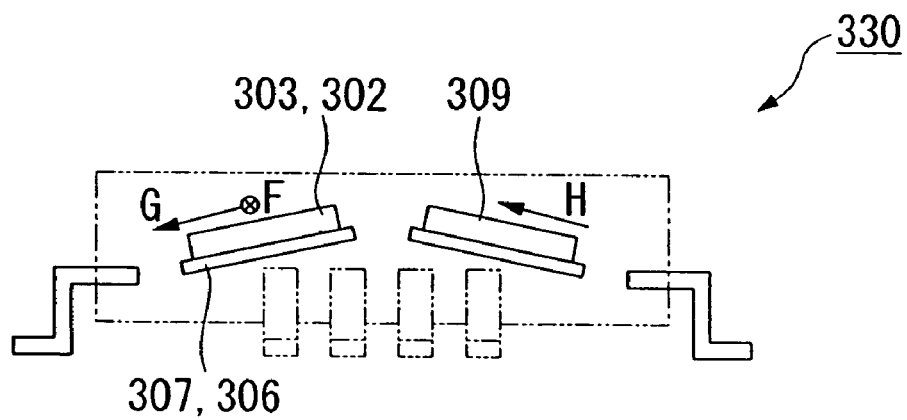
FIG. 74 is a side view showing essential parts of the magnetic sensor shown in FIG. 73.

The magnetic sensor does not necessarily incorporate two magnetic sensor chips (302 and 303); that is, it is possible to arrange an arbitrary number of magnetic sensor chips in the magnetic sensor. For example, as shown in FIGS. 73 and 74, it is possible to use three magnetic sensor chips 302, 303, and 309 for a magnetic sensor 330, and each magnetic sensor chip is sensitive to components of magnetism in a single direction. Herein, the magnetic sensor chips 302 and 303 have sensing directions F and G, which cross with a right angle therebetween, whereas the magnetic sensor chip 309 has a sensing direction H that crosses at a right angle to an F-G plane defined by the sensing directions F and G.

The aforementioned magnetic sensor 330 can detect components of magnetism in all directions on the F-G plane defined by the sensing directions F and G of the magnetic sensor chips 302 and 303. In addition, the magnetic sensor chip 309 can detect components of magnetism in the direction H crossing the F-G plane. Therefore, it is possible to reliably detect components of magnetism in three directions within a three-dimensional space by use of the three magnetic sensor chips 302, 303, and 309. That is, it is possible to reduce the overall size of the magnetic sensor 330 that can measure bearings of magnetism as a vector in a three-dimensional space.

In the above, it is possible to set the sensing direction H of the magnetic sensor chip 309 so as to cross at an acute angle to the F-G plane, whereby compared with the magnetic sensor in which the sensing direction H merely crosses at a right angle to the F-G plane, it is possible to reduce the thickness dimensions of the magnetic sensor 330, which can be thus reduced in size. Since the magnetic sensor 330 can be constituted using three magnetic sensor chips of the same type each having a single sensing direction, it is possible to reduce the manufacturing cost therefor.

When the aforementioned magnetic sensors 320 and 330 are not necessarily designed in consideration of reducing size, it is possible to simply arrange the magnetic sensor chips (302 and 302; or 302, 303, and 309) so as to mutually cross at a right angle therebetween. Alternatively, it is possible to arrange the magnetic sensor chips in a slanted manner in plan view. In this case, it is possible to improve the flow of a resin in the formation of the molded resin casing and the like.

In the fourth embodiment, both the magnetic sensor 301 and the LSI circuit encapsulated in a molded resin are independently arranged on the board of the portable terminal device. Alternatively, it is possible to integrally encapsulate both the magnetic sensor 301 and the LSI circuit in the same molded resin, thus producing a single package incorporating them. In this case, the magnetic sensor 301 and the LSI circuit can be arranged vertically with respect to each other, or they can be arranged horizontally adjacent to each other.

In addition, both the magnetic sensor chips and the LSI circuit are bonded onto the same lead frame, which is then encapsulated in a molded resin so as to integrally fix them at prescribed positions. Of course, the magnetic sensor chips and the LSI circuit are not necessarily integrally incorporated in the same molded resin. That is, it is possible to encapsulate the magnetic sensor chips and the LSI circuit independently of each other in respective molded resins; then, they are fixed onto the stages made of metal materials.

In the fourth embodiment, each of the leads 304 has a crank-like sectional shape, wherein the tip ends 304b are arranged below the lower surface 305a of the molded resin casing 305, but this is not restrictive. That is, it is required that prescribed parts of the leads 304 be exposed below the lower surface 305a of the molded resin casing 305.

In addition, this invention is not necessarily limited to the fourth embodiment in the number and positions of the leads 304 and wires 308. That is, it is possible to arbitrarily change the number and bonding positions of the wires 308 being connected with the magnetic sensor chips; and it is possible to arbitrarily change the number and positions of the leads 304.

Furthermore, the magnetic sensor 301 is not necessarily installed in the portable terminal device; that is, it can be installed in a medical instrument such as a catheter, a fiberscope, or a camera, which is inserted into a human body. For example, in order to measure bearings of a camera inserted into a human body, the magnetic sensor 301 is activated so as to measure bearings of a magnetic field under which the human body is placed. Therefore, it is possible to measure a relative angle of the magnetic sensor 301 in the magnetic field in a three-dimensional manner; thus, it is possible to accurately detect bearings of the camera with reference to the direction of the magnetic field.

As described heretofore, the fourth embodiment has a variety of technical features in comparison with the foregoing embodiments, which will be described below.

(1) A magnetic sensor can be constituted using three magnetic sensor chips each having a sensing direction, and the third magnetic sensor chip has a sensing direction that crosses at an acute angle to a plane defined by sensing the directions of the other two magnetic sensor chips. Herein, it is possible to reduce the thickness dimensions of the magnetic sensor, which can be thus reduced in size. Since the magnetic sensor can be constituted by using plural magnetic sensor chips of the same type each having a single sensing direction, it is possible to reduce the manufacturing cost therefor.

(2) When a magnetic sensor is constituted using two magnetic sensor chips each having two sensing directions, it is possible to measure components of magnetism in a total of four directions within a three-dimensional space. Herein, bearings of magnetism can be determined as a vector in a three-dimensional space; thus, it is possible to accurately measure bearings of magnetism.

(3) When the sensing directions of two magnetic sensor chips cross each other at acute angles therebetween, it is possible to reduce the thickness dimensions of the magnetic sensor, which can be thus reduced in size. Herein, the magnetic sensor is constituted using two magnetic sensor chips of the same type, and it is possible to reduce the manufacturing cost therefor.

(4) It is possible to reliably maintain plural magnetic sensor chips in inclined states fixed in a package, wherein the magnetic sensor can be easily installed on a board by merely matching the bottom of the package with the surface of the board.

5. Fifth Embodiment

A description will be given with respect to a magnetic sensor that is manufactured in a manufacturing method according to a fifth embodiment of the invention with reference to FIGS. 77 and 78. That is, a magnetic sensor 401, which is designed to measure the direction and magnitude of an external magnetic field, comprises two magnetic sensor chips 402 and 403, a plurality of leads 404 for electrically connecting the magnetic sensor chips 402 and 403 with an external device (not shown), and a molded resin casing 405 for integrally encapsulating the magnetic sensor chips 402 and 403 as well as the leads 404 therein.

Each of the magnetic sensor chips 402 and 403 is formed in a rectangular plate-like shape in plan view, and are mounted on stages 406 and 407 respectively. Both magnetic sensor chips 403 and 404 are completely encapsulated in the molded resin casing 405, and are arranged below bases 404a of the leads 404 and close to an upper surface 405c of the molded resin casing 405. In addition, the magnetic sensor chips 402 and 403 are inclined against a lower surface 405a of the molded resin casing 405, ends 402b and 403b thereof are directed towards the upper surface 405c of the molded resin casing 405, and surfaces 402a and 403a thereof are mutually inclined to each other with an acute angle θ therebetween. The acute angle θ is formed between a surface 406a of the stage 406 and a backside 407b of the stage 407.

The magnetic sensor chip 402 is sensitive to components of magnetism of an external magnetic field in two directions (i.e., directions A and B), which cross at a right angle along the surface 402a thereof. The magnetic sensor chip 403 is sensitive to components of magnetism of an external magnetic field in a single direction (i.e., a direction C), which crosses with an acute angle to the A-B plane defined by the directions A and B along the surface 403a thereof.

Each of the leads 404 is made of a prescribed metal material such as copper, and they are constituted by bases 404a, tip ends 404b, and interconnecting portions 404c for interconnecting between the bases 404a and tip ends 404b. Therefore, each of them has a crank-like sectional shape.

The bases 404a of the leads 404 are partially embedded in the molded resin casing 405, and the leads 404 are electrically connected with the magnetic sensor chips 402 and 403 via metal wires 408. The tip ends 404b and interconnecting portions 404c of the leads 404 are arranged outside of side surfaces 405b of the molded resin casing 405, and the tip ends 404b are arranged below the lower surface 405a of the molded resin casing 405.

Next, a description will be given with respect to a manufacturing method of the aforementioned magnetic sensor 401.

Figure 79:
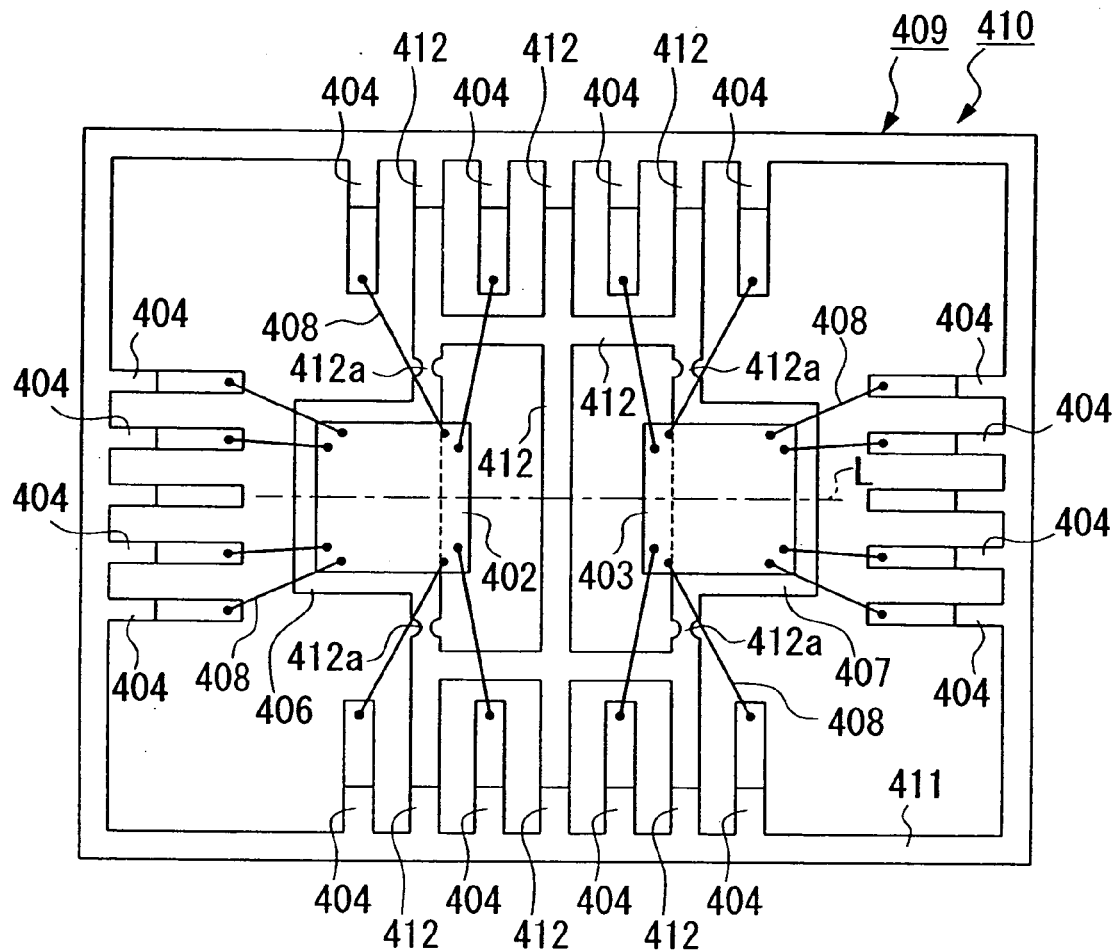
FIG. 79 is a plan view showing a lead frame for use in the manufacture of the magnetic sensor shown in FIG. 77.
Figure 80:
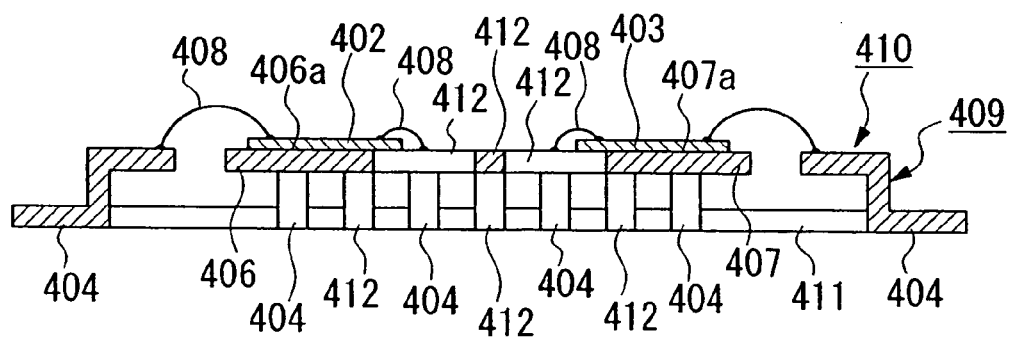
FIG. 80 is a longitudinal sectional view showing essential parts of the lead frame in which magnetic sensor chips are mounted on stages placed substantially in the same plane.

A thin metal plate is subjected to either press working or etching, or it is subjected to both press working and etching, thus producing a lead frame 410 including stages 406 and 407 supported by a frame 409 as shown in FIGS. 79 and 80. The frame 409 has a rectangular frame portion 411 for encompassing the stages 406 and 407, and a plurality of leads 404 and 412 that are projected inwardly from the rectangular frame portion 411.

The leads 412 are hanging leads for fixing the stages 406 and 407 at prescribed positions to the rectangular frame portion 411, and ends 412a of the leads 412, which are arranged in proximity to the stages 406 and 407 respectively, constitute distorted portions that can be easily distorted upon plastic deformation (and/or elastic deformation) when the stages 406 and 407 are inclined. Cutouts are formed on both sides of ends 412a of the leads 412, which are thus reduced in width compared with other portions of the leads 412.

Ends 412a are formed at prescribed positions of the leads 412 in parallel with both side ends of the stages 406 and 407, and they are arranged linearly symmetrical with respect to a center axial line L passing through the centers of the stages 406 and 407.

After preparation of the lead frame 410, the magnetic sensor chips 402 and 403 are bonded onto the surfaces 406a and 407a of the stages 406 and 407 respectively; then, they are electrically connected with the leads 404 via the metal wires 408.

In the above, when the stages 406 and 407 are inclined, bonding portions between the wires 408 and the magnetic sensor chips 402 and 403 must be separated from bonding portions between the wires 408 and the leads 404; therefore, the wires 408 are arranged so as to have sufficient room in length or height thereof.

Figure 81:
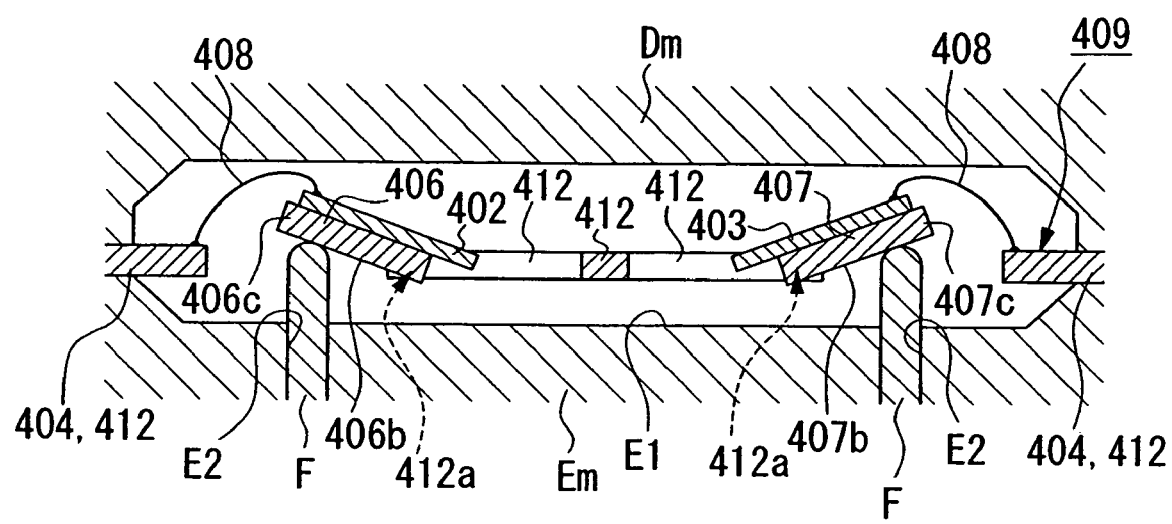
FIG. 81 is a longitudinal sectional view showing essential parts of a lead frame that is held in a metal mold in which the stages are inclined upon upward pressure applied thereto by pins.

Then, as shown in FIG. 81, the frame 409 of the lead frame 410 is held in a metal mold consisting of an upper mold Dm and a lower mold Em, except for prescribed parts of the leads 404 and 412, and the magnetic sensor chips 402 and 403 are embedded in a resin. Two holes E2 are formed at prescribed positions on an interior wall E1 of the lower mold Em, and pins F are arranged so as to freely move up and down in the holes E2.

As shown in FIG. 81, the pins F are moved upwards to press up the backsides 406b and 407b of the stages 406 and 407 relative to terminal ends 406c and 407c, so that the stages 406 and 407 are inclined at prescribed angles together with the magnetic sensor chips 402 and 403.

In the above, the stages 406 and 407 are respectively rotated about axial lines that connect together ends 412a of the leads 412 arranged in proximity to both side ends thereof, so that ends 412a of the leads 412 are distorted and deformed. Thus, it is possible to incline the magnetic sensor chips 402 and 403 against the interior wall E1 of the lower mold Em as well as other portions of the leads 412.

Under the aforementioned condition where the backsides 406b and 407b of the stages 406 and 407 relative to the terminal ends 406c and 407c are pressed upwards by the pins F, a melted resin is injected into the cavity of the metal mold consisting of the upper mold Dm and lower mold Em, and a molded resin is formed so as to encapsulate both magnetic sensor chips 402 and 403 therein. After completion of hardening of the resin, the pins F are moved downwards. Thus, it is possible to reliably fix the magnetic sensor chips 402 and 403 mutually inclined to each other in the molded resin.

Figure 77:
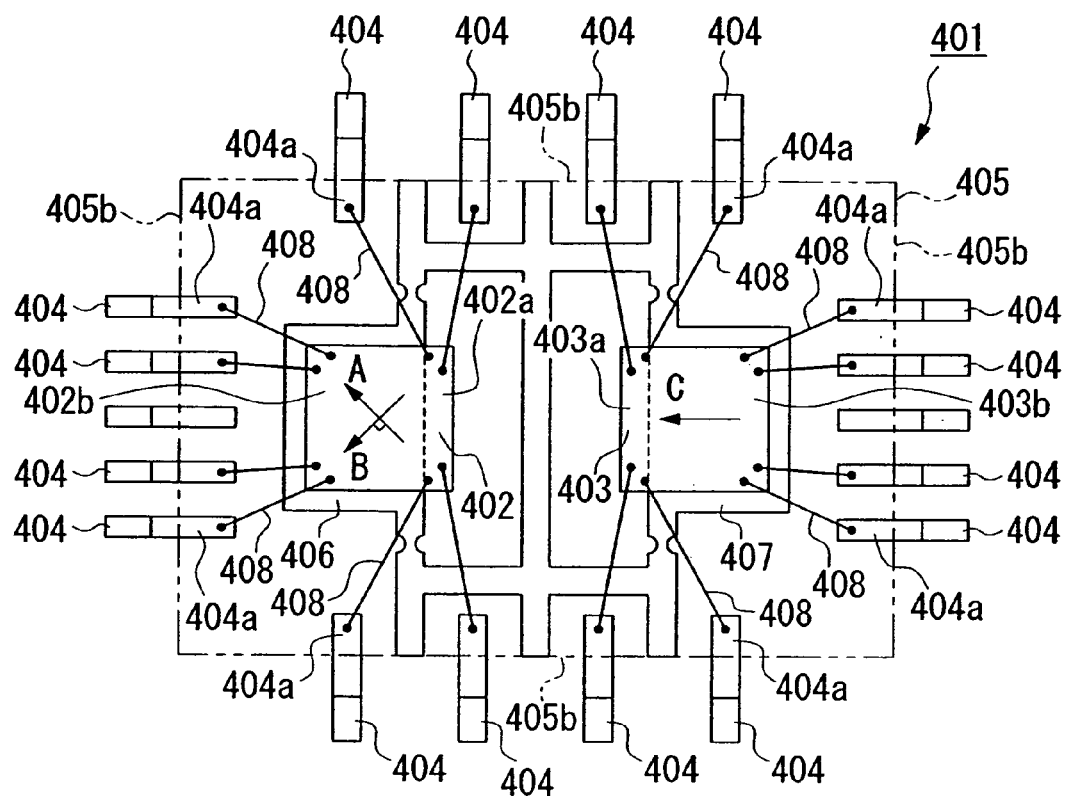
FIG. 77 is a plan view showing a magnetic sensor that is manufactured in a manufacturing method according to a fifth embodiment of the invention.
Figure 78:
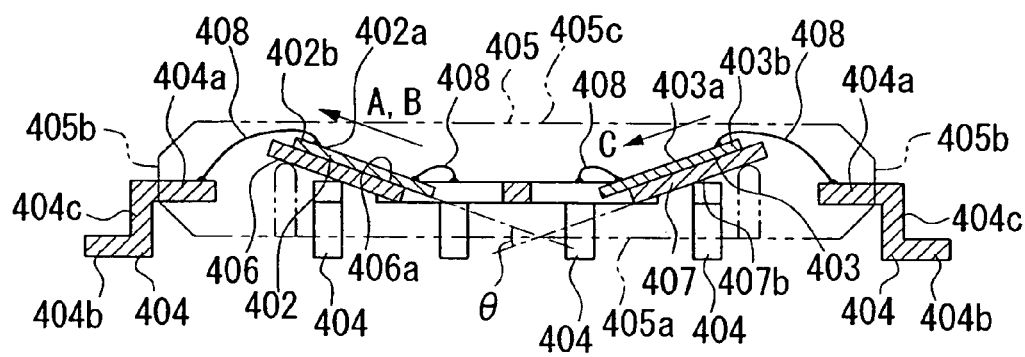
FIG. 78 is a longitudinal sectional view showing essential parts of the magnetic sensor shown in FIG. 77.

Lastly, the rectangular frame portion 411 and unwanted portions of the leads 412, which are projected outside of the molded resin, are cut, thus completing the manufacture of the magnetic sensor 401 shown in FIG. 77.

The aforementioned magnetic sensor 401 is mounted on a board (or a substrate) installed in a portable terminal device (not shown), in which bearings of magnetism measured by the magnetic sensor 401 are displayed on a display screen. That is, similar to the foregoing first embodiment (see FIG. 9), the magnetic sensor chips 402 and 403 detect components of magnetism in the directions A, B, and C, thus producing values Sa, Sb, and Sc in proportion to the detected components of magnetism.

In the manufacturing method of the magnetic sensor 401 according to the fifth embodiment, the magnetic sensor chips 402 and 403 are bonded onto the stages 406 and 407 before inclination, so that they can be accurately bonded onto the surfaces 406a and 407a of the stages 406 and 407, both of which are arranged substantially in the same plane. Therefore, it is possible to simultaneously bond the magnetic sensor chips 402 and 403 onto the stages 406 and 407 of the lead frame 410 with ease. In addition, it is possible to perform the step for inclining the stages 406 and 407, and the step for forming the molded resin casing 405 by use of the same metal mold. Thus, it is possible to reduce the number of steps in the manufacture of the magnetic sensor 401, which thus reduces the manufacturing cost.

Noticeably, one ends 412a of the leads 412 constitute distorted portions, which are distorted and deformed when the pins F are inserted into the metal mold to press up the backsides 406b and 407b of the stages 406 and 407 relative to the terminal ends 406c and 407c respectively. Thus, it is possible to incline the stages 406 and 407 against the frame 409 with ease.

In addition, the molded resin casing 405 is formed in the metal mold in which the stages 406 and 407 are inclined under pressure applied thereto by the pins F. Therefore, it is possible to accurately set a prescribed angle formed between the surfaces 402a and 403a of the magnetic sensor chips 402 and 403 with ease.

As described above, it is possible to accurately cross the sensing direction of the magnetic sensor chip 403 with the A-B plane. Therefore, it is possible to determine bearings of magnetism in three sensing directions as a vector within a three-dimensional space, and it is possible to accurately measure three-dimensional bearings of magnetism.

In the fifth embodiment, the pins F are moved downwards after the resin is completely hardened, but this is not restrictive. That is, it is possible to move the pins F downwards when the resin is hardened to some extent such that the stages 406 and 407 can be maintained in inclined states thereof. In this case, a melted resin may flow into areas in which the pins F are temporarily projected above the interior wall E1 and are then retracted inside of the hole E2 of the lower mold Em, so that the stages 406 and 407 can be completely embedded in the resin.

In the above, the pins F can be moved downwards at any timing if the stages 406 and 407 are securely maintained in inclined states in accordance with plastic deformation and/or elastic deformation on the leads 412. When the leads 412 are distorted upon plastic deformation, it is possible to move down the pins F before injection of a resin into the mold. When the leads 412 are distorted upon both of the plastic deformation and elastic deformation, it is possible to move down the pins F when the resin is sufficiently hardened to securely maintain the stages 406 and 407 in inclined states.

The pins F are not necessarily moved up and down in the holes E2 with respect to the interior wall E1 of the lower mold Em. That is, they can normally be projected above the interior wall E1 of the lower mold Em. In this case, when the frame 409 is placed in the metal mold, the stages 406 and 407 are automatically inclined at prescribed angles.

In addition, the aforementioned pins F are not necessarily arranged in the lower mold Em, in other words, they can be arranged in the upper mold Dm. In this case, it is required that the surfaces 406a and 407a of the stages 406 and 407 be pressed downwards so as not to bring the stages 406 and 407 in contact with the wires 408 and the magnetic sensor chips 402 and 403.

Each of the stages 402 and 403 is not necessarily pressed by a single pin F; that is, it can be pressed by two pins. For example, a pair of pins projected upwards from the lower mold Em are used to press up the backsides 406b and 407b of the stages 406 and 407 relative to the terminal ends 406c and 407c respectively, while a pair of pins projected downwards from the upper mold Dm are used to press the surfaces 406a and 407a of the stages 406 and 407 relative to other sides or other portions.

The aforementioned cutouts are not necessarily formed in ends 412a of the leads 412. That is, the leads 412 are formed so as to be easily distorted when the stages 406 and 407 are inclined. In addition, the distorted portions are not necessarily formed in ends 412a of the leads 412. That is, they can be formed at arbitrary positions of the leads 412 separated from ends 412a towards the rectangular frame portion 411.

Figure 82A:
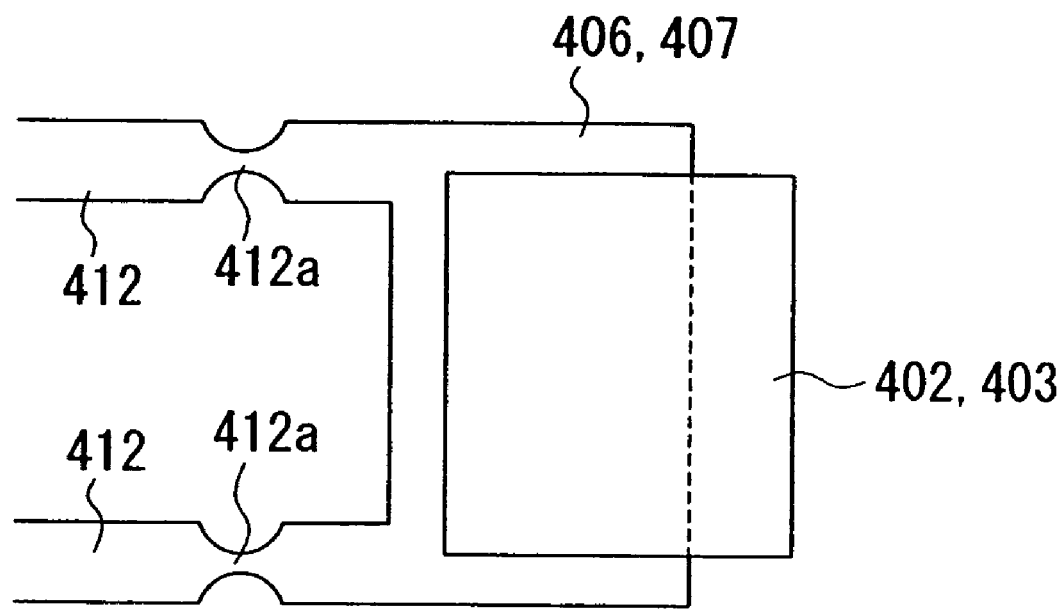
FIG. 82A is an enlarged plan view showing a stage supported by leads having distorted portions in accordance with a modification of the fifth embodiment.
Figure 82B:
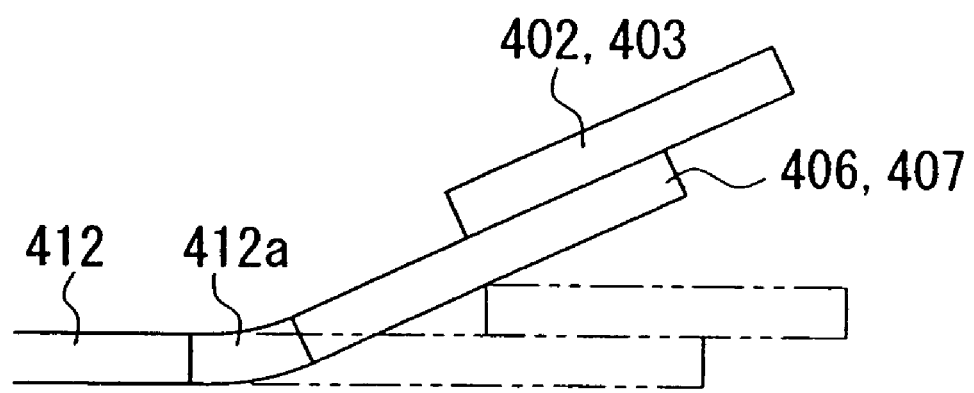
FIG. 82B is an enlarged sectional view showing the stage that is inclined due to distortion of the leads shown in FIG. 82A.

The stages 406 and 407 are not necessarily inclined by distorting prescribed parts of the leads 412. That is, it is required that the leads 412 are formed so as to support the stages 406 and 407 and to easily incline them. For example, as shown in FIGS. 82A and 82B, the leads 412 are formed such that ends 412a thereof for supporting the stages 406 and 407 can be easily bent and subjected to plastic deformation and/or elastic deformation.

In the fifth embodiment, the magnetic sensor chips 402 and 403 are inclined such that ends 402b and 403b thereof are directed towards the upper surface 405c of the molded resin casing 405, but this is not restrictive. That is, the magnetic sensor chips 402 and 403 should be mutually inclined to each other against the frame 409 such that the sensing direction of the magnetic sensor chip 403 crosses the A-B plane.

Furthermore, the magnetic sensor chips 402 and 403 are not necessarily bonded onto the surfaces 406a and 407a of the stages 406 and 407. That is, at least one magnetic sensor chip can be bonded onto the backside of the stage.

As described above, the fifth embodiment has a variety of technical features compared with other embodiments, which will be described below.

(1) Interconnecting members are arranged on both side ends of stages of a lead frame and are arranged linearly symmetrical to a center axial line passing through the centers of the stages, and they have distorted portions that can be distorted upon plastic deformation (and/or elastic deformation). Herein, the interconnecting members are distorted at the distorted portions thereof under pressure applied to the stages, which are thus inclined against a frame with ease.

(2) The same metal mold can be used for all of the steps for simultaneously bonding magnetic sensor chips onto the stages, for inclining the stages, and for forming a molded resin encapsulating the magnetic sensor chips and the stages therein. Therefore, it is possible to reduce the number of steps in the manufacture of a magnetic sensor, which can thus reduce the manufacturing cost.

(3) Pins are used to press the stages to be inclined in a metal mold, into which a melted resin is injected to form a molded resin encapsulating the magnetic sensor chips and the stages, which are mutually inclined with a prescribed angle therebetween. Herein, it is possible to accurately set the prescribed angle formed between the surfaces of the magnetic sensor chips. When one magnetic sensor chip has two sensing directions and another magnetic sensor chip has a single sensing direction, it is possible to determine bearings of magnetism as a vector in a three dimensional manner; hence, it is possible to accurately measure three-dimensional bearings of magnetism.

6. Package and Lead Frame

Figure 85A:
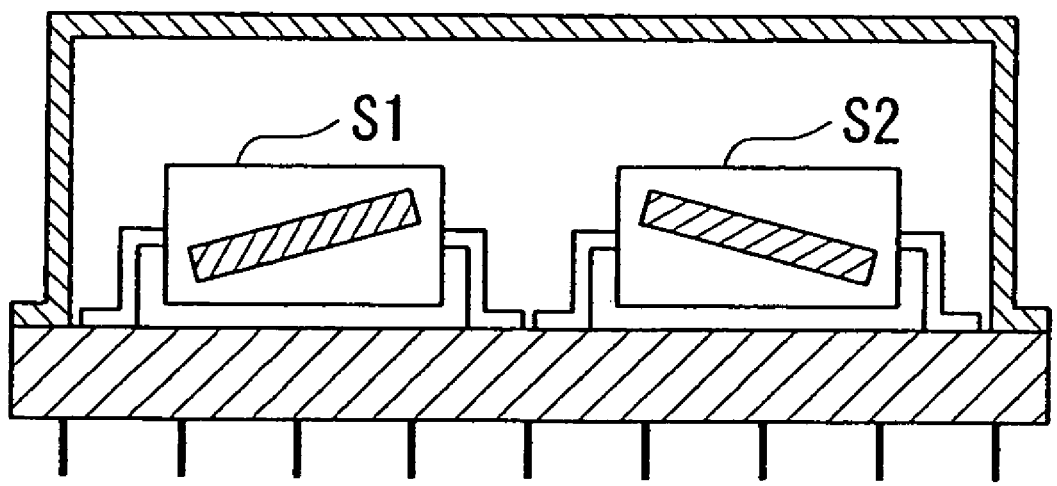
FIG. 85A is a longitudinal sectional view showing a horizontal arrangement of magnetic sensor chips on a board having a cover.

The aforementioned embodiments (e.g., fourth embodiment) are basically concerned with a single package of a magnetic sensor including plural magnetic sensor chips that are inclined at prescribed angles respectively. Herein, it is possible to arrange a plurality of packages each including at least one magnetic sensor chip. For example, as shown in FIG. 85A, a plurality of packages, i.e., magnetic sensor chips S1 and S2, which are respectively inclined at prescribed angles and which are horizontally arranged on the same substrate so that the sensing directions of the magnetic sensor chips cross at an acute angle therebetween, wherein they are covered with a resin cover cap or a metal cover cap made of a non-magnetic metal material such as aluminum. Of course, they can be vertically arranged as shown in FIG. 85B, wherein the overall chip-installed area of a (printed-circuit) board can be reduced compared with the horizontal arrangement shown in FIG. 85A.

In FIG. 85A, the cover cap (simply referred to as a cover) is not necessarily arranged on the board to encapsulate the magnetic sensor chips S1 and S2 therein. When the cover is arranged on the substrate, the inside space of the cover is hollow and is filled with a prescribed gas, wherein each of the magnetic sensor chips S1 and S2 is not necessarily sealed in a resin but can be formed in a hollow manner. The cover is bonded onto the substrate by solder. Multilayer wiring made of Cu or Al is arranged on the substrate made of a resin material such as poly-imide or epoxy resin, wherein grid pins or balls are formed on the backside of the substrate, which is connected with the board.

Figure 85B:
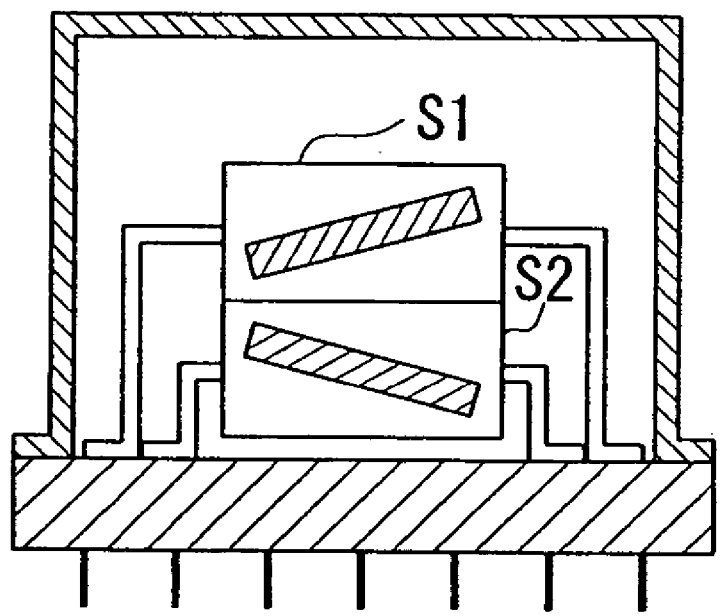
FIG. 85B is a longitudinal sectional view showing a vertical arrangement of magnetic sensor chips on a board having a cover.

The vertical arrangement shown in FIG. 85B is increased in height compared with the horizontal arrangement shown in FIG. 85A, wherein the overall thickness can be reduced compared with the conventional art in which magnetic sensors are physically arranged in a three-dimensional manner. Thus, it is possible to reduce the overall chip-installed area of the board.

When two sets of magnetic sensor chips (horizontally or vertically arranged on substrates) are arranged on the same board, it is possible to use the same type(s) of chips, which is convenient in design and in manufacture. Herein, two sensing directions can be respectively set to the magnetic sensor chips in parallel with their arrangement, or sensing directions can be set to the magnetic sensor chips perpendicularly to their arrangement.

Figure 86:
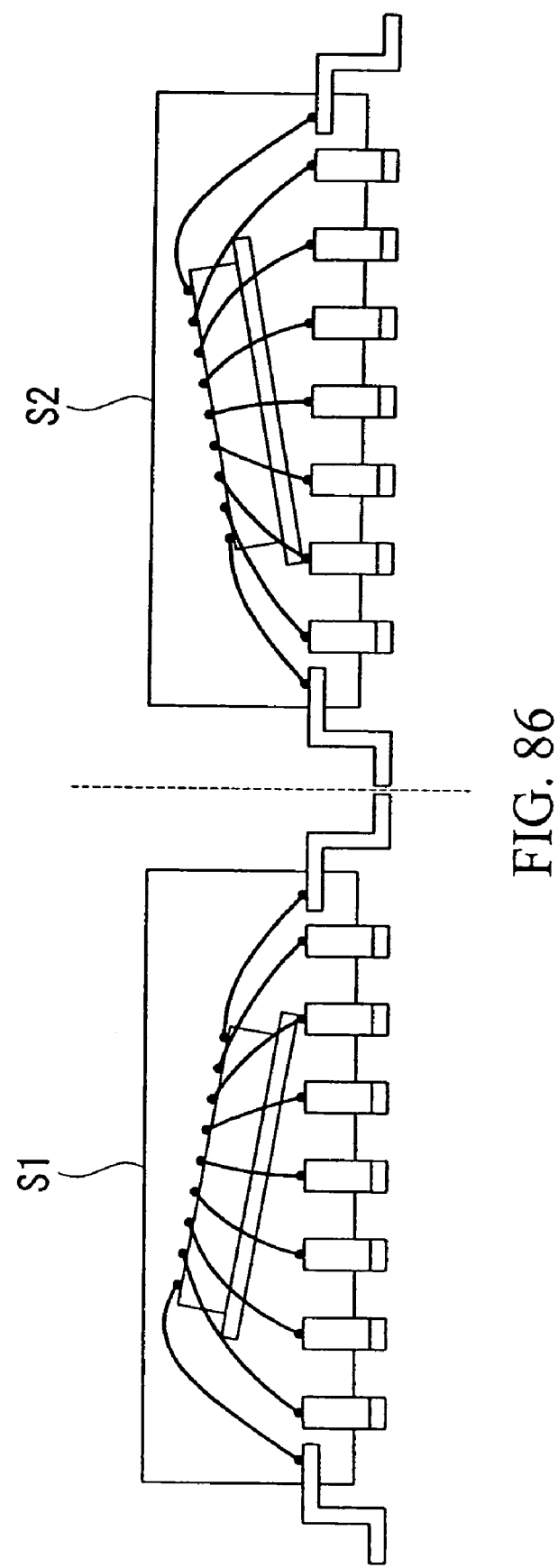
FIG. 86 diagrammatically shows inclined states of magnetic sensor chips that are inclined at prescribed angles respectively.
Figure 87A:
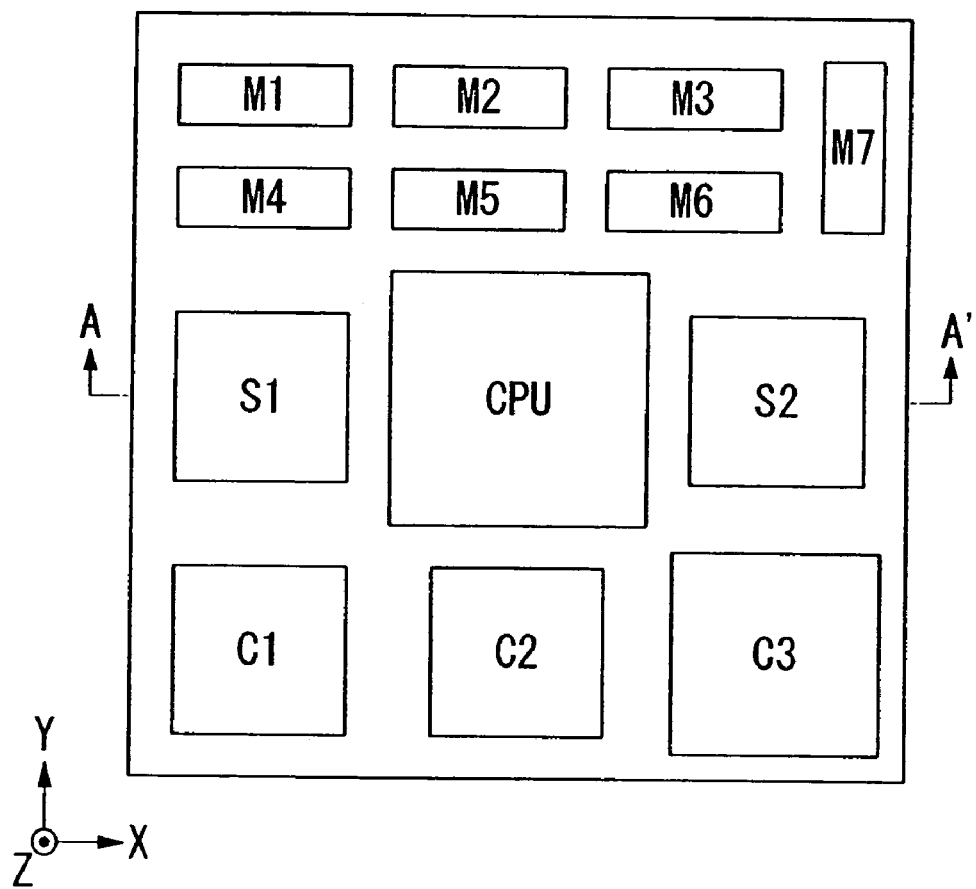
FIG. 87A diagrammatically shows a layout of chips including magnetic sensor chips on a board.
Figure 87B:
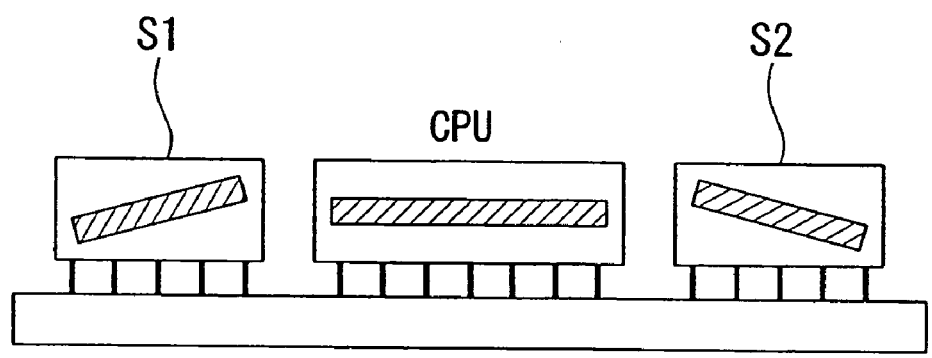
FIG. 87B is a longitudinal sectional view taken along line A-A' in FIG. 87A.

Details of the horizontal arrangement of the magnetic sensor chips S1 and S2 are shown in FIG. 86. The aforementioned magnetic sensor chips S1 and S2 can be arranged on a prescribed board for use in a portable telephone (or a cell phone) as shown in FIG. 87A, wherein they are arranged on both sides of a CPU. In FIG. 87A, reference symbols M1 to M6 designate memories, M7 designates a program storage chip, C1 and C2 designate communication chips (which may incorporate GPS (global positioning system) functions, for example), and C3 designates other chips having prescribed functions such as a temperature sensor chip, an inclination sensor chip, a GPS function chip, and graphics controller chip, for example. FIG. 87B is a longitudinal sectional view taken along line A-A' in FIG. 87A.

Figure 88:
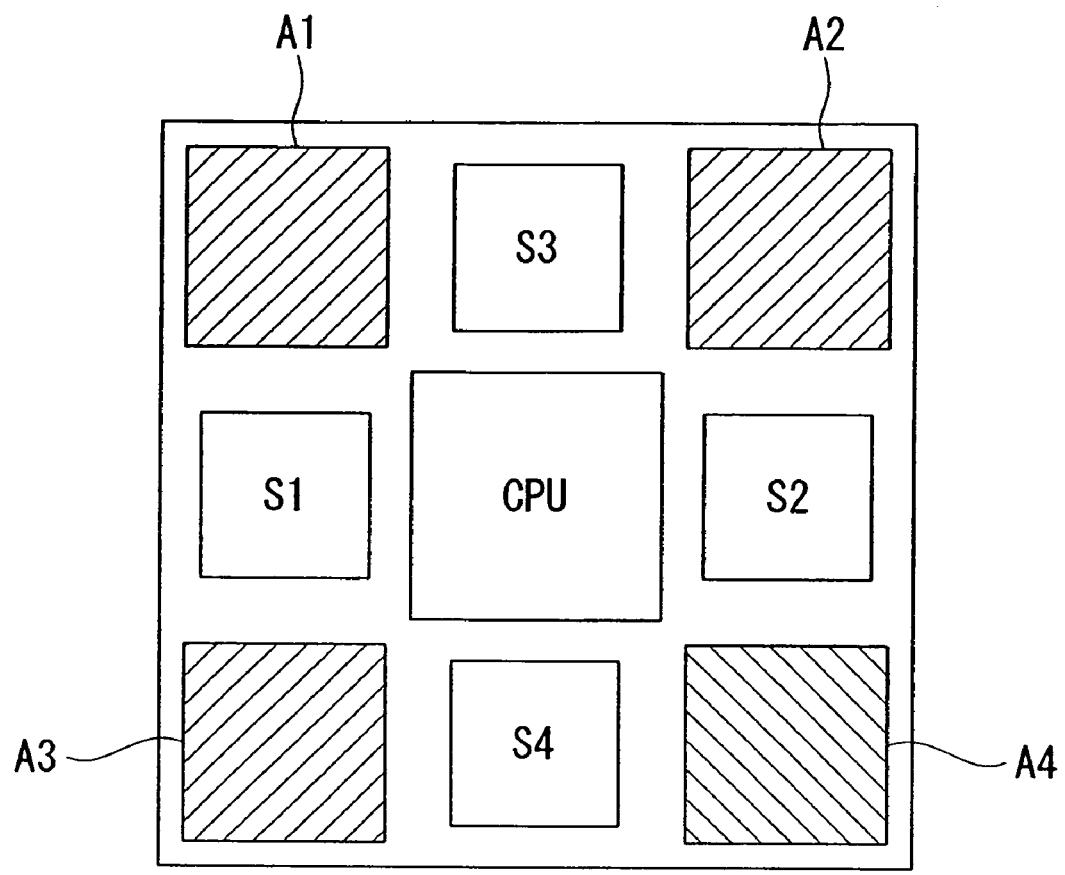
FIG. 88 diagrammatically shows a layout of chips including magnetic sensor chips on a board.
Figure 89:
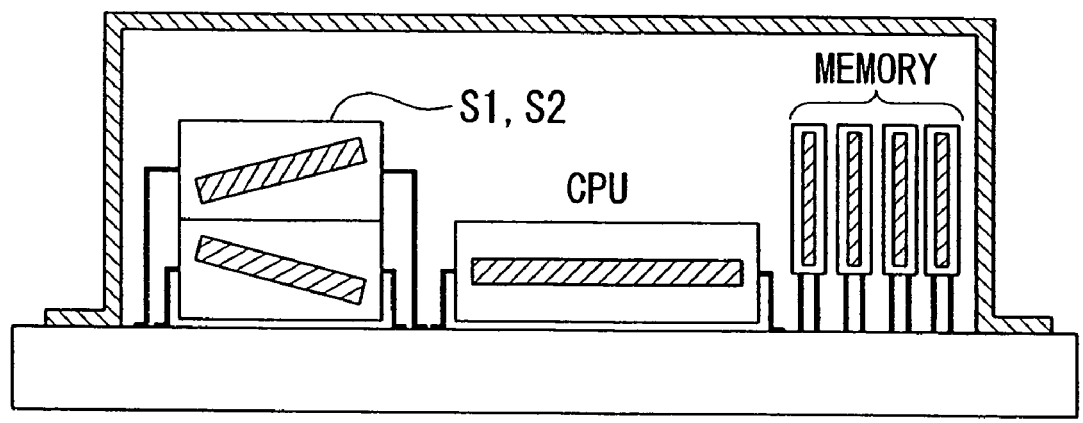
FIG. 89 is a longitudinal sectional view showing a multi-chip package including magnetic sensor chips vertically coupled together on a board having a cover.
Figure 90:
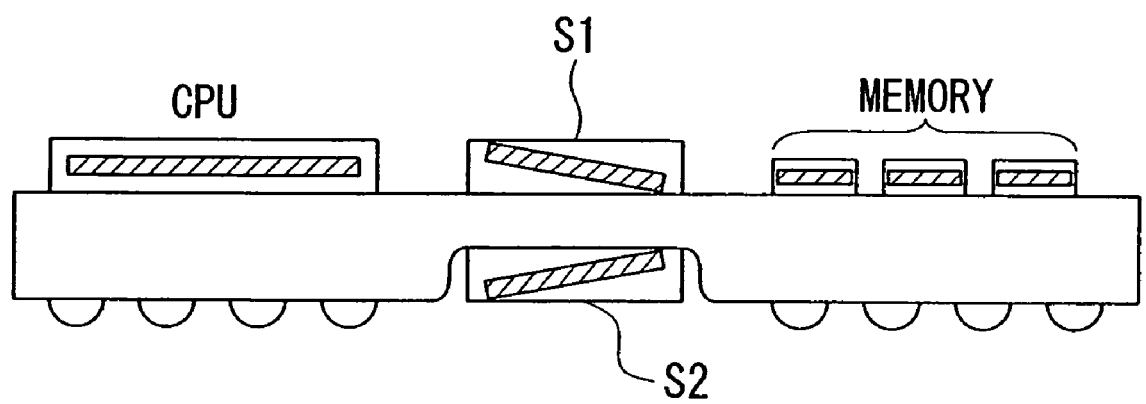
FIG. 90 diagrammatically shows the configuration of a multi-chip package including magnetic sensor chips vertically coupled together with respect to a board.

It is possible to arrange four magnetic sensor chips S1 to S4 to encompass a CPU on a board as shown in FIG. 88, wherein reference symbol A1 designates an area for arranging a memory chip (or memory chips), A2 designates an area for arranging a program storage chip, A3 designates an area for arranging a communication chip, and A4 designates an area for arranging other chips having prescribed functions. Alternatively, it is possible to design a multi-chip package as show in FIG. 89 in which magnetic sensor chips S1 and S2 vertically coupled together are arranged adjacent to a CPU accompanied with a plurality of memory chips on a board having a cover. The multi-chip package can be designed as shown in FIG. 90 in which magnetic sensor chips S1 and S2 are arranged vertically via a board on which a CPU and memory chips are arranged. As terminals arranged on the backside of the board, it is possible to use BGA (Ball Grid Array) and PGA (Pin Grid Array), for example.

Figure 91A:
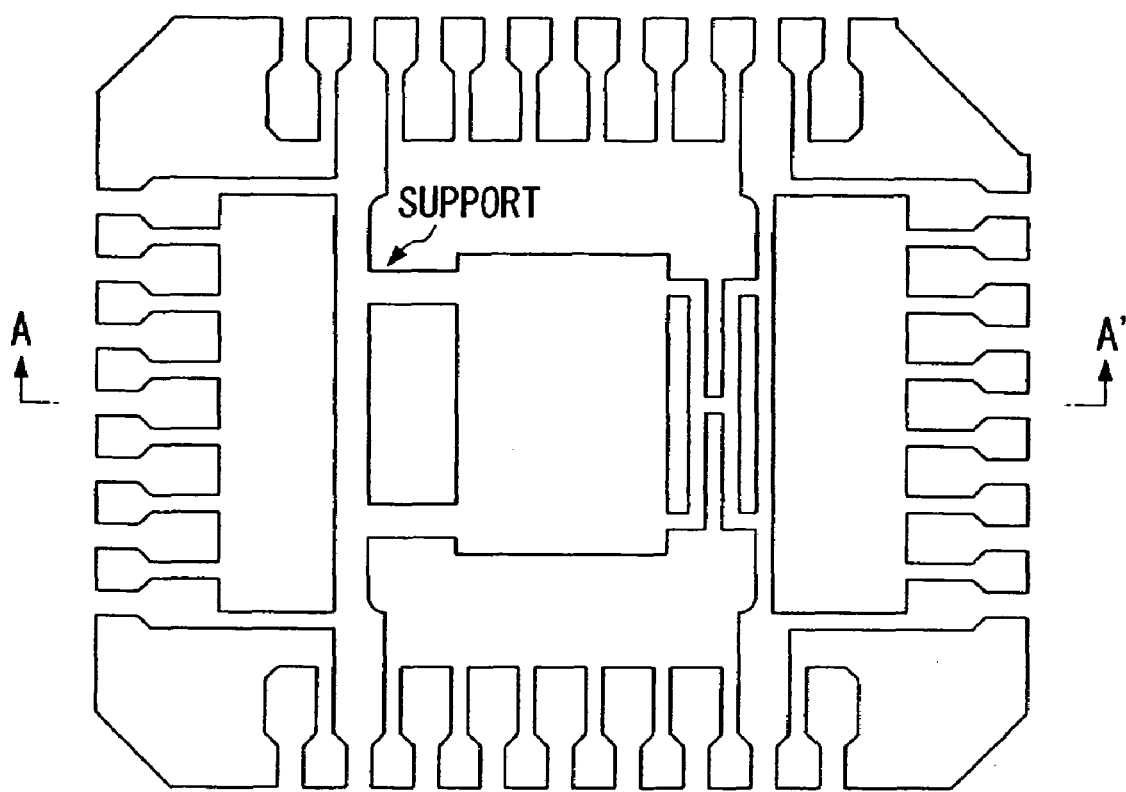
FIG. 91A is a plan view showing a first example of a lead frame for constituting a magnetic sensor chip.

Next, various examples of the lead frame applicable to the aforementioned magnetic sensor chip will be described. FIG. 91A shows a first example of the lead frame including a single die stage interconnected with support arms and bent portions, wherein the stage is positioned approximately at the center of the lead frame and wherein when the stage is inclined, the support arms are not bent as shown in FIG. 91B.

Figure 91B:
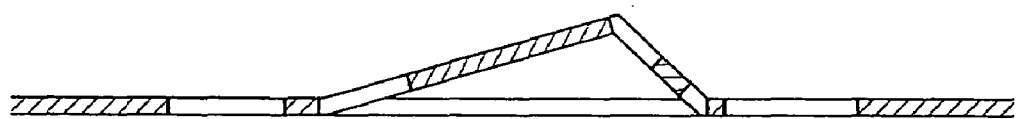
FIG. 91B is a longitudinal sectional view taken along line A-A' in FIG. 91A.
Figure 92A:
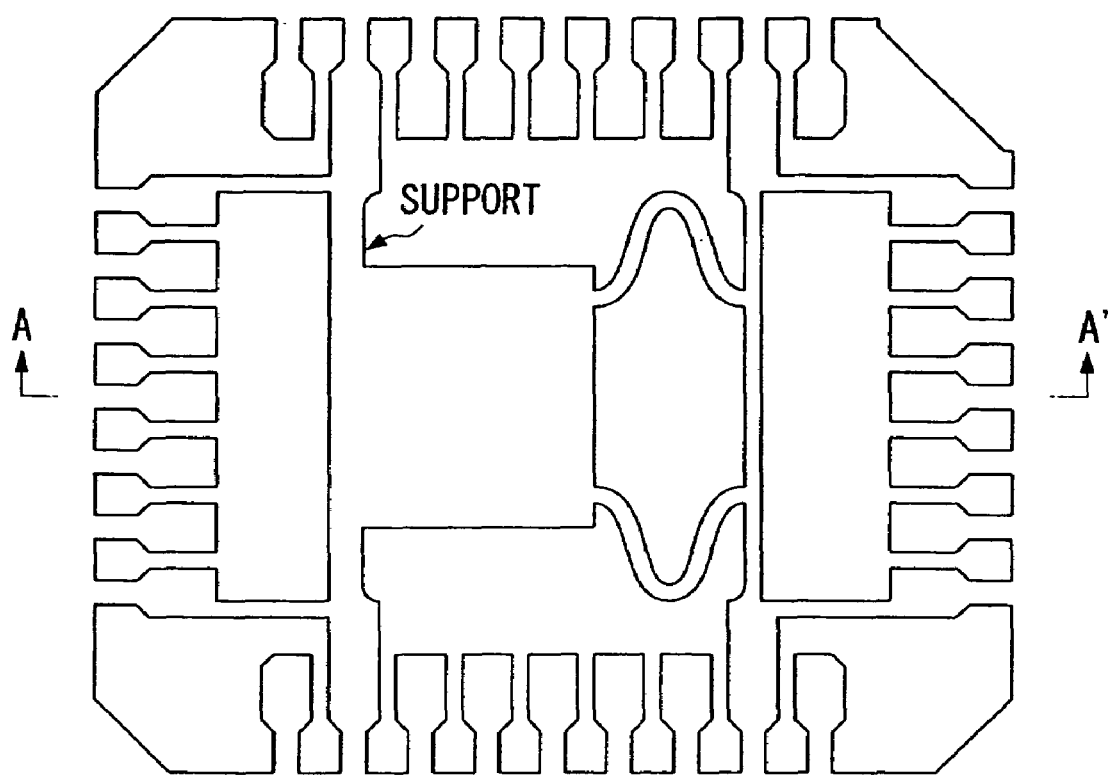
FIG. 92A is a plan view showing a second example of a lead frame for constituting a magnetic sensor chip.
Figure 92B:
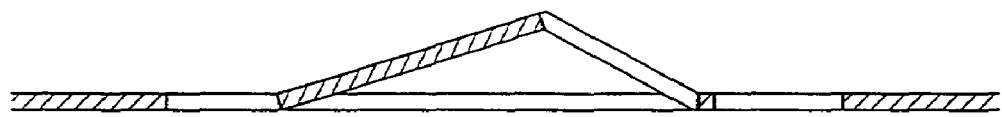
FIG. 92B is a longitudinal sectional view taken along line A-A' in FIG. 92A.

FIG. 92A shows a second example of the lead frame including a single stage interconnected with support arms and bent portions, wherein when the stages are inclined, the support arms are correspondingly bent to reduce the positional deviation of the stage during inclination as shown in FIG. 91B.

Figure 93A:
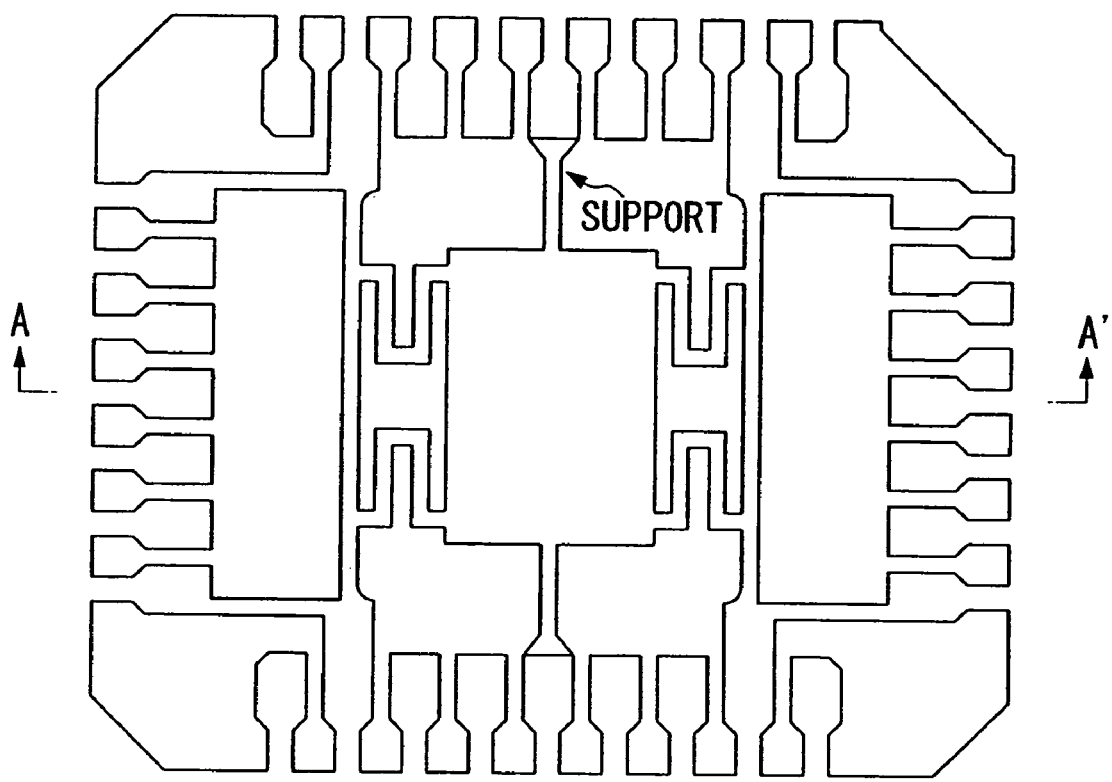
FIG. 93A is a plan view showing a third example of a lead frame for constituting a magnetic sensor chip.
Figure 93B:
FIG. 93B is a longitudinal sectional view taken along line A-A' in FIG. 93A.

FIG. 93A shows a third example of the lead frame including a single stage interconnected with support arms and bent portions, wherein the support arms are aligned along the center line of the stage, which is thus inclined about the center thereof as shown in FIG. 93B. Thus, it is possible to reduce the positional deviation of the stage during inclination.

Figure 94A:
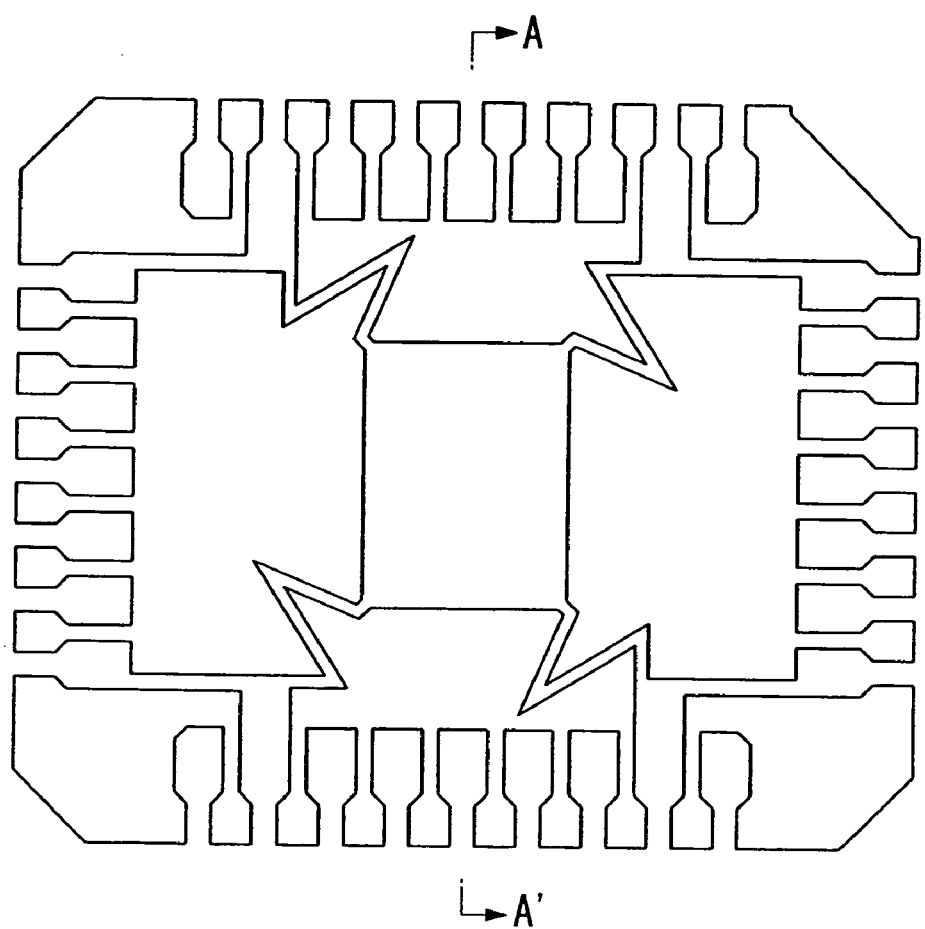
FIG. 94A is a plan view showing a fourth example of a lead frame for constituting a magnetic sensor chip.
Figure 94B:
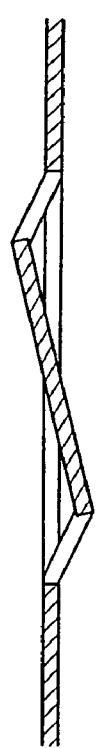
FIG. 94B is a longitudinal sectional view taken along line A-A' in FIG. 94A.

FIG. 94A shows a fourth example of the lead frame including a single stage whose four corners are interconnected with bent portions, whereby it is possible to incline the stage in any direction within 360-degree range as shown in FIG. 94B.

Figure 95A:
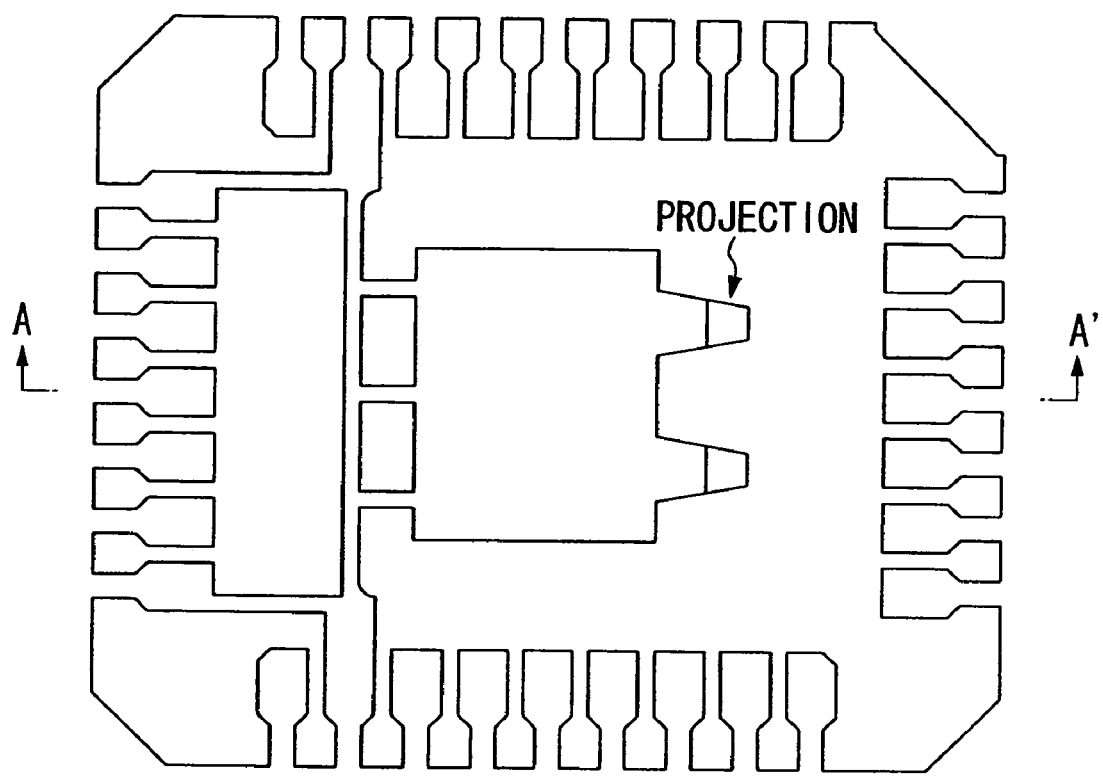
FIG. 95A is a plan view showing a fifth example of a lead frame for constituting a magnetic sensor chip.
Figure 95B:
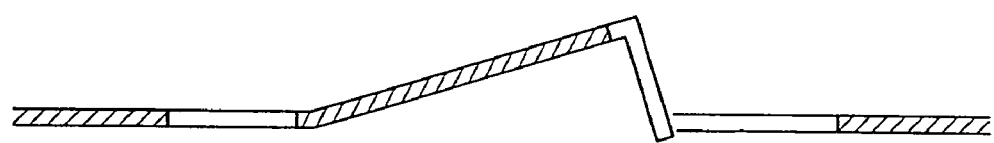
FIG. 95B is a longitudinal sectional view taken along line A-A' in FIG. 95A.

FIG. 95A shows a fifth example of the lead frame including a single stage, which is inclined upon deformation of projections as shown in FIG. 95B.

Figure 96A:
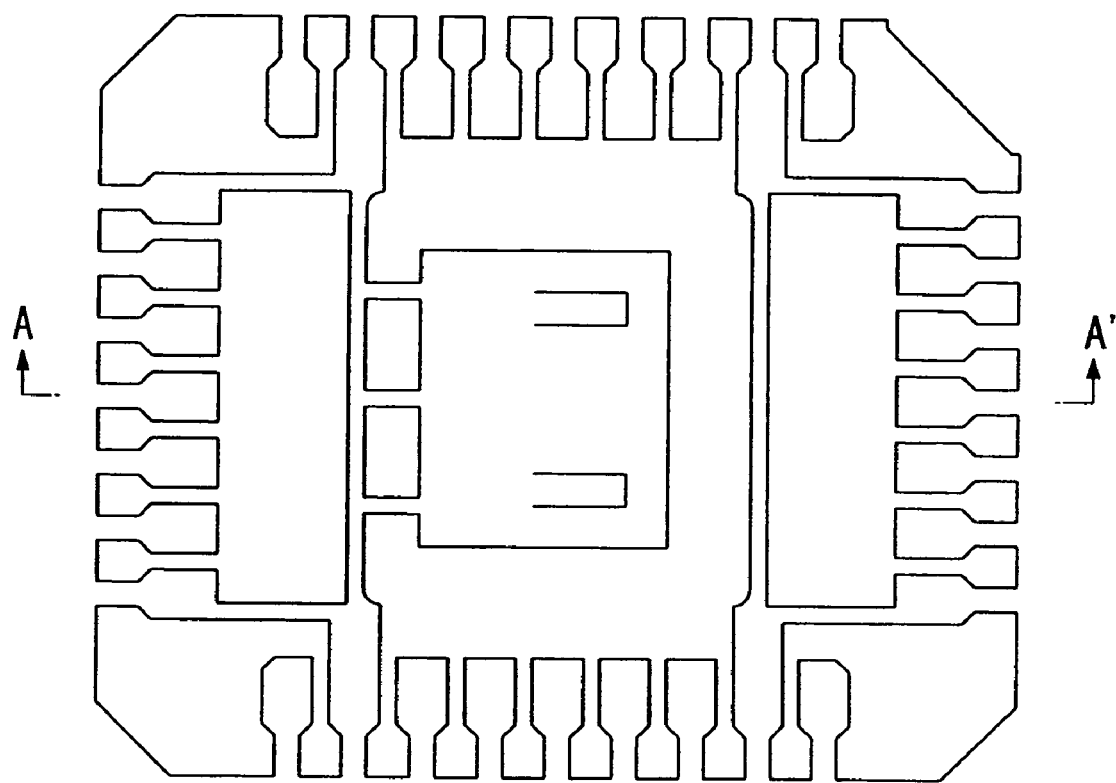
FIG. 96A is a plan view showing a sixth example of a lead frame for constituting a magnetic sensor chip.
Figure 96B:
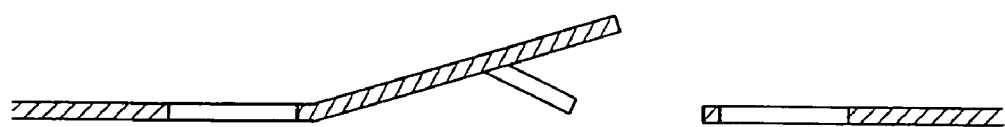
FIG. 96B is a longitudinal sectional view taken along line A-A' in FIG. 96A.

FIG. 96A shows a sixth example of the lead frame including a single stage, which is inclined by partially cut prescribed portions thereof as shown in FIG. 96B, wherein it is possible to stabilize the stage in an inclined state.

Figure 97A:
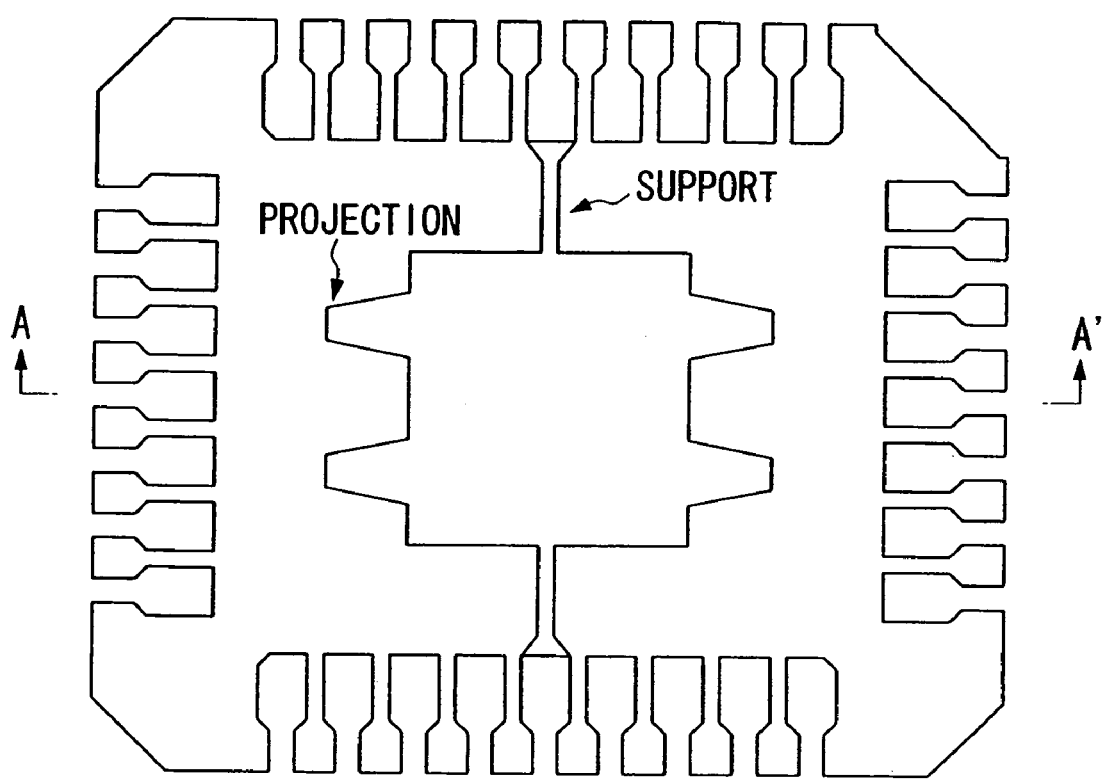
FIG. 97A is a plan view showing a seventh example of a lead frame for constituting a magnetic sensor chip.
Figure 97B:
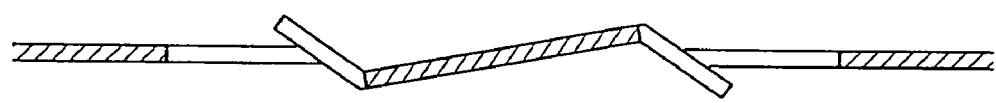
FIG. 97B is a longitudinal sectional view taken along line A-A' in FIG. 97A.

FIG. 97A shows a seventh example of the lead frame including a single stage, wherein support arms are aligned along the center line of the stage, which is inclined by bent projections upwards and downwards as shown in FIG. 97B. Thus, it is possible to establish accurate positioning with respect to the stage during inclination.

As this invention may be embodied in several forms without departing from the spirit or essential characteristics thereof, the present embodiments are therefore illustrative and not restrictive, since the scope of the invention is defined by the appended claims rather than by the description preceding them, and all changes that fall within metes and bounds of the claims, or equivalents of such metes and bounds are therefore intended to be embraced by the claims.

What is claimed is:

1. A manufacturing method of a magnetic sensor encapsulating at least one magnetic sensor chip having sensitivity to magnetism in at least one direction in a molded resin, comprising the steps of:
providing a lead frame made of a thin metal plate, which comprises at least two stages, a frame having a plurality of leads arranged so as to encompass the stages, and a plurality of interconnecting members for interconnecting together the frame and the stages;
inclining the stages relative to the frame upon plastic deformation of the interconnecting members;
pressing the stages under pressure while fixing the frame in a prescribed position, thus elastically deforming the interconnecting members;
bonding the magnetic sensor chip onto the stage while the stage and the frame are both placed substantially in a same plane;
arranging wires so as to interconnect together the leads and the magnetic sensor chip; and
releasing the stages from the pressure, thus restoring the interconnecting members from elastically deformed states thereof.

2. The manufacturing method of a magnetic sensor according to claim 1, wherein the interconnecting members are subjected to plastic deformation at bent portions, which are arranged in proximity to the stages, and wherein the interconnecting members are elastically bent at easy-to-deform portions that are formed at selected positions of the interconnecting members for supporting the stages.

3. The manufacturing method of a magnetic sensor according to claim 1, wherein a plurality of first projecting portions are projected from the stages towards the leads while a plurality of second projecting portions are projected from the frame toward the stages, said manufacturing method further comprising the step of:
after restoring the interconnecting members from the elastically deformed states thereof, the first projecting portions are partially overlapped with the second projecting portions in a thickness direction of the thin metal plate.

4. The manufacturing method of a magnetic sensor according to claim 3, wherein the first projecting portion has a projection while the second projecting portion has a hollow portion, so that the projection and the hollow portion are engaged with each other when the first projecting portion is partially overlapped with the second projecting portion.

5. A manufacturing method of a magnetic sensor encapsulating at least one magnetic sensor chip sensitive to magnetism in at least one direction in a molded resin, comprising the steps of:
preparing a lead frame made of a thin metal plate, which comprises at least two stages, a frame having a plurality of leads encompassing the stages, a plurality of interconnecting members for interconnecting the stages with the frame, and a plurality of pressing members projected from the leads towards the stages;
bonding a magnetic sensor chip onto each of the stages, which are placed substantially in a same plane of the frame;
wiring the magnetic sensor chip together with the leads; and
subjecting the interconnecting members to elastic deformation while the stages and the pressing members are overlapped in positions in a thickness direction of the thin metal plate, so that the stages are respectively inclined at prescribed angles against the frame.

6. A manufacturing method of a magnetic sensor, comprising the steps of:
preparing a lead frame made of a thin metal plate, which comprises at least two stages, a frame having a plurality of leads, a plurality of interconnecting members for interconnecting the stages with the frame, and a plurality of projecting elements that are projected upwardly or downwardly from the stages respectively;
bonding a magnetic sensor chip sensitive to magnetism in at least one direction therefrom onto each of the stages;
wiring the leads with the magnetic sensor chip mounted on the stage;
fixing the lead frame into a metal mold;
pressing the projecting elements by the metal mold so as to incline the stages against the frame and to partially deform the interconnecting members; and
injecting a resin material into the metal mold so as to encapsulate the magnetic sensor chip mounted on the stage of the lead frame in a resin.

7. The manufacturing method of a magnetic sensor according to claim 6, wherein the interconnecting members have distorted portions by which the projecting elements are arranged for the stages respectively, so that when the projecting elements are pressed by the metal mold that is closed, the stages are inclined while the interconnecting members are partially deformed at the distorted portions.

8. A manufacturing method of a magnetic sensor equipped with at least one magnetic sensor chip sensitive to components of magnetism in a prescribed direction, comprising the steps of:
preparing a lead frame made of a thin metal plate, which comprises at least two stages, a frame having a plurality of leads encompassing the stages, and a plurality of interconnecting members for interconnecting the stages with the frame;
bonding the magnetic sensor chip onto each of the stages;
wiring the magnetic sensor chip with the leads; and
subjecting the interconnecting members to plastic deformation so as to incline the stages at prescribed angles against the frame.

9. The manufacturing method of a magnetic sensor according to claim 8, wherein the lead frame further comprises at least one stage interconnecting member for mutually interconnecting the stages together, and wherein the stage interconnecting member is subjected to plastic deformation when the stages are inclined.

10. A manufacturing method of a magnetic sensor equipped with at least one magnetic sensor chip sensitive to components of magnetism in a prescribed direction, comprising the steps of:
preparing a lead frame made of a thin metal plate, which comprises at least two stages, a frame having a plurality of leads encompassing the stages, and a plurality of interconnecting members for interconnecting the stages with the frame;
bonding the magnetic sensor chip onto each of the stages;
wiring the magnetic sensor chip with the leads; and
subjecting the interconnecting members and prescribed parts of the stages to plastic deformation so as to incline the stages at prescribed angles against the frame.

11. A manufacturing method of a magnetic sensor equipped with at least one magnetic sensor chip sensitive to components of magnetism in a prescribed direction, comprising the steps of:
preparing a lead frame made of a thin metal plate, which comprises at least two stages, a frame having a plurality of leads encompassing the stages, a plurality of interconnecting members for interconnecting the stages with the frame, and at least one stage interconnecting member for mutually interconnecting the stages together;
bonding the magnetic sensor chip onto each of the stages;
wiring the magnetic sensor chip with the leads; and
subjecting the stage interconnecting member to plastic deformation so as to incline the stages at prescribed angles against the frame.

12. A manufacturing method of a magnetic sensor having at least one magnetic sensor chip sensitive to components of magnetism in a single direction, comprising the steps of:
preparing a lead frame made of a thin metal plate, which comprises at least two stages, a frame having a plurality of leads arranged so as to encompass the stages, and a plurality of interconnecting members for interconnecting the stages with the frame;
bonding a magnetic sensor chip onto each of the stages;
wiring the magnetic sensor chip with the leads;
inclining the stages using pins in a metal mold so as to partially deform the interconnecting members; and
injecting a melted resin into the metal mold, thus molding the lead frame and the magnetic sensor chips in a resin.

13. The manufacturing method of a magnetic sensor according to claim 12, wherein the interconnecting members have distorted portions that are distorted upon plastic deformation and/or elastic deformation when the stages are inclined under pressure applied thereto by the pins in the metal mold.

14. The manufacturing method of a magnetic sensor according to claim 12, wherein each of the pins is retractably inserted into the metal mold so as to press each of the stages.

15. The manufacturing method of a magnetic sensor according to claim 13, wherein each of the pins is retractably inserted into the metal mold so as to press each of the stages.

* * * * *